(12) United States Patent
Johnson et al.

(10) Patent No.: US 6,640,423 B1
(45) Date of Patent: Nov. 4, 2003

(54) APPARATUS AND METHOD FOR THE PLACEMENT AND BONDING OF A DIE ON A SUBSTRATE

(75) Inventors: Edwin F. Johnson, Sunnyvale, CA (US); Gerd R. Ley, San Jose, CA (US); Douglas G. Lockie, Los Gatos, CA (US); Clifford A. Mohwinkel, San Jose, CA (US)

(73) Assignee: Endwave Corporation, Sunnyvale, CA (US)

( * ) Notice: Subject to any disclaimer, the term of this patent is extended or adjusted under 35 U.S.C. 154(b) by 371 days.

(21) Appl. No.: 09/618,324

(22) Filed: Jul. 18, 2000

(51) Int. Cl.[7] .............................................. B23P 19/00
(52) U.S. Cl. ............................ 29/740; 29/759; 29/721; 29/834
(58) Field of Search .......................... 29/739, 740, 743, 29/759, 720, 721, 832, 833, 834

(56) References Cited

U.S. PATENT DOCUMENTS

| | | | |
|---|---|---|---|
| 3,317,106 A | | 5/1967 | Dix |
| 3,692,225 A | | 9/1972 | Lincoln |
| 3,938,722 A | | 2/1976 | Kelly |
| 4,084,315 A | | 4/1978 | Michaels |
| 4,489,821 A | | 12/1984 | Inaba |
| 4,626,167 A | | 12/1986 | Bond |
| 4,768,702 A | | 9/1988 | Takahashi |
| 4,776,080 A | | 10/1988 | Christensen |
| 4,878,610 A | | 11/1989 | Mori |
| 4,921,397 A | | 5/1990 | Watanabe |
| 4,980,971 A | | 1/1991 | Bartschat |
| 5,022,580 A | | 6/1991 | Pedder |
| 5,044,072 A | * | 9/1991 | Blais et al. .................... 29/834 |
| 5,054,991 A | | 10/1991 | Kato |
| 5,084,959 A | | 2/1992 | Ando |
| 5,113,565 A | | 5/1992 | Cipolla |
| 5,115,559 A | | 5/1992 | Oyama |
| 5,233,745 A | * | 8/1993 | Morita ......................... 29/705 |
| 5,311,304 A | | 5/1994 | Monno |
| 5,351,876 A | | 10/1994 | Belcher |
| 5,368,217 A | | 11/1994 | Simmons |
| 5,370,301 A | | 12/1994 | Belcher |
| 5,377,897 A | | 1/1995 | Zimmer |
| 5,454,160 A | | 10/1995 | Nickel |
| 5,460,320 A | | 10/1995 | Belcher |
| 5,462,217 A | | 10/1995 | Simmons |
| 5,482,198 A | | 1/1996 | Kohn |
| 5,535,526 A | | 7/1996 | White |
| 5,579,980 A | * | 12/1996 | Ichikawa ..................... 228/6.2 |
| 5,743,005 A | * | 4/1998 | Nakao et al. .................. 29/833 |
| 5,744,869 A | | 4/1998 | Root |
| 5,759,268 A | | 6/1998 | Begin |
| 5,768,759 A | | 6/1998 | Hudson |
| 5,864,943 A | * | 2/1999 | Arakawa et al. ............... 29/740 |
| 5,870,820 A | * | 2/1999 | Arakawa et al. ............... 29/740 |
| 5,992,013 A | * | 11/1999 | Morita ......................... 29/833 |

OTHER PUBLICATIONS

John Baliga, "Package Styles Drive Advancements in Die Bonding", *Semiconductor International*, Jun. 1997, pp. 101, 102, 104, and 106.

Royce Instruments, Inc. product description entitled "DE35 Die Pick and Place System", 2 pages, 1997.

(List continued on next page.)

*Primary Examiner*—Gregory L. Huson
*Assistant Examiner*—Huyen Le
(74) *Attorney, Agent, or Firm*—Ingrid M. McTaggart; Kolisch Hartwell, P.C.

(57) ABSTRACT

An improved apparatus and method for the placement and bonding of a die on a substrate includes a movable die holder, a movable substrate holder, a pivoting transfer arm that picks a die from the movable die holder and transfers the die to a position adjacent the movable substrate holder, and a bondhead assembly for picking the die from the transfer arm and then bonding the die to the substrate.

69 Claims, 31 Drawing Sheets

OTHER PUBLICATIONS

West Bond Inc., product description entitled "Specifications of Die and Wire Bonding and Testing Machines", Model 7300A series and Model 7300B series, Oct. 16, 1996, 4 pages.

Tanner, J.P., "Simple Techniques Cut Printed Circuit Assembly Costs", *Insulation/Circuits*, Aug. 1972, abstract only, vol. 18, No. 9, USA.

Adaway, W.G.L., "Automatic Visual Inspection Applied to Silicon Chip Packaging", *Proceedings of the SPIE—The International Society for Optical Engineering*, 1983, abstract only, vol. 376, USA.

Keeler, R., "Vision Guides Machines in Automated Manufacturing", *Electronic Packaging and Production*, May 1985, abstract only, vol. 25, No. 5, USA.

Chapron, M., "Automated Visual Integrated Circuit Mounting Operations Inspections", *Proceedings of the SPIE—The International Society for Optical Engineering*, 1987, abstract only, vol. 730, USA.

Chmielewski, T.A., JR., "Utilizing Vision Technology to Automate the Hybrid Die Attach Process", *Electronic Imaging '88*, International Electronic Imaging Exposition and Conference, Advance Printing of Paper Summaries, 1988, abstract only, vol. 2, Inst. Graphic Communications, Boston, MA.

Harkavy, Brad., "Denser Semiconductor Circuitry Demands Accurate Alignment", *Robotics World*, Jan./Feb. 1989, p. 37 & 38.

Chalsen, Michael, "Automatic Chip Placement: One Solution, User Benefits, and Future Development", *41$^{st}$ Electronic Components Technology Conference*, 1991, pp. 422–427.

Beacham, J., "Unique Solution for Bare Die Handling", *Proceedings 1995 International Conference on Multichip Modules, SPIE*, 1995, abstract only, vol. 2575, ISHM–Microelectronic Society, Reston, VA.

Kolloor, Satish & Balamurugan, S., "Machine Vision for Alignment and Inspection in Die Bonder", *Proceedings of SPIE—The International Society for Optical Engineering*, Jun. 25–26 1997, pp. 2–10, vol. 3185, USA.

Glidden, Wayne, "Selecting Pick–and Place Equipment for Flip Chip Devices", *Electronic Packaging & Production*, Feb. 1998, pp. 54–56, 58, 60.

Wagner, H. M., "Production Equipment for the New Packages", HM, IEEE, International Electronic Circuit Packaging Symposium, Aug. 20–21 1969, abstract only, USA.

Kelly, C.E., et al., "Automatic Processes and Controls for GaAs MMIC Manufacturing", *MSN Microwave Systems News and Communications Technology*, Jul. 1988, abstract only, vol. 18, No. 7, USA.

Kondoh, Y., et al., "A Subminiature CCD Module Using a New Assembly Technique", *IEICE Transactions*, Aug. 1991, pp. 2355–2361, vol. E74, No. 8, Japan (in English).

Hatsuda, T, et al., "Thermal Strains in Flip–Chip Joints of Die–Bonded Chip Packages", International Electronic Packaging Conference, Sep. 15–18 1991, abstract only, vol. 2, USA.

Gupta, D, "A Novel Active Area Bumped Flip–Chip Technology for Convergent Heat Transfer from Gallium Arsenide Power Devices", 44th Electronics Components and Technology Conference, May 1–4 1994, abstract only, vol. 1, USA.

Aintila, A., et al., "Electroless Ni/Au Bumps for Flip-chip–on–Flex and TAB Applications", 16th IEEE/CPMT International Electronics Manufacturing Technology Symposium, Sep. 12–14 1994, abstract only, vol. 1, USA.

Gupta, D., "Evaluation of Alternative Processes for Au–Sn–Au Flip Chip Bonding of Power Devices", 1995 International Symposium on Microelectronics—published in *SPIE Proceedings*, Oct. 24–26 1995, pp. 371–377, vol. 2649, USA.

Kober, H., "Flexible Circuits for Micro Packages with Flip–Chip Die", Printed Circuit World Convention VII, May 21–24 1996, abstract only, Printed Circuit World Convention, Basel, Switzerland (in English).

Bjorklof, A., "Electroless Bumped Bare Dice on Flexible Substrates", *Microelectronics International*, May 1996, abstract only, No. 40, Wela Publications, Wela, Great Britain.

Merrit, Sa, et al., "A Rapid Flip–Chip Die Bonding Method for Semiconductor Laser Diode Arrays", 47$^{th}$ Electronic Components and Technology Conference, 1997, pp. 775–779, USA.

* cited by examiner

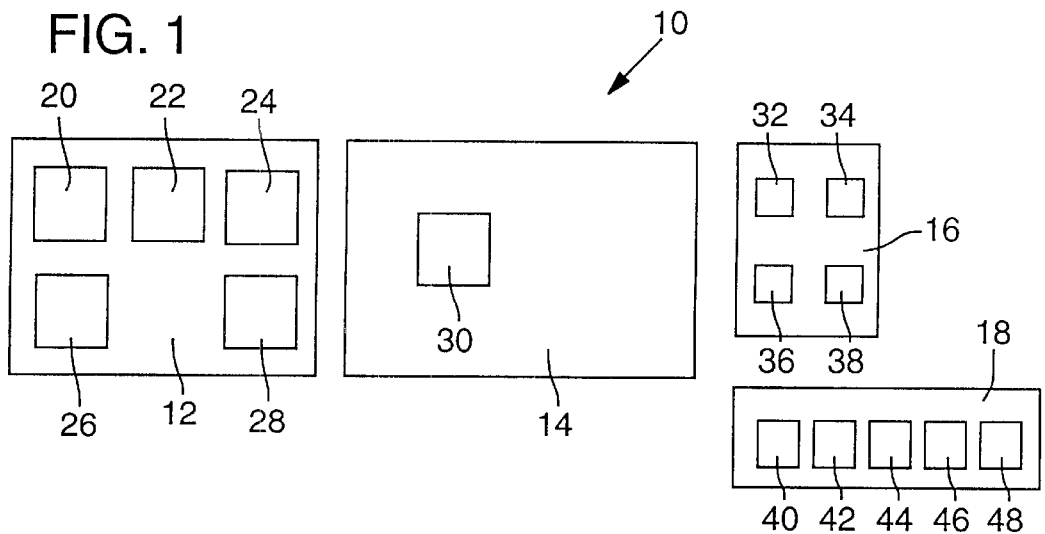
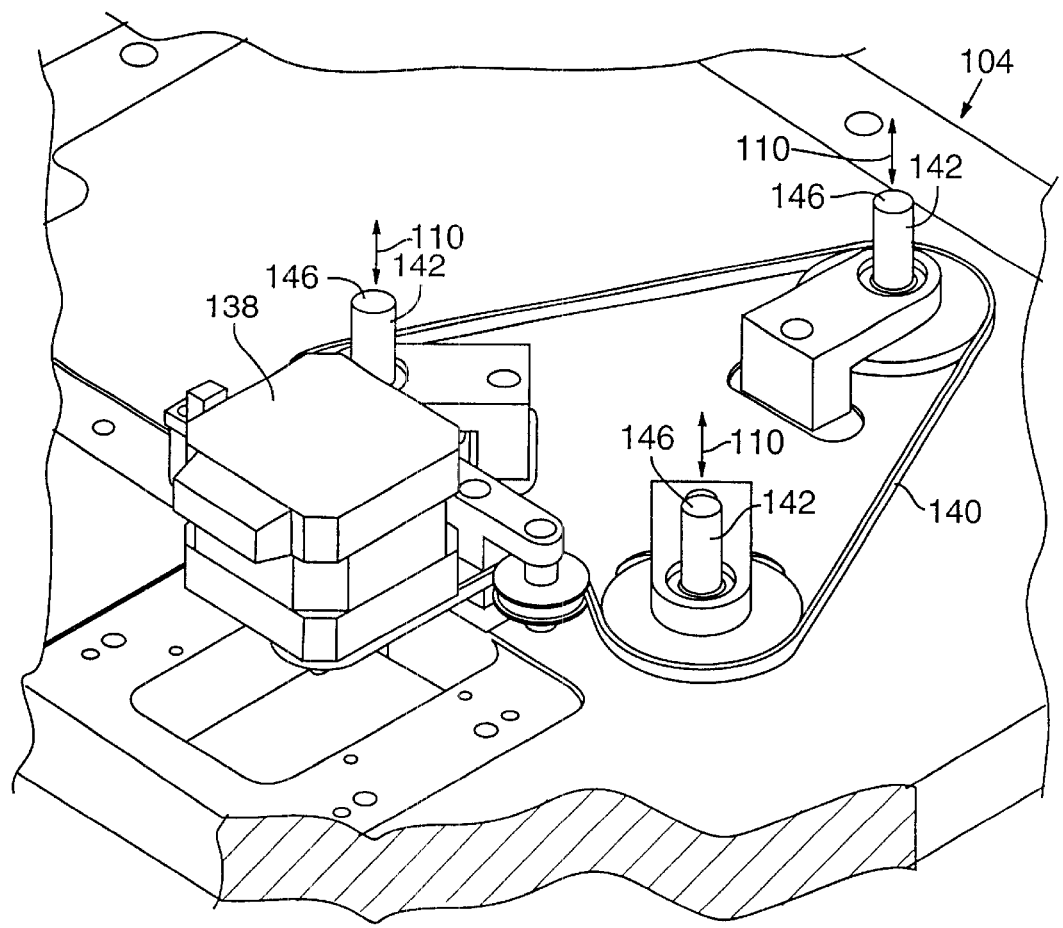

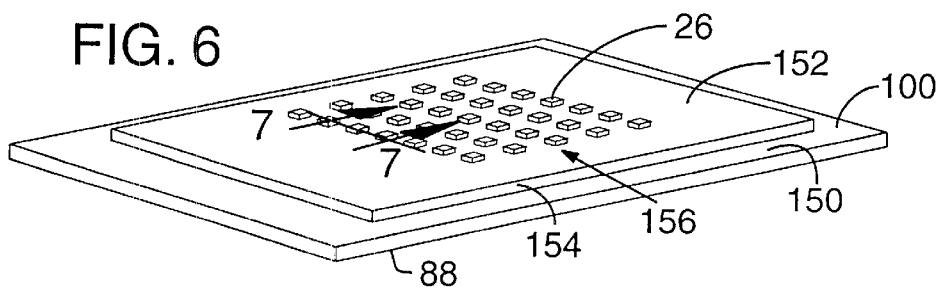
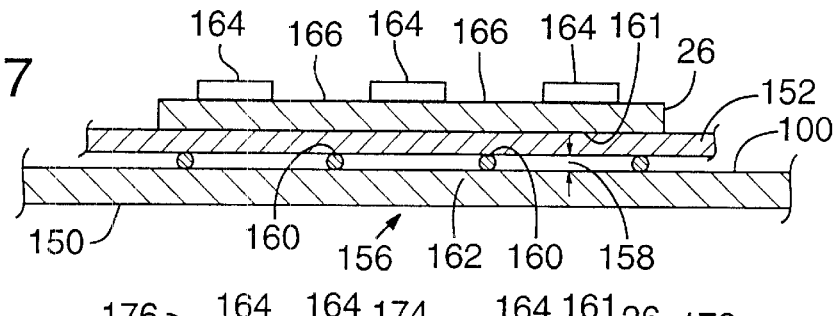
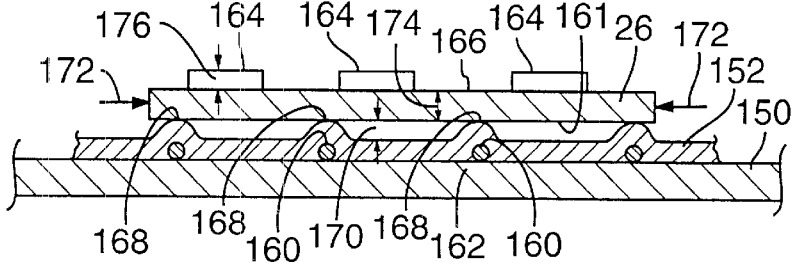
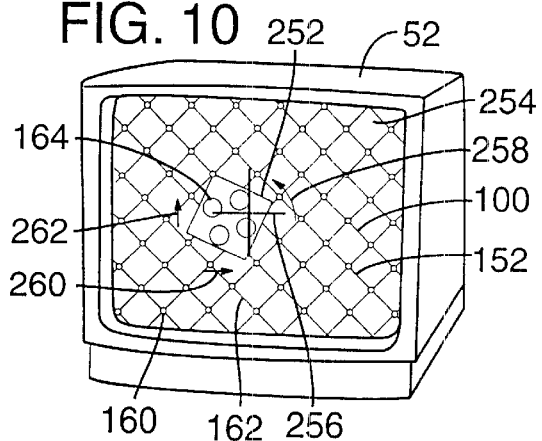
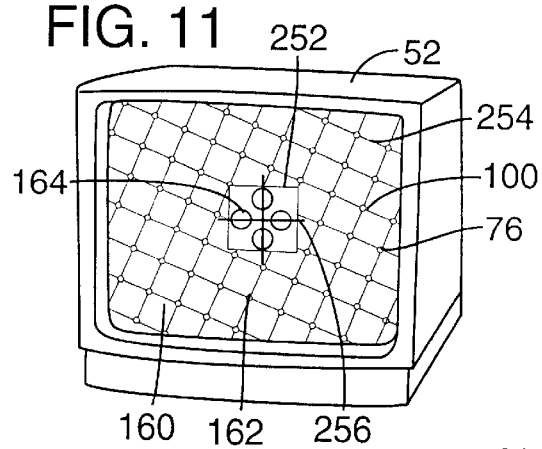
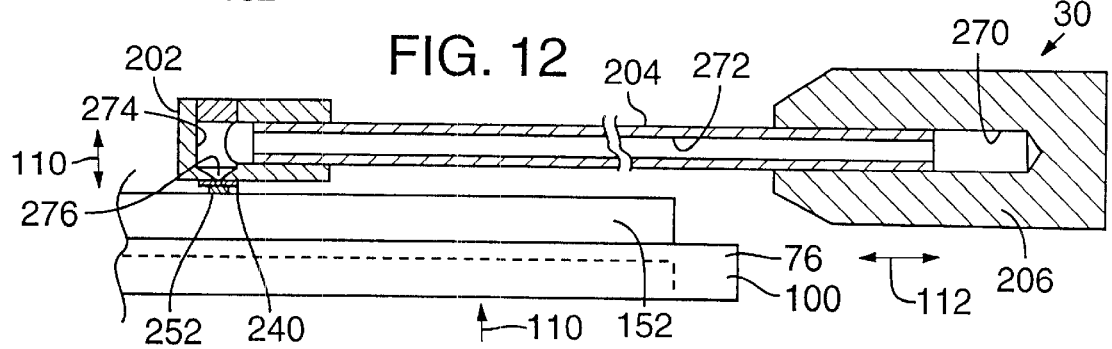

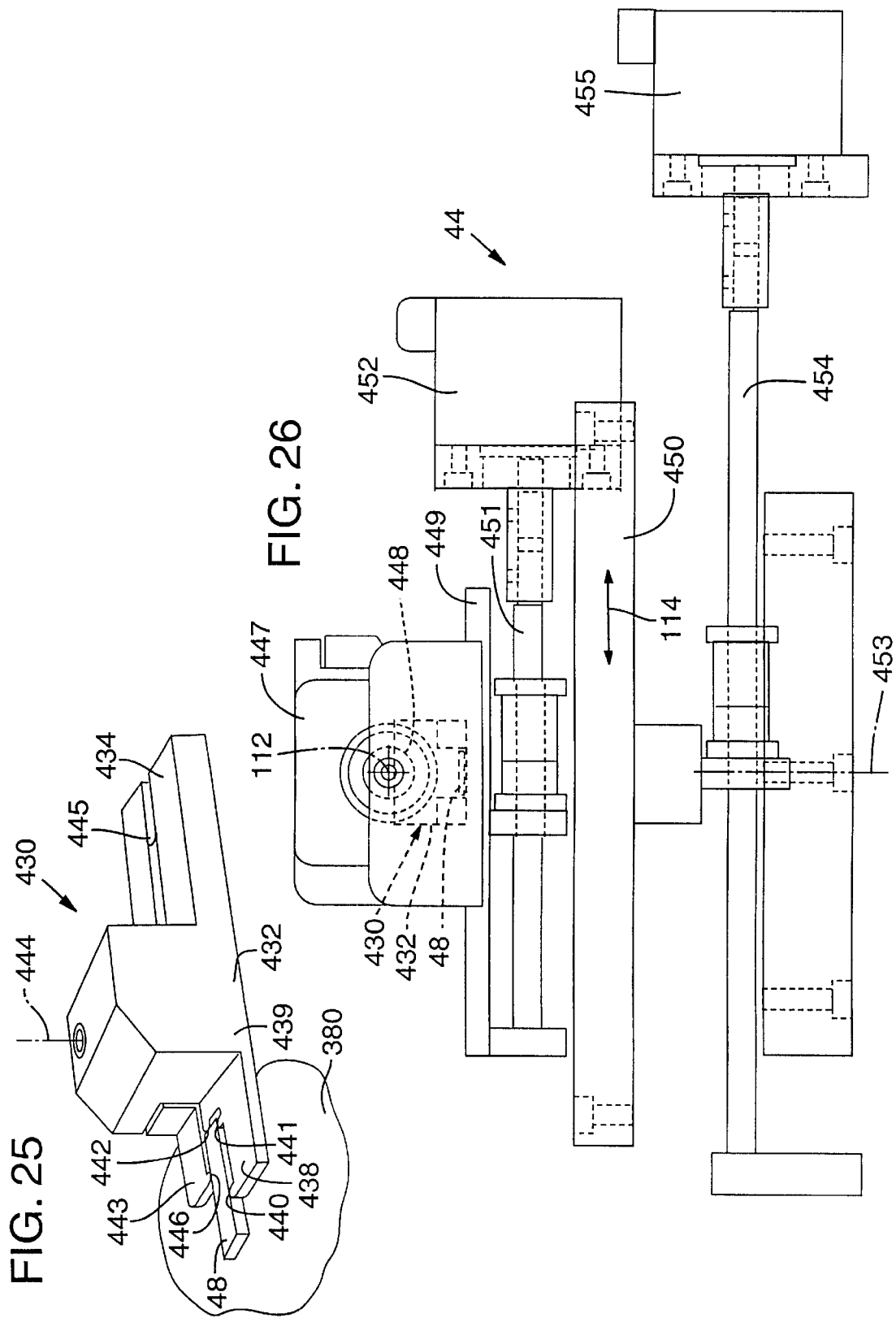

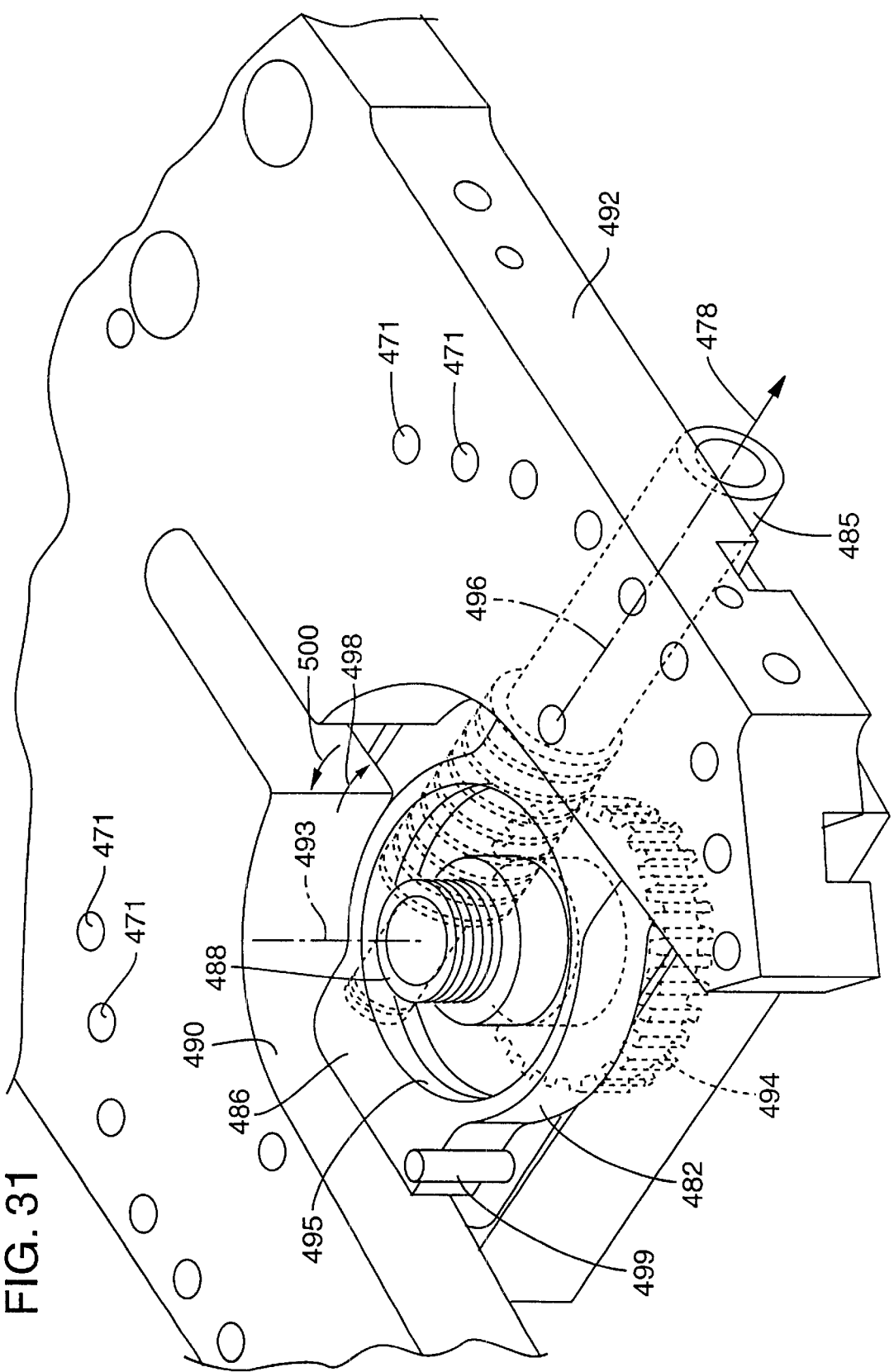

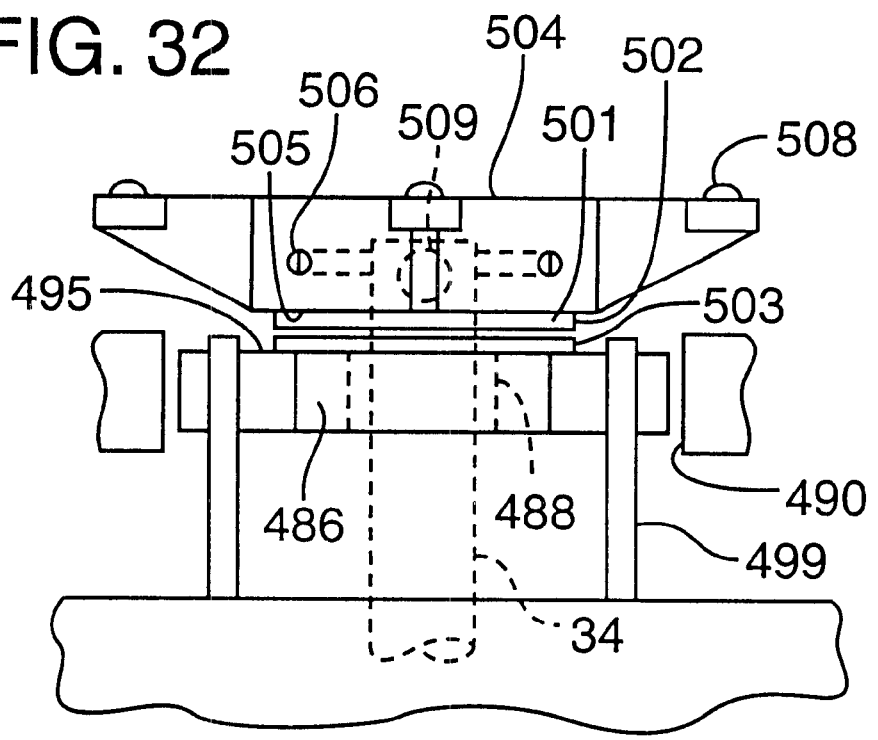
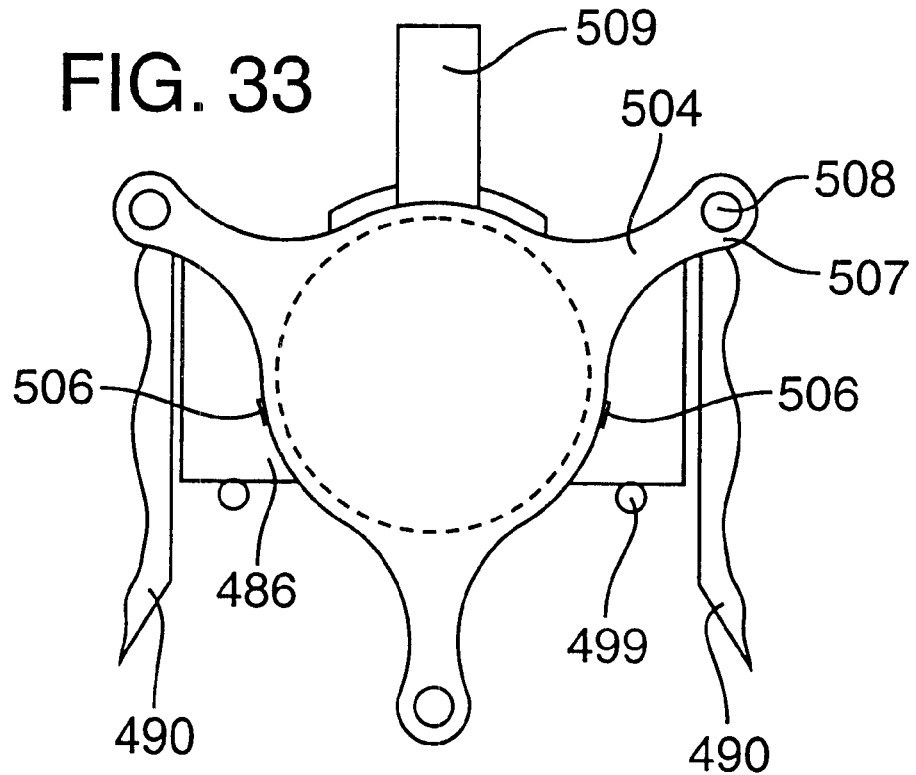

POSITION OF BONDHEAD
RELATIVE TO SUBSTRATE

APPARATUS AND METHOD FOR THE PLACEMENT AND BONDING OF A DIE ON A SUBSTRATE

TECHNICAL FIELD

The present invention relates to an improved apparatus and method for the placement and flipchip bonding of a die on a substrate, and more particularly, to various aspects of an apparatus including, in different combinations, a movable die holder, a movable substrate holder, a pivoting transfer arm that picks a die from the movable die holder and transfers the die to a position adjacent the movable substrate lo holder, and a bondhead assembly for picking the die from the transfer arm and bonding the die to the substrate.

BACKGROUND OF THE INVENTION

Hybrid circuit substrates including die or multiple dice bonded to a base circuit substrate are commonly used in many modern mechanical and electrical devices. During production of the substrate, accurate placement and time efficient bonding of the die on the circuit substrate is of considerable importance. These goals can be difficult to accomplish due to the small size of the die, which can be as small as 5×5×4 mils. Accordingly, there are numerous devices that attempt to accurately and efficiently position a die on a substrate for bonding, while taking into account the small size of the die.

Many of these prior art pick-and-place mechanisms hold the die, also called a chip, on a stationary die holder, also called a chip carrier, and attempt to pick the die from the holder with movable tweezers or similar devices. The tweezers typically are manually operated which results in operator fatigue and lack of uniform positioning of the die within the tweezers. This manual pickup method may also result in damage to the die, damage to the die holder, and a lengthy die pickup process. In another prior art device, the tweezers and the die are both moved into position before picking of the die occurs. This dual movement system includes many variables and often results in a mis-pick of the die. Once the die is picked from the holder by use of the tweezers, the die is moved into a placement or bonding position relative to the stationary circuit. This manual positioning step also subjects the operator to fatigue and may result in a lack of uniform placement of the die on the substrate. Once the die is positioned relative to the substrate, the die is bonded to the substrate by one of a variety of known methods. This bonding step often results in inaccurate bonding of the die to the substrate due to misalignment of the bond pads or bumps of the die with the corresponding bond pads or bumps of the substrate. Inaccurate bonding may also occur due to tilting of the die relative to the plane of the substrate. This inaccurate bonding of the die to the substrate may result in damage to the assembly or may result in an assembly that does not function as desired.

In the case of die pick-and-place mechanisms which attempt to maximize automated handling of the die, the precision machinery required may be quite expensive to purchase and upkeep, may require a large amount of space to store and operate (the machinery may require a space of 3 feet×5 feet×4 feet or even much more), may be heavy to install and support (the machinery may weight as much as half a ton or more) and may be slow in operation, especially when correction is required during the process due to the mis-pick or misplacement of a die. Moreover, these machines have problems associated with large machinery including planarity and tolerance errors.

Accordingly, there is a need for a mechanism and method for picking a die from a die holder, placing the die in a bonding position and bonding the die to a substrate, and that allows for time efficient and accurate positioning of the die while attempting to reduce the cost and size of the required machinery.

SUMMARY OF THE INVENTION

Accordingly, the present invention provides a die pick-and-place apparatus that facilitates complete automation of the die pick-and-place operations, allows for time efficient and accurate positioning of a die, provides a movable die holder for positioning a die in a predetermined die pickup position, and provides a movable substrate holder for positioning a bond site on a substrate in a predetermined die bonding position. The present invention also provides a die pick-and-place apparatus that is small in size and relatively inexpensive to manufacture, provides a transfer arm that picks a die from a predetermined pickup position and transfers the die to a predetermined die bonding position, and provides a bondhead assembly for bonding a die to a substrate wherein the bondhead assembly has few parts, has reduced friction within the assembly, and bonds the die to the substrate with high accuracy.

The preferred embodiments, in different combinations, include a movable die holder, a movable substrate holder, a pivoting transfer arm that picks a die from the movable die holder and transfers the die to a position adjacent the movable substrate holder, and a bondhead assembly for picking the die from the transfer arm and then bonding the die to the substrate. For purposes of the present invention, the term "substrate" can be defined as any chip receiving device such as a circuit, a package, a wafer, another chip, a standard substrate, or the like. Specifically, a preferred apparatus for practicing the various features of the invention includes a movable die holder that moves a die held on the die holder into a predetermined die pickup position for pickup by the transfer arm. The movable substrate holder moves the substrate so as that a bonding site on the substrate is aligned with a predetermined bonding position. The transfer arm pivots about a pivot axis between the predetermined pickup position and the predetermined bonding position which are each defined by the height of the transfer arm and the length of the transfer arm from its pivot axis. The bondhead assembly includes a bondhead that is aligned with the predetermined bonding position so that the bondhead receives the die from the transfer arm and then bonds the die to the substrate wherein the bondhead includes essentially frictionless flexure members.

One embodiment of the invention comprises an assembly for the placement and bonding of a die on a substrate, comprising: a carrier device that rotates about a rotational axis and including a die support position radially positioned about said rotational axis; an alignment device operable for manipulating in the x, y, z and rotational directions a die support held within said die support position so as to align a die held on said die support into a predetermined pickup position; a transfer arm having an elongate axis, a pivot axis positioned normal to said elongate axis, and a pickup surface, said transfer arm pivoting about said pivot axis to move said pickup surface from the pickup position to a placement position and said transfer arm rotating about said elongate axis so as to rotate said pickup surface approximately 180 degrees about said elongate axis during movement of said pickup surface from said pickup position to said placement position; a stationary heater block; a substrate gripping device positioned adjacent said heater block and moving in the x, y and rotational directions a substrate gripped within said substrate gripping device so as to align a bonding site on the substrate with a bonding position; and a bondhead assembly including a bondhead movable between a first position and a second position wherein said bondhead in the first position defines said placement position and said bondhead in the second position defines said bonding position.

In another embodiment the invention comprises an assembly for positioning a die for pickup by a transfer device, comprising: a carrier device that rotates about a rotational axis and including at least a first die support position and a second die support position each radially positioned about said rotational axis; a reader device aligned with said first die support position and operable for reading indicia placed on a die support held within said first die support position; an optical device aligned with said second die support position and operable for displaying an image of a die support held within said second die support position; and an alignment device aligned with said second die support position and operable for manipulating in the x, y, z and rotational directions a die support held within said second die support position so as to align a die held on said die support within said image displayed by said optical device.

In another embodiment the invention comprises an assembly for picking and transferring a die from a pickup position to a placement position for bonding on a substrate, comprising: a pickup station that defines a predetermined pickup position; a bonding station that defines a predetermined placement position; and a transfer arm having an elongate axis, a pivot axis positioned normal to said elongate axis, and a pickup surface, said transfer arm pivoting about said pivot axis to move said pickup surface from the pickup position to the placement position and said transfer arm rotating about said elongate axis so as to rotate said pickup surface approximately 180 degrees about said elongate axis during movement of said pickup surface from said pickup position to said placement position.

In another embodiment the invention comprises an assembly for positioning a die held on a die support into a pickup position, comprising: a carrier device for holding a die support therein; an optical device that displays an image of a die support held within said carrier device and that defines a predetermined pickup position; an alignment device that moves in the x, y, z and rotational directions a die support held within said carrier device; and a control device that receives directional input to control said alignment device to move said die support so as to move a die held on said die support into said predetermined pickup position. The directional input may be from a human operator or a computer controlled pattern recognition system.

In another embodiment the invention comprises an assembly for positioning a substrate into a bonding position, comprising: a substrate gripping device for gripping a substrate therein; an optical device operable to display an image of a substrate held within said substrate gripping device and operable to simultaneously display a predetermined bonding position; an alignment device that moves in the x, y and is rotational directions a substrate gripped with said substrate gripping device; and an operator control device that receives directional input from an operator to control said alignment device to move said substrate into said predetermined bonding position.

In another embodiment the invention comprises an assembly for bonding a die to a substrate, comprising: a stationary heater block; a bondhead assembly including a bondhead having an elongate axis, a flexure device, and a motor for moving said bondhead toward said heater block along said elongate axis and into a bonding position, said flexure device guiding movement of said bondhead along said elongate axis; and a substrate gripping device that moves in the x, y and rotational directions a substrate gripped within said substrate gripping device so as to align a bonding site on the substrate with said bonding position.

In another embodiment the invention comprises an assembly for aligning a substrate with a bonding position, comprising: a substrate gripping device that moves in the x, y and rotational directions a substrate held within said substrate gripping device so as to align a bond site on the substrate with a bonding position; a bondhead that defines a bonding surface for holding a die; a reflection device movable into an image capture position between a substrate held within said substrate gripping device and said bondhead; and a single optical device operable to display an image of a substrate held within said substrate gripping device and operable to display an image of a die held by said bondhead when said reflection device is moved into said image capture position wherein said image of the die defines the bonding position.

Another embodiment of the invention comprises an assembly for aligning a die with a die bond site, comprising: a substrate gripping device that moves in the x, y and rotational directions a substrate gripped within said substrate gripping device; a bondhead that defines a bonding surface for holding a die; an optical device that sequentially displays a real time image of a die held by said bondhead and a real time image of a substrate held within said substrate gripping device; and an image capture device that captures a template image of said die held by said bondhead and overlays said template image on the real time image of a substrate held within said substrate gripping device.

In another embodiment the invention comprises a method of aligning and bonding a die on a substrate, comprising the steps of: aligning a die with a predetermined die pickup position; picking the die from the predetermined die pickup position with a transfer assembly; transferring the die to a predetermined placement position with said transfer assembly; picking said die from the transfer assembly with a bondhead assembly; and bonding the die to a substrate with said bondhead assembly.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 1 is a block diagram of the major components of the system;

FIG. 5 is a perspective view of additional internal components of the die pickup stage;

FIG. 6 is a perspective view of the die holder with several die positioned thereon;

FIG. 7 is a side view of the die holder, taken along line 7—7 of FIG. 6, without the vacuum system activated;

FIG. 8 is a side view of the die holder with the vacuum system activated;

FIG. 10 is a perspective view of the die holder monitor showing a die on the holder that is unaligned with indicia on the monitor screen that indicate a predetermined pickup position;

FIG. 11 is a perspective view of the die holder monitor showing a die on the holder that is aligned with indicia on the monitor screen that indicate the predetermined pickup position;

FIG. 12 is a side cross-sectional view of the transfer arm;

FIG. 25 is a perspective view of the substrate gripper mechanism with a substrate held therein;

FIG. 26 is a side view of the internal components of the substrate alignment stage;

FIG. 31 is a detailed perspective view of the lifter mechanism of the bondhead assembly showing its internal components;

FIG. 32 is a front view of the bond head/weight stack connection;

FIG. 33 is a top view of the bond head/weight stack connection

DETAILED DESCRIPTION

Figure 2:
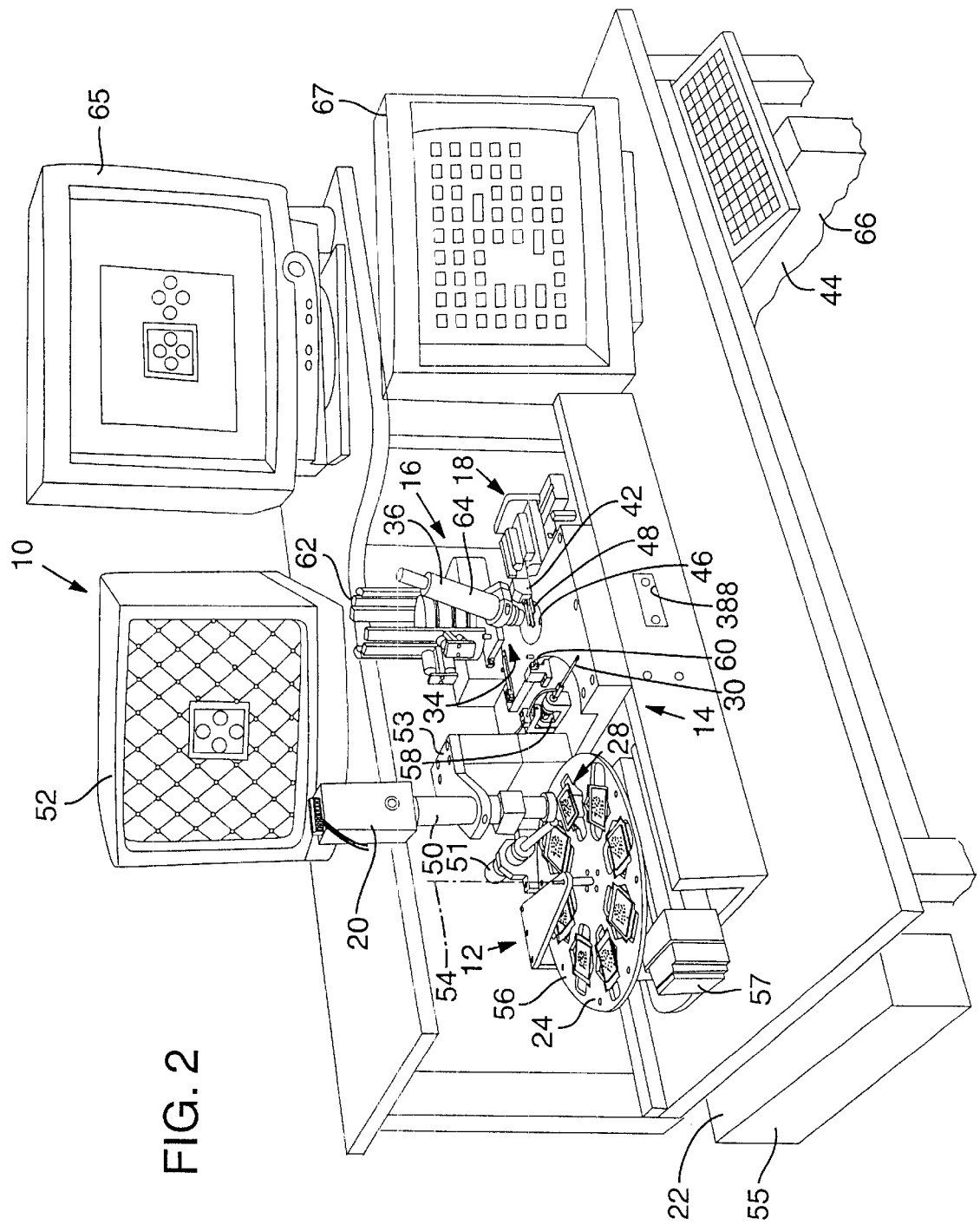
FIG. 2 is a perspective view of the pick-and-place apparatus.

FIG. 1 shows a block diagram of the pick-and-place system 10 including a pickup station 12, a transfer assembly 14, a bondhead assembly 16 and a support structure 18. Pickup station 12 comprises an optical device 20, a control device 22 and a positioning device 24. Positioning device 24 is adapted for holding a die 26 thereon and aligning the die with a predetermined pickup position 28. Transfer assembly 14 comprises a transfer arm 30 that moves between pickup station 12 and bondhead assembly 16 to transfer die 26 therebetween. In other embodiments, the pick-and-place assembly may comprise multiple transfer arms and/or multiple die carrier positioners. Transfer arm 30 defines predetermined pickup position 28 and a predetermined placement position 32 aligned with bondhead assembly 16. Bondhead assembly 16 comprises a bondhead 34, an optical device 36, and an image capture device 38. Support structure 18 comprises a reflection assembly 40, a substrate holding device 42, a control device 44, and a heater block 46 that is adapted for supporting a substrate 48, also referred to as a chip receiving device, thereon. The chip receiving device may comprise a wafer, a package, another chip, a standard substrate, or any other such device. System 10 includes other components as will be further described below. Moreover, in other embodiments the individual components may be distributed differently within the system as a whole.

FIG. 2 shows a perspective view of system 10 in a preferred embodiment. In this embodiment, and referring to pickup station 12, optical device 20 comprises first and second cameras 50 and 51, respectively, both connected to a monitor 52 and mounted on a support 53. In the preferred embodiment, cameras 50 and 51 are closed circuit digital video cameras that display a real time image on monitor 52. Camera 50 is positioned parallel to a vertical axis 54 whereas camera 51 is positioned at approximately an eighty degree angle with respect to axis 54. In the preferred embodiment, camera 50 comprises a black and white diagnostic camera with approximately 1170 by 860 pixels and includes a microscope objective at its lower end (not shown) resulting in an overall magnification of 150×. In one embodiment, camera 50 comprises a high resolution camera which allows an operator to read microscopic letters, having a height of approximately 0.78 mils, which are printed on the dice. This high resolution also allows an operator to visually determine and inspect the orientation of the gate fingers and the bonding pads of a die viewed by the camera. Cameras 50 and 51 are both focused on predetermined pickup position 28 and the magnification of the cameras can be adjusted by manipulation of the camera's barrel length. Camera 51 may be used to view the die held on positioning device 24 so that the camera may be used to calibrate the correct height of the die for placement of the die at the predetermined pickup position.

Control device 22 comprises a computer 55 and several motors, and positioning device 24 comprises a rotating carrier 56 and a reader device 57. Instead of a rotating carrier, carrier 56 may comprise a stack loader with one or more orientations, one or more wafer frames, multiple rotating carriers, or any other similar device for supplying a die or a die holder as needed. The die holder is held within carrier 56 and may comprise one or more GEL-PAKs (a trademark owned by GEL-PAK Corporation), waffle packs, tape frames, wafer arrays, or any other die holder. These die holders can be indexed, manipulated and delivered to or retrieved from stages 76 by a stack loader or vertical or horizontal conveyors of any of several designs.

Referring to transfer assembly 14, transfer arm 30 is positioned between rotating carrier 56 and bondhead assembly 16, and includes a bevel gear 58 and a position sensor 60. Referring to bondhead assembly 16, the assembly comprises a weight assembly 62 positioned above bondhead 34 (more clearly shown in FIG. 21) and optical device 36 comprises a camera 64 connected to a monitor 65. Monitors 52 and 65 typically are display monitors only and do not allow operator input thereto. In other embodiments the monitors may allow touch screen contact by an operator to control die and/or substrate movement or other system variables.

Referring to support structure 18, substrate holding device 42 comprises a pair of grasping arms adapted to secure substrate 48 therein and control device 44 comprises a computer 66 adapted for moving the holding device and the substrate over heater block 46. Computers 55 and 66 and several motors are connected to a monitor 67, which typically is a "touch screen" monitor connected to a keyboard and a computer, to facilitate input by an operator and display of inventory and control information. In a preferred embodiment, pickup station 12, transfer assembly 14, bondhead assembly 16 and support structure 18 are supported on a table and are substantially enclosed by a clear plastic dust cover (not shown for ease of illustration). Use of a dust cover to enclose these mechanisms is feasible because the device is relatively small and because manual operator handling of these mechanisms is not required in the present invention. In a fully automated system, monitors typically would not be required.

Figure 3:
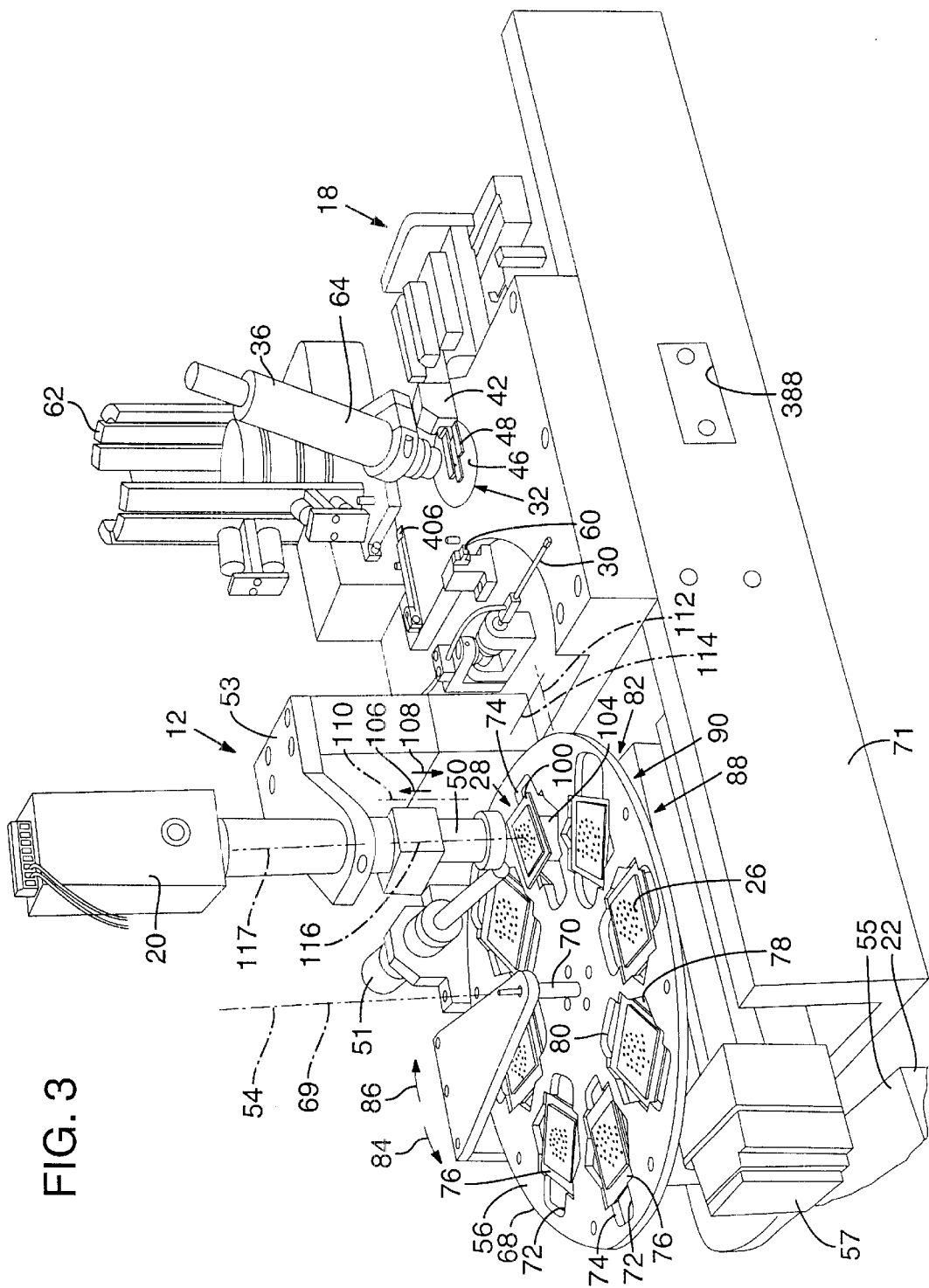
FIG. 3 is a more detailed view of the apparatus of FIG. 2 with several components removed.

FIG. 3 shows a detailed view of pickup station 12. In this preferred embodiment, rotating carrier 56 has a circular outer edge 68, rotates about a pivot axis 69 aligned with a central support column 70, and is supported on a stage 71. Carrier 56 includes multiple die holder positions 72 comprising recesses 74 adapted to each support therein a die holder 76. Carrier 56 typically includes eight recesses 74 spaced at forty-five degree intervals around the carrier such that eight die holders can be supported on the carrier at one time. Recesses 74 each include angled cutout regions 78 for securing the die holders in a preferred orientation within the recess and arcuate access regions 80 for allowing manual or automated removal of the die holder from the recess. A motor 82 (positioned below the carrier) is connected to control device 22 and is operable to rotate carrier 56 in either of directions 84 or 86 about pivot axis 69 of the carrier. Accordingly, any of the eight die holders can be positioned adjacent cameras 50 and 51 for viewing of dice 26 held on the die holder. Positioning of a die adjacent cameras 50 and 51 also positions the die adjacent predetermined pickup position 28 as will be described below. In a preferred embodiment, motor 82 is a stepper motor and is mounted under carrier 56 on stage 71.

Still referring to FIG. 3, each of die holders 76 may support multiple dice on the holder. Preferably, each individual die holder supports several hundred of a particular type of dice and each of the eight die holders support a different type or a different selection of a type of dice. The different types of dice may comprise drivers, predrivers, or other such devices for bonding to the substrate, such as diodes, capacitors, transistors, resistors, memories, passive circuits, or the like. Moreover, a "die" can be anything that can be picked, placed and then bonded in a desired location. During manufacture of a circuit which requires bonding of multiple types of dice to a substrate, carrier 56 is rotated about axis 69 to position the desired type of dice adjacent predetermined pickup position 28 and adjacent reader device 57. Accordingly, automated die delivery and inventory control may be accomplished by use of rotating carrier 56.

In a preferred embodiment, an underside 88 of each die holder includes indicia 90, such as a code tag, that uniquely identifies the particular die holder. The unique code on the tag may be associated with data stored in computer 55 which includes inventory and positioning information related to each die stored on the particular die holder. Accordingly, when the die holder is positioned over reader device 57, the reader device reads indicia 90 to determine the type and position of each die on the holder. This information is fed to control device 22 so that when the die holder is moved into position under camera 50, the control device will guide movement of the die holder to align a particular die on the die holder with predetermined pickup position 28. Reader device 57 preferably comprises a laser optics code reader but may also comprise any reading device.

Positioning of a particular die holder 100 below camera 50 positions the die holder above a die pickup stage 104. Die pickup stage 104 is adapted for moving die holder 100, and the dice held thereon, in an upward direction 106 and a downward direction 108 along a z-axis 110 which generally is parallel to pivot axis 69 of the carrier. Pickup stage 104 is also adapted for moving die holder 100 linearly along an x-axis axis 112 and a y-axis 114, and rotationally about an axis of rotation 116. Movement of the die holder in the x, y and rotational directions is only actuated when the die holder is lifted upwardly in the z direction out of recess 74. In a preferred embodiment, axis of rotation 116 is aligned with a central axis 117 of camera 50 such that rotation of a die about axis 116 will not result in an offset of the die in the x or the y directions with respect to camera 50. Those skilled in the art will understand that the terms "x", "y" and "z" are directional references that define a three dimensional space but that the terms, such as "the x-y plane", for example, need not be aligned with a horizontal plane for purposes of invention. In other words, the three dimensional space defined by the x, y and z axes may be oriented in any direction for purposes of the present invention, such as the bondhead being below the heater block.

If axis of rotation 116 is not aligned with camera axis 117, as is the case in the embodiment shown, upon rotational movement of the die holder, the die viewed by camera 50 will likely be moved in the x or the y directions with respect to camera axis 117. Accordingly, after such rotation the die is moved again, in the opposite x and y directions, to compensate for the x and y offset of the die due to its rotational movement. In this manner, the die is held within the view of camera 50 as it is manipulated into alignment with predetermined pickup position 28. Movement of die holder 100 by pickup stage 104 in the x, y, z and rotation directions is controlled by control device 22, which includes a pre-programmed mathematical formula to move the die in the offset directions if required, such that a die on holder 100 can be precisely aligned with predetermined pickup position 28 automatically with a pattern recognition system, or by human operator input, as will be described below.

Figure 4:
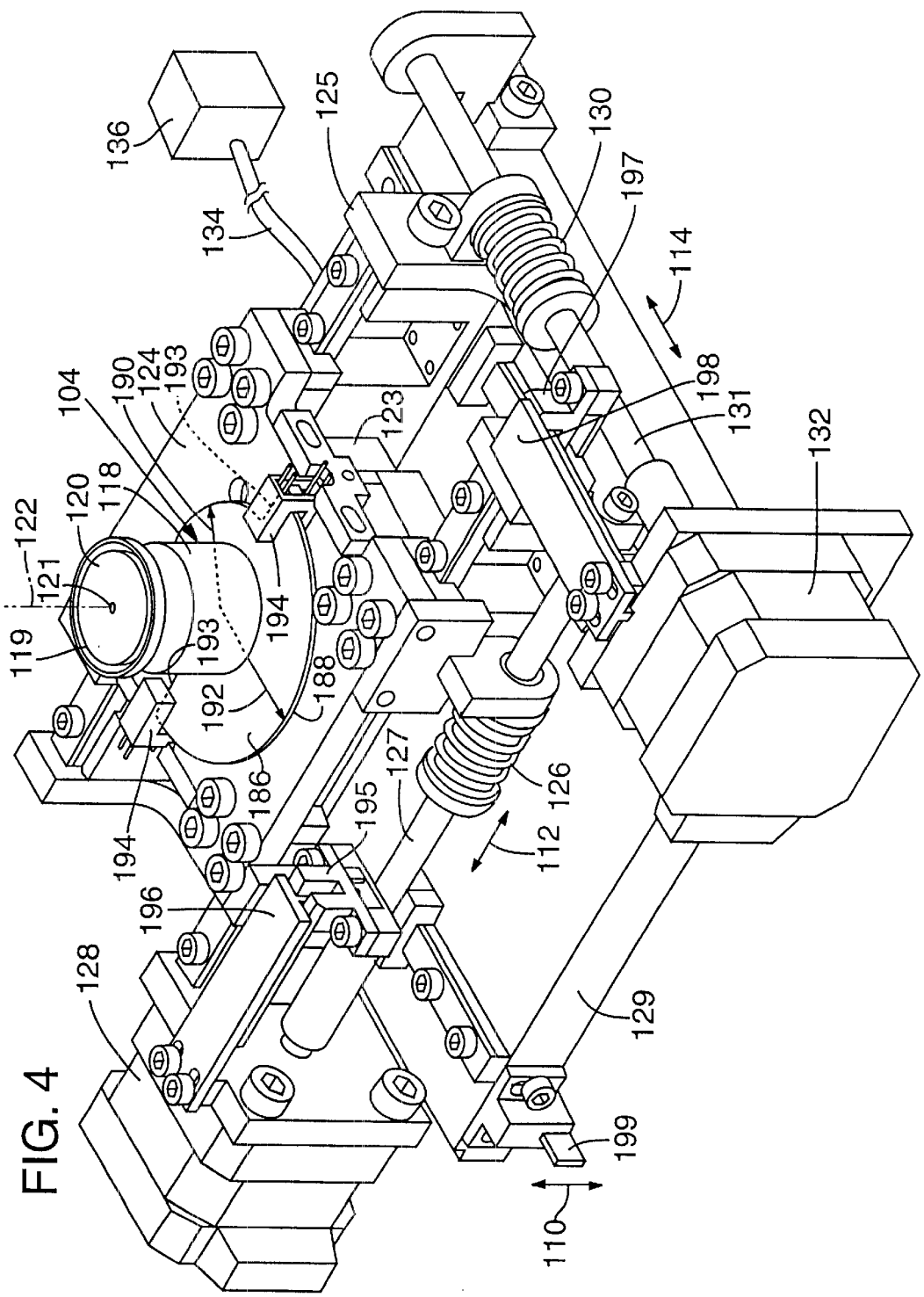
FIG. 4 is a perspective view of internal components of the die pickup stage.

FIG. 4 shows internal components of pickup stage 104. The pickup stage includes a die holder support 118 having a groove 119 for placement of an O-ring therein (not shown), an upper surface 120 and a vacuum aperture 121 extending therethrough. Support 118 is moved about a rotational axis 122 by a motor 123 secured beneath a base 124 which supports die holder support 118. Base 124 and motor 123 are moved along a support 125 in x-directions 112 by a nut 126 mounted on a threaded screw 127 which is powered by a motor 128. Support 125 is moved along a support 129 in y-directions 114 by a nut 130 mounted on a threaded screw 131 which is powered by a motor 132. In other words, motor 128 is attached to base 124 so that motor 128 and threaded screw 127 move with base 124 along y-directions 114 when base 124 is manipulated by motor 132.

Vacuum aperture 121 is connected to a vacuum line 134 which in turn is connected to a vacuum system 136 (shown schematically). Placement of upper surface 120 adjacent to and in contact with underside 88 of die holder 100 (FIG. 3) will result in a seal forming between the underside of the die holder and upper surface 120. When vacuum system 136 is activated, the vacuum pressure generated by the system will retain the die holder on pickup stage 104 so that the position of the die holder can be manipulated by the pickup stage. In a preferred embodiment, motors 123, 128 and 132 are stepper motors that may be manipulated to move a die supported on the die holder in coarse adjustment steps of approximately 10 mils, and in fine adjustment steps of approximately 1 mil.

Still referring to FIG. 4, die holder support 118 is secured to a flange plate 186 having a stepped radius circumference 188 wherein plate 186 rotates with support 118 about axis 122. Plate 186 has a first radius 190 along approximately half of circumference 188 and a second radius 192 along the other half of the circumference. Second radius 192 is larger than first radius 190 so that offset edges 193 (one of which is shown in dash lines) are positioned at the transition points. Two sensors 194, which are connected to control device 22 (shown in FIG. 3), are mounted on base 124 and are positioned on either side of the edge of plate 186 when the large radius portion of the plate is positioned adjacent the sensor. Sensors 194 typically comprise an infrared LED source in an upper portion of the sensor and an infrared detector in a lower portion of the sensor. However, any type or arrangement of position sensor may be used. When the large radius portion of plate 186 is positioned between the detector and the sensor, the plate will interrupt or block the source light beam from reaching the detector. In contrast, when the large radius portion of plate 186 is not positioned between the source and the detector of the sensor, i.e., when the shorter radius of the plate is aligned with a sensor, the beam will not be interrupted and the detector will be able to detect the source light. Accordingly, offset edges 193 can be used to define a "home" or zero position whereafter a computer and an encoder control movement of the stepper motor to measure and control the rotation of support 118 from its "home" position, as the support is moved about axis 122.

Similarly, a sensor 195 and a flag 196 are used to "zero" and determine the position of base 124 along x-axis 112, a sensor 197 and a flag 198 are used to "zero" and determine the position of support 125 along y-axis 114, and a sensor (not shown) and a flag 199 are used to "zero" and determine the "home" position and whereafter a computer and an encoder are used to control movement of the stepper motor to measure and control movement of support 129 along z-axis 110.

FIG. 5 shows additional internal components of pickup stage 104 including a motor 138 that operates to turn a belt 140 which in turn rotates three columns 142 in unison. Columns 142 are threaded screws that move upwardly or downwardly along z-axis 110 in response to movement of belt 140. The size of the columns and the threads on the columns are similar to each other so that each of the columns move the same distance upwardly or downwardly in directions 110 in response to motor 138. An upper surface 146 of each of the columns is connected to an undersurface of support 129 (shown in FIG. 4) so that upward or downward movement of columns 142 causes corresponding upward or downward movement of support 129, and a die holder supported thereon, along z-axis 110. Movement of the die holder in the rotational, x, y and z directions allows for placement of a particular die in alignment with predetermined pickup position 28 (FIG. 3). Movement of the die holder along the x, y, and z-axes, and about its rotational axis is conducted while vacuum system 136 (FIG. 4) is activated so that die holder 100 is secured to pickup stage 104 (FIG. 3).

FIG. 6 shows die holder 100 including a lower, rigid base portion 150 and an upper, flexible support sheath 152 that supports multiple dice 26 thereon. Sheath 152 preferably is manufactured of a sticky, adhesional, gel-type material, such as silicone gel, having a thickness of approximately 1 mil. The gel material may be referred to as "sticky" in that the sheath facilitates surface tension, or other adhesion means, between the gel and an individual die to retain the die on the gel material. The sheath is stretched across base portion 150 and allows sticky, adhesional engagement of the die thereto. The sheath generally is spaced a distance from base 150 in the nominal position so that the sheath only contacts the base along an edge 154 of the sheath and at raised portions (not shown) spaced throughout a central region 156 of the sheath. Referring to FIGS. 4 and 6, base portion 150 includes flat underside surface 88 which is adapted to sealingly engage upper surface 120 of pickup stage 104. Underside surface 88 includes one or more vacuum apertures so that when the holder is supported by pickup stage 104 and vacuum system 136 is activated, a vacuum pressure is created in the space between rigid base portion 150 and sheath 152 of holder 100. In a preferred embodiment, holder 100 has a length of approximately two inches, a width of approximately two inches, and rigid base 150 is manufactured of metal or plastic. The exterior shape of the holder may be of any shape as desired to fit within the corresponding shaped recesses of a carrier device.

FIG. 7 shows a cross sectional side view of holder 100 in the nominal position wherein sheath 152 is generally spaced a distance 158 from rigid base portion 150 and contacts the base only along the edge of the sheath (not shown in this figure) and at raised portions 160 in central region 156 (FIG. 6) of the holder. Raised portions 160 generally define the upper most portions of a plastic or a wire mesh 162 that extends along the underside of the sheath. In this nominal position, die 26 is shown contacting sheath 152 completely along a lower surface 161 of the die such that the die is adhesionally secured to the die holder and will not easily be displaced from sheath 152.

In a preferred embodiment, lower surface 161 of the die comprises a flat, smooth surface to facilitate handling of the die. The die itself may comprise a FET manufactured in wafer form, as known in the art, or any type of die as is desired. Die 26 is shown to include raised portions 164 that extend upwardly and away from sheath 152. Raised portions 164 of die 26 may comprise bumps used during thermal compression, or during solder attachment, to bond the die to a substrate to form a circuit board. In one embodiment, raised portions 164 may be manufactured of gold or other compressible metal material. In another embodiment the material may comprise indium which may be compressed at room temperature. "Raised portions" 164 may also comprise a pad positioned level with an upper surface 166 of the die wherein the pads may be compressed against the raised portions of a substrate to adhere the die to the substrate. In such a case, FIG. 7 shows portions 164 as raised from upper surface 166 merely for illustrative purposes. When raised portions 164 comprise pads, the pads will extend upwardly from surface 166 a distance of approximately 4 microns. When raised portions 164 comprise bumps, the bumps will extend upwardly from surface 166 a distance of approximately 25 microns, but may be in a range of 2 to 100 microns.

FIG. 8 shows the die and holder of FIG. 7 wherein vacuum system 136 of the die pickup stage has been activated. Activation of the vacuum system causes a vacuum pressure between sheath 152 and rigid base portion 150. The vacuum systems of the present invention preferably are solenoid driven, but may comprise any vacuum system. The vacuum pressure causes sheath 152 to flex downwardly toward mesh 162 (which may be manufactured of wire, plastic, or the like) so that the sheath conforms to the surface of the mesh and to holder base 150 along the width of the sheath. In this position, lower surface 161 of the die only contacts sheath 152 at regions 168 adjacent raised portions 160 of the mesh. The spacing of raised portions 160 is such that, typically, at least three raised portions contact a smooth underside 161 of the die so as to completely and evenly support the die. An air gap 170 is created between each of regions 168 so that the surface tension/"sticky" force holding die 26 to sheath 152 is greatly diminished relative to the surface tension forces shown in FIG. 7. Accordingly, in this vacuum activated orientation, die 26 may be removed from die holder 100 by the vacuum system of transfer assembly 14.

Still referring to FIG. 8, in a preferred embodiment, die 26 has a width 172 on the order of eleven mils, a depth of approximately twelve mils, and a height 174 of approximately 4 mils. The thickness of the die generally is in the range of 3 to 20 mils. Raised portions 164, also called bumps, have a height 176 of approximately 2 to 25 microns.

Figure 9:
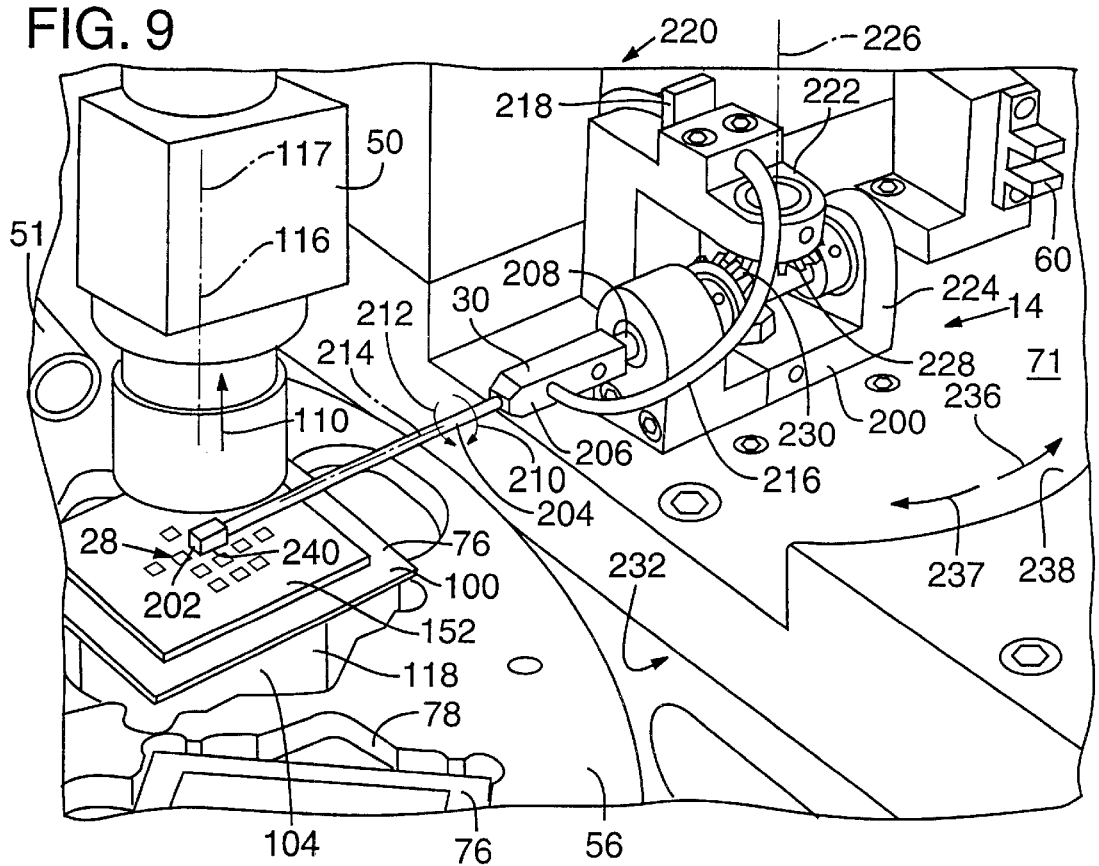
FIG. 9 is a detailed perspective view of the die pickup stage and the transfer arm in the pickup position.

FIG. 9 shows transfer assembly 14 including transfer arm 30 mounted on a bevel gear assembly 200. Transfer arm 30 includes a head portion 202 connected to an elongate arm 204 extending from an arm base 206. Arm base 206 includes a rod 208 connected to bevel gear assembly 200 such that base 206, along with arm 204 and head portion 202, are operable to rotate in directions 210 and 212 about an elongate axis 214 of the transfer arm. Arm base 206 is connected to a vacuum hose 216 that extends through a vacuum sensor 218 and to a vacuum system 220. Sensor 218 may comprise any vacuum sensor which functions to sense if a die is being held over a vacuum aperture on head portion 202 or whether the aperture is exposed. A desired length of vacuum hose 216 is positioned between arm base 206 and vacuum sensor 218 so that transfer arm 30 may rotate at least one hundred and eighty degrees in either of directions 210 and 212 about axis 214 without the hose hindering such rotational movement. In a preferred embodiment, hose 216 is manufactured of high temperature grade rubber, but other flexible materials may also be used.

Still referring to FIG. 9, bevel gear assembly 200 includes a stationary bevel gear base 222 mounted on stage 71 of the pick-and-place system. Assembly 200 also includes a movable bevel gear base 224 which supports transfer arm 30 and which is pivotally mounted on stage 71 for pivotal movement about a pivot axis 226. Pivot axis 226 preferably is positioned perpendicular to elongate axis 214 of the transfer arm. Stationary base 222 includes a first gear 228 radially aligned with pivot axis 226, and movable base 224 includes a second gear 230 radially aligned with elongate axis 214.

Movable bevel gear base 224 is connected to a motor 232, which is positioned below stage 71, by a rod extending through stage 71 wherein the rod is radially aligned with axis 226. Motor 232 is controlled by control device 44 (FIG. 2) so that the motor may be engaged to rotate base 224 about axis 226. First gear 228 is stationarily secured within stationary bevel gear base 222 and is not moved by motor 232.

Gears 228 and 230 matingly engage with one another such that as movable base 224 is rotated, stationary first gear 228 causes rotation of second gear 230 about elongate axis 214. Second gear 230 is secured to arm base 206 by rod 208 so that rotation of gear 230 causes corresponding rotation of elongate arm 206 about axis 214. Accordingly, as transfer arm 30 is pivoted from a pick position (shown in FIG. 9) in a direction 236 about pivot axis 226 and parallel to an upper surface 238 of stage 71, the transfer arm is also rotated about elongate axis 214 in direction 212. Due to the As mating engagement of gears 228 and 230, the number of degrees of rotation of pivot of the transfer arm about pivot axis 226 is the same number of degrees of rotation of the transfer arm about elongate axis 214. In other words, when the transfer arm is pivoted ninety degrees about pivot axis 226, the arm will also be rotated ninety degrees about elongate axis 214. When the transfer arm is pivoted one hundred and eighty degrees about pivot axis 226, the arm will also be rotated one hundred and eighty degrees about elongate axis 214. This one-to-one rotational correspondence may also be called "differential tracking". Similarly, when the transfer arm is pivoted in direction 237 to return to the pickup position shown in FIG. 9, the elongate arm will also rotate in direction 210 to return to the pickup position. In other embodiments, the transfer arm may comprise an arm having rectilinear motion such as a telescoping arm, an arm that rotates in an arc perpendicular to the upper surface of the stage, an arm positioned so that it will rotate less than or more than 180 degrees during movement of the arm from the pickup position to the placement position, or any like device. In still another embodiment, pivotal movement and rotational movement of the transfer arm may be carried out independently of one another. In other words, the arm may rotate about its rotational axis after the arm has completed, or partially completed, its pivotal movement about its pivot axis.

Still referring to FIG. 9, when the transfer arm is in the pick position (as shown in FIG. 9) a die support surface 240 of the transfer arm is facing downwardly toward die holder 100. When the transfer arm has been pivoted one hundred and eighty degrees about pivot axis 226 to a placement position, head portion 202 of the transfer arm will be positioned adjacent the bondhead assembly and die support surface 240 of the transfer arm will be facing upwardly. The position of die support surface 240 in the pick position, and in particular, a vacuum aperture of surface 240, when head portion to 202 of the transfer arm is positioned above the die pickup stage, defines predetermined pickup position 28 (FIG. 3). The position of die support surface 240 in the placement position, and in particular, a vacuum aperture of surface 240, when head portion 202 of the transfer arm is positioned below bondhead 34 (FIG. 2), defines predetermined placement position 32 (FIG. 3).

The method of picking a die will now be described. An operator first verifies the zero position of each of the moving components of the system. The term "operator" may include a human operator, a controller, computer software, or the like, or any combination thereof. In the zero position, die holder 100 is positioned under camera 50 in recess 74 (FIG. 3), cameras 50 and 51 are focused on predetermined pickup position 28, and die support surface 240 of transfer arm 30 is positioned in line with predetermined pickup position 28. If any of these requirements are not met, the operator should recalibrate or adjust the system. The transfer arm is then pivoted out from under the camera and die holder 100 is moved upwardly in z-direction 110 to align die 26 (FIG. 3) with the focal plane of camera 50. Computer 55, using inventory information stored in its memory, controls die pickup stage 104 to move in the x, y and rotational directions to position die 26 in alignment with predetermined pickup position 28. A pattern recognition system or other operator input is used to finely adjust the position of die 26 so it is precisely aligned with predetermined pickup position 28, i.e., to within about one mil of exact alignment with position 28. Die holder 100 is then lowered slightly to move the holder out of the path of the transfer arm. These positioning steps are conducted with vacuum system 136 (FIG. 4) activated so that the die holder is held on the pickup stage. Transfer arm 30 is moved into the pickup position above the die, i.e., with die support surface 240 facing downwardly toward the die. The die holder is then raised in the z-direction and vacuum system 220 on the transfer arm is activated. Upon raising of the die toward the transfer arm, the vacuum system of the transfer arm will overcome the adhesion force of gelatin sheath 152 (FIG. 6) on the die so that the die will be transferred to the transfer arm and held against surface 240. The die may be out of alignment with predetermined pickup position 28 by approximately two mils and still allow pickup of the die from the die holder. As stated earlier, predetermined pickup position 28 is defined by the position of a vacuum aperture on die support surface 240 when transfer arm 30 is in the pickup position. During transfer of die 26 from holder 100 to transfer arm 30, monitor 52 momentarily shows the view of camera 51, instead of showing the view of camera 50, so that the operator can see the transfer of the die to the transfer arm. Once the transfer is complete, the view of camera 50 is shown on monitor 52 to verify that no die is shown remaining on the die holder. During the alignment process before pickup, camera 50 is used to verify alignment in the x, y and rotational directions. Camera 51 is used to verify alignment in the z-direction.

Camera 50 is initially calibrated by placing an imprintable film, such as an indium film, on a holder positioned below camera 50 in a raised pickup orientation. Transfer arm 30 is then moved into the pickup position under camera 50. Arm 30 is then pressed downwardly toward the film such that die support surface 240, and the vacuum aperture therein, makes an imprint on the indium film. Transfer arm 30 is then allowed to rise upwardly to its normal, horizontal orientation, and is pivoted out from under camera 50. The camera is then focused on the imprint of the vacuum aperture. Indicia, such as cross hairs, are placed on the screen of monitor 52 to indicate predetermined pickup position 28, as determined by the imprint of the aperture on the indium film.

FIG. 10 is a view of die holder monitor 52 operably connected to camera 50 and showing a particular die 252 supported on die holder 100. Raised portions 164 of die 252 extend upwardly toward camera 50. Those skilled in the art will understand that "raised portions" 164 may also comprise a bonding pad or surface that is not raised from the remainder of the die. Accordingly, the term "raised portions" is merely used to describe portions of the particular die illustrated and with which the current invention may be used. In this view vacuum system 136 (FIG. 4) is activated such that sheath 152 is drawn downwardly toward mesh 162 and raised portions 160 of mesh 162 are seen contacting an underside of the sheath. Accordingly, die 252 is adhesionally secured to die holder 100 at raised portions 160 of mesh 162 so that the die will remain on the holder until picked therefrom. A screen 254 of monitor 52 also shows indicia 256 that indicate predetermined pickup position 28. Indicia 256 may comprise a computer generated outline of a die, a computer generated cross-hair, a cross-hair drawn directly on an exterior surface of monitor screen 254, or any similar indicia means. In each case, correct placement of the indicia on the monitor preferably is accomplished during initial calibration of the device whereupon the indicia is not moved from this location on the screen during operation of the die pick-and-place system.

Still referring to FIG. 10, die 252 is shown unaligned with indicia 256 such that the die would unlikely be picked by transfer arm 30 during a normal pickup procedure, or, if picked, the die would not be correctly positioned on support surface 240 for placement adjacent the bondhead assembly. To align the die, die 252 is rotated in a direction 258, is moved in an x-direction 260 and is moved in a y-direction 262 so that the die will be properly centered on indicia 256. As will be understood by those skilled in the art, due to the small area of view of camera 50 and due to the spacing between each of the die on holder 100, generally only one die is visible on monitor 52 at one time.

In a preferred embodiment, camera 50 is fixed in position and has a focal length of approximately one inch. The camera typically allows the top surface of the die to be brought into focus along the z-axis. Accordingly, the camera may be used in conjunction with controlled movement of the die holder to align the die along the z-axis, i.e., to position the die at the correct height for pickup.

FIG. 11 shows the monitor of FIG. 10 wherein die holder 100, and die 252 supported thereon, has been rotated and moved in the x and y directions such that die 252 is aligned with indicia 256. In this position wherein the die is aligned with indicia 256, and therefore is aligned with predetermined pickup position 28 (FIG. 3), the die is ready for pickup by the transfer arm for transfer to the bondhead assembly.

FIG. 12 shows the internal components of transfer arm 30 including a vacuum passageway 270 in arm base 206, a vacuum passageway 272 extending along the length of elongate arm 204, and a vacuum passageway 274 extending through head portion 202 and terminating in a vacuum aperture 276 in die support surface 240. Each of the vacuum passageways are connected to one another and to vacuum system 220 (FIG. 9) of the transfer assembly. In a preferred embodiment, elongate arm 204 has an outer diameter of approximately 0.062 inches and is manufactured of stainless steel. Head and base portions 202 and 206, respectively, are preferably machined of aluminum.

Still referring to FIG. 12, vacuum aperture 276 is shown positioned directly above and aligned with die 252 on die holder 100. As stated earlier, aperture 276 in support surface 240 defines predetermined pickup position 28. To transfer the die, once the transfer arm has been moved into position above die holder 100, the die holder is raised upwardly along z-axis 110 such that die 252 is positioned very close to or in very light contact with die support surface 240 of the transfer arm. Upon activation of vacuum system 220 of the transfer arm assembly, the vacuum pressure created at vacuum aperture 276 will overcome the adhesion force between die 252 and the gel of sheath 152 in contact with raised portions 160 of mesh 162 (FIG. 7). Accordingly, the die will be pulled toward and held against die support surface 240 by the vacuum pressure within transfer arm 30. Upon lowering of die holder 100 downwardly in the z-direction, the die will remain securely held against the transfer arm. This completes transfer of the die to the transfer arm. With the die held against die support surface 240 of the transfer arm and the die holder lowered out of the way, the transfer arm may pivot and rotate about its pivot and rotational axes so as to move the die into the predetermined placement position underneath the bondhead assembly.

In a preferred embodiment, code reader assemblies are used to determine the position of each of die holders 100 within carrier 56. Laser sensors are used in one embodiment to measure the distance between a die and die support surface 240 and to ensure the die is positioned at a correct height for pickup. In other words, a sensor is connected to computer 55 (FIG. 2) which raises and lowers pickup stage 104 (FIG. 9) so that the top surface of a die is positioned adjacent die support surface 240 on transfer arm 30. During assembly of a substrate having multiple dice bonded to a single substrate where each of the dice has a different thickness, or where system 10 is used to bond dice to multiple substrates each having a different thickness, the optical sensors are used to make real-time adjustments to the height of the pickup stage. In another embodiment, camera 51 (FIG. 3) may be used to determine and facilitate a correct height of a die being positioned for pickup by the transfer arm.

To determine whether a die has been correctly transferred to transfer arm 30, vacuum sensor 218 (FIG. 9) is placed within the vacuum system of the transfer arm. Other die transfer verification systems may include mass flow meters, (such as a hotwire anemometer), a micro-optical sensor (wherein a correctly transferred die will occlude the detector), or a focal plane recognition system (which recognizes when a die is correctly positioned).

Figure 13:
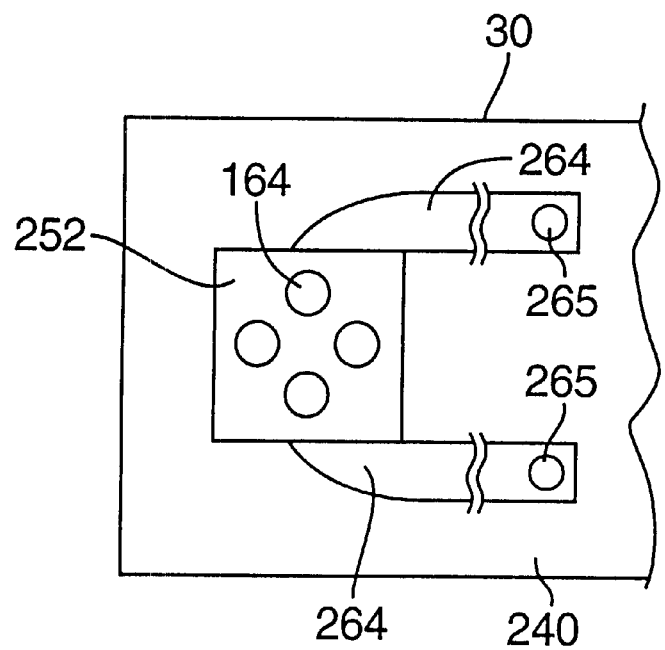
FIG. 13 is a plan view of the transfer arm wherein the arm includes pneumatic tweezers.

FIG. 13 shows another embodiment of the transfer arm wherein transfer arm 30 includes pneumatic tweezers 264 on die support surface 240 wherein the individual tweezer arms pivot about pivot pins 265 to capture a die therebetween. The tweezers may be used to automatically pick a die from the die holder without the use of a vacuum system. In this embodiment, the tweezer arms are much longer than the length of the die so as to correctly grasp the die along its side edges.

Figure 14:
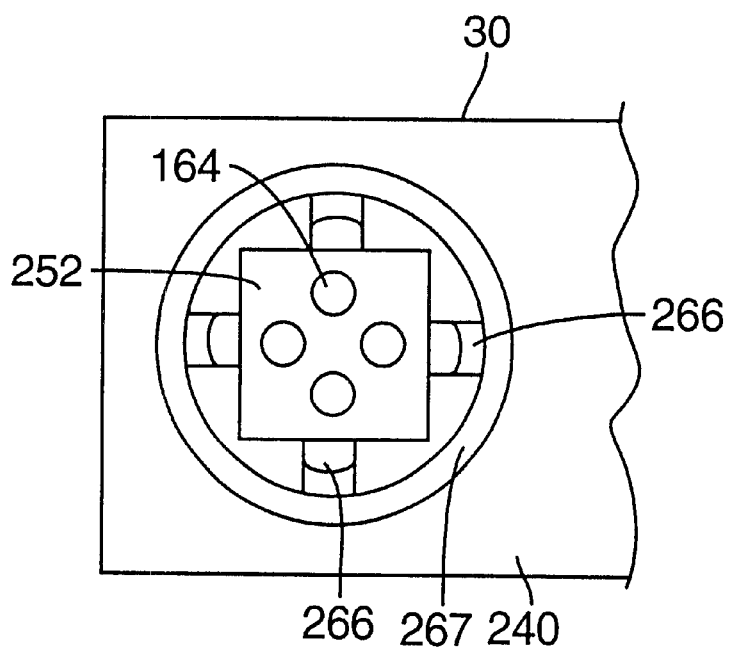
FIG. 14 is a plan view of the transfer arm wherein the arm includes pneumatic chucks.

FIG. 14 shows another embodiment of the transfer arm wherein transfer arm 30 includes pneumatic chucks 266 on die support surface 240 wherein the pneumatic chucks move outwardly from surface 240 through a collet 267 to capture a die therebetween. The chucks may be used to automatically pick a die from the die holder without the use of a vacuum system.

Figure 15:
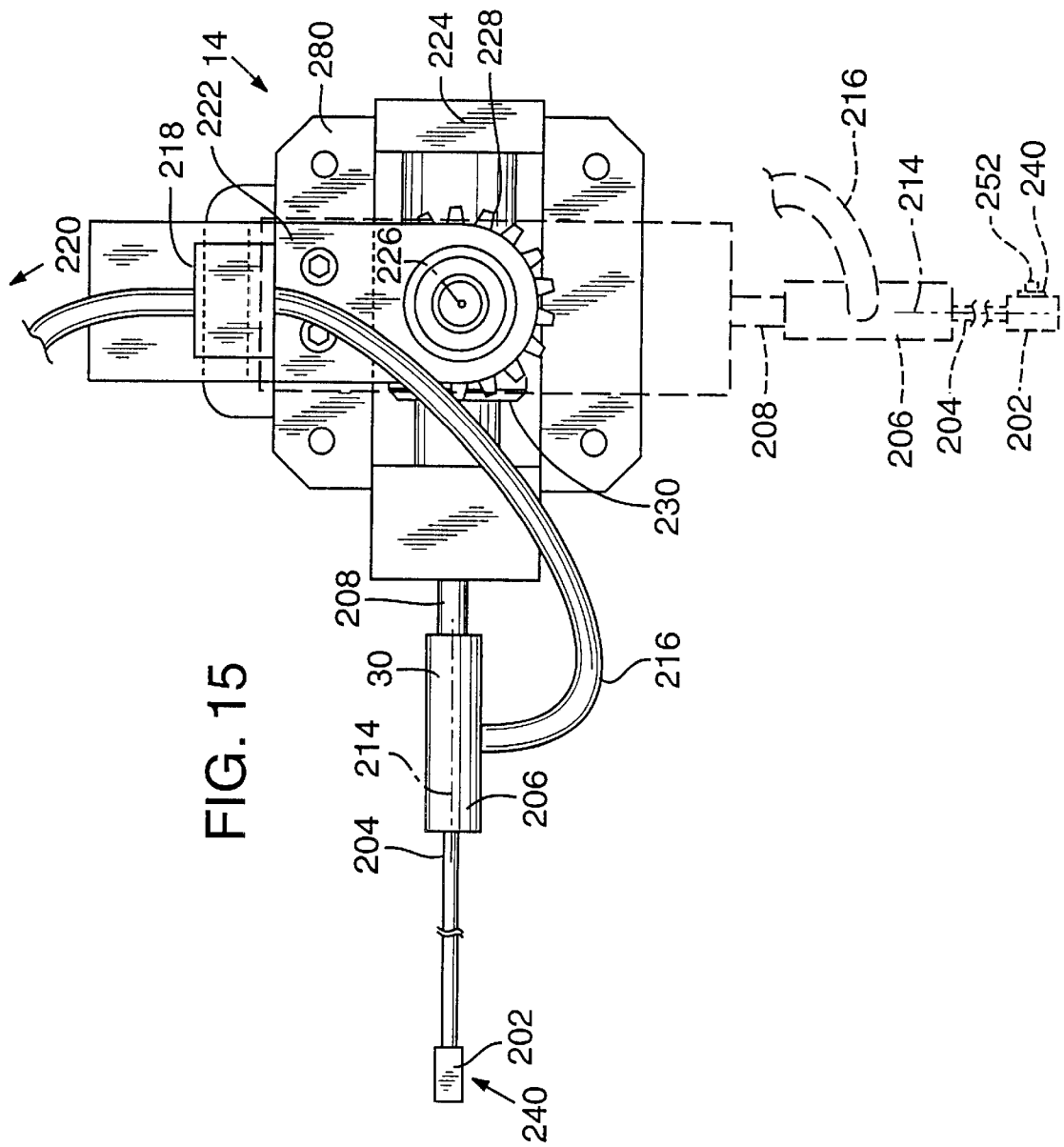
FIG. 15 is a top view of the transfer assembly.

FIG. 15 shows the components of transfer assembly 14 including stationary base 222 and a stepper motor 280 connected to movable base 224 (stage 71 is not shown so that stepper motor 280 can be seen). Transfer arm 30 is shown in a pickup position with die support surface 240 facing downwardly. The figure also shows the transfer arm in a one-half rotated position (shown in dash lines) wherein transfer arm 30 has been pivoted ninety degrees about axis 226 and rotated ninety degrees about elongate axis 214 so that die support surface 240 is shown in side view with die 252 held thereagainst. In this one-half rotated position, hose 216 is shown extending upwardly from arm base 206.

Figure 16:
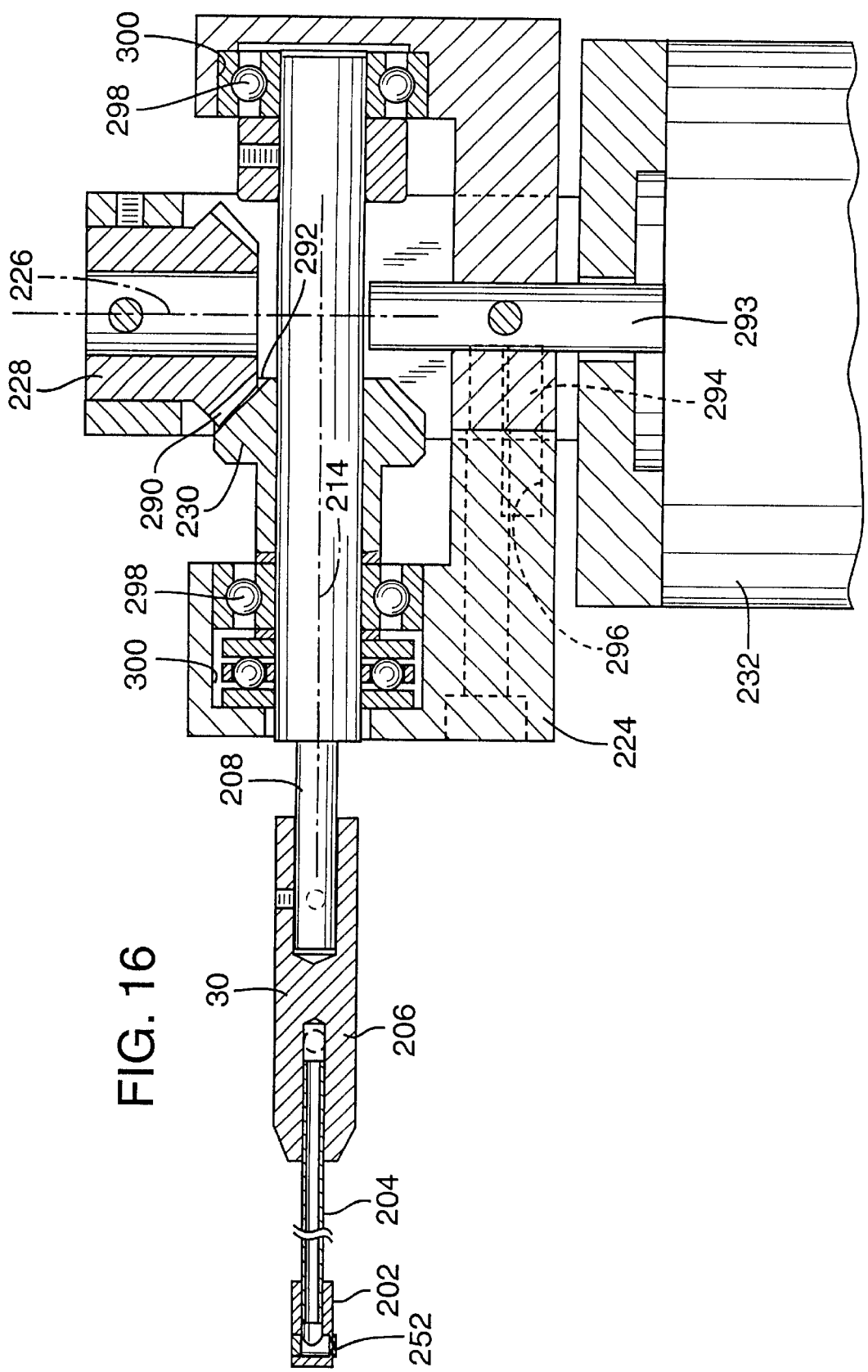
FIG. 16 is a side cross-sectional view of the transfer assembly.

FIG. 16 shows a side view of the internal components of the transfer assembly. First gear 228 includes teeth 290 that matingly engage teeth 292 of second gear 230 at a forty five degree angle measured from both elongate axis 214 and pivot axis 226. A shaft 293 extends from motor 232 to movable base 224 and is secured by a set screw 294 within an aperture 296 of base 224 such that motor 232 functions to rotate movable bevel gear base 224 about pivot axis 226. Second gear 230 does not contact shaft 282 and is free to rotate within bearings 298 of passageways 300 of movable bevel gear base 224.

Figure 17:
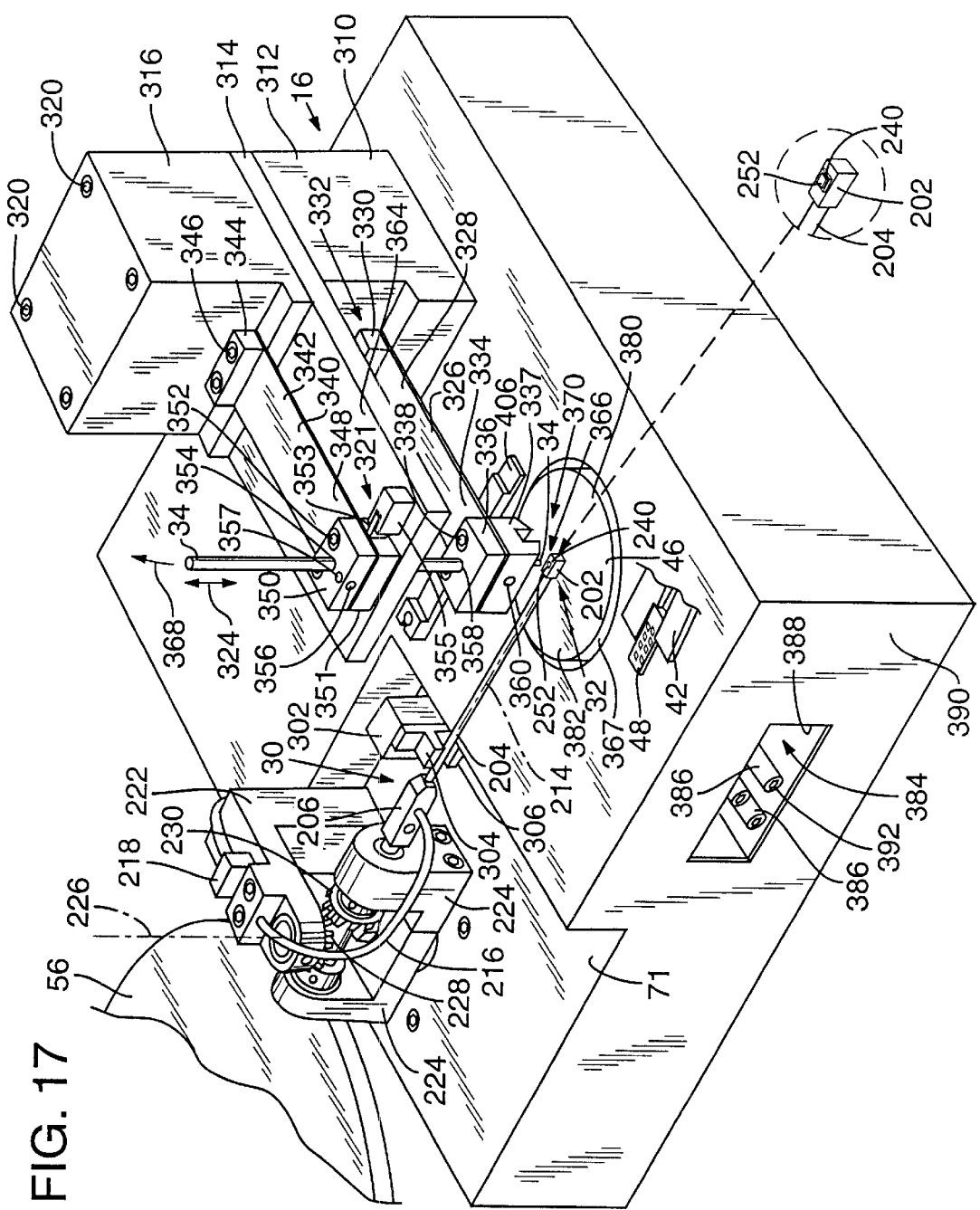
FIG. 17 is a detailed perspective view of a portion of the bondhead assembly and the transfer arm in the placement position.

FIG. 17 shows transfer arm 30 rotated to a position wherein head portion 202 of the transfer arm is positioned in predetermined placement position 32 below bondhead 34. As described above, as transfer arm 30 is pivoted about pivot axis 226 from the predetermined pickup position adjacent pickup station 12 to the predetermined placement position adjacent bondhead assembly 16, die support surface 240 is rotated about elongate axis 214 such that support surface 240, with a die held thereagainst, is moved from a downward facing position to an upward facing position. Accordingly, FIG. 17 shows die support surface 240 facing upwardly and with die 252 facing upwardly toward the bondhead assembly. In this position, movable bevel gear base 224 has pivoted about pivot axis 226 one hundred and eighty degrees and flexible vacuum hose 216 connected to arm base 206 has moved with the transfer arm. A position sensor 302 senses the presence of elongate transfer arm 204 such that verification of the home position of the transfer arm can be automated. A stepper motor, together with a computer, is then used to determine a distance of the transfer arm from this home position. In the preferred embodiment, sensor 302 comprises an infrared source positioned within an arm 304 and an infrared detector positioned within an arm 306 and wherein arm 204 of the transfer arm blocks light from reaching the detector when the transfer arm is correctly positioned in the placement position. Other types of position sensors may be used to verify the home position of transfer arm 30.

Still referring to FIG. 17, a lower portion of bondhead assembly 16 is shown. In particular, the bondhead assembly comprises lower support structure 310 secured to stage 71. Structure 310 comprises a first block 312, a plate 314, and a second block 316. Each of the blocks and the plate are secured together and to stage 71 by elongate bolts 320. Plate 314 includes an aperture 321 which allows bondhead 34 to move freely generally along a z-axis 324 without engaging the inner surface of aperture 321. The aperture typically has an inner diameter at least twice as large as the outer diameter of shaft 34.

Assembly 16 further comprises a first flexible member 326 secured at a first end 328 to first block 312 by a plate 330 and fasteners 332. Flexible member 326 is secured to bondhead 34 at a second end 334 between plates 336 and 337 by fasteners 338. Similarly, a second flexible member 340 is secured at a first end 342 to second block 316 by a plate 344 and fasteners 346. Flexible member 340 is secured at a second end 348 between plates 350 and 351 by fasteners 352. Bondhead 34 extends through apertures 354 of plates 350 and 351 of the second flexible member and is secured thereto by a set screw 356. In a preferred embodiment, a pin 357 extends through end 348 of the flexible member and through plates 350 and 351 to align the three components with one another. The bondhead also extends through apertures 358 of plates 336 and 337 of the first flexible member and is secured thereto by a set screw 360. Accordingly, as the bondhead is moved upwardly or downwardly along z-axis 324, lateral movement of the bondhead perpendicular to the z-axis is controlled by the first and second flexible members. In other words, due to the nominally planar shape and resilient properties of the flexible members, and due to the fact that two flexible planar members are secured to block 310 in parallel planes, the members will generally only flex in the z-direction and will not move in the x, y or rotational directions. Accordingly, the flexible members generally inhibit movement of the bondhead in the x, y or rotational directions and retain the bondhead in an orientation parallel to the z-axis.

Plate 351 typically includes a flag 353 secured thereto and plate 314 typically includes a sensor 355 aligned with flag 353. Accordingly, as the bond head is moved upwardly or downwardly along the z-axis, sensor 355 can determine when the bondhead is in a home position. Thereafter, an encoder, also referred to as a counter, is used together with a linear motor to control the height of the bondhead relative to the initial home position.

Still referring to FIG. 17, bondhead 34 is shown lowered by a motor 478 (shown in FIG. 29) to a relaxed position so that flexible members 326 and 340 are positioned in a straight, unbent orientation and plate 351, which is attached to the underside of second flexible member 340, is positioned above an upper surface 364 of plate 314. In this position, a lower bonding surface 366 of the bondhead is aligned with predetermined placement position 32 and is positioned directly above or in contact with a die held against die support surface 240 of the transfer arm. The transfer arm in turn is positioned above heater block 46 positioned within stage 71. An air gap 367 between heater block 46 and stage 71 reduces heat transfer or loss from the heater block to the stage. In a preferred embodiment, heater block 46 is manufactured of stainless steel and stage 71 is manufactured of aluminum.

Bondhead 34 comprises a vacuum tube connected to a vacuum system 368 (shown schematically) and bonding surface 366 includes a vacuum aperture 370 extending therethrough. With the bondhead and the transfer arm aligned in the predetermined placement position, upon activation of vacuum within bondhead 34, and upon release of the vacuum within transfer arm 30, die 252 will be transferred from die support surface 240 of the transfer arm to bonding surface 366 of the bondhead. In this transferred orientation, raised portions 164 (FIG. 13) of the die will be facing downwardly and away from bonding surface 366. Accordingly, in this position the die is ready for bonding to substrate 48 when the substrate is moved into position on heater block 46 and below the bondhead assembly.

Still referring to FIG. 17, heater block 46 includes an upper surface 380 that defines a plane 382. Plane 382 typically is positioned perpendicular to z-axis 324 of the bondhead assembly so that die 252 can be correctly bonded to a substrate supported on surface 380. In the preferred embodiment, the plane of the heater block is adjusted so that it is parallel to bonding surface 366 of the bonding tool, even if the plane of the bonding tool face is not parallel with the x-y plane, so that a die may be evenly compressed therebetween. In other words, the bonding surface and the heater block are planarized with respect to each other, not with respect to the horizon. The term "bonding tool" typically refers to the lower most portion of the bondhead wherein the bonding tool includes the bonding surface thereon.

In the preferred embodiment the top surface of the heater block typically has a slight curvature such that the center of the top surface of the heater block is slightly raised with respect to an edge of the heater block. This very slight curvature of the heater block compensates for any slight camber which the substrate may have. Accordingly, one can be assured that the portion of the substrate positioned directly over the center of the heater block, i.e., the bonding site on the substrate, will be in contact with the heater block, thereby facilitating accurate bonding of a die to the bonding site on the substrate.

Heater block 46 is supported on three positioning rods 384 that are also used to level upper surface 380 of the heater block. The height of each of positioning rods 384 is adjusted by the use of corresponding adjustment rods 386 which are accessed through an access aperture 388 in a front surface 390 of stage 71. In particular, each adjustment rod 386 comprises an elongate rod having a head region 392 adapted to receive an adjustment device, such as screwdriver or an alien wrench, and a gear 394 (shown in FIG. 18) positioned opposite the head region.

Figure 18:
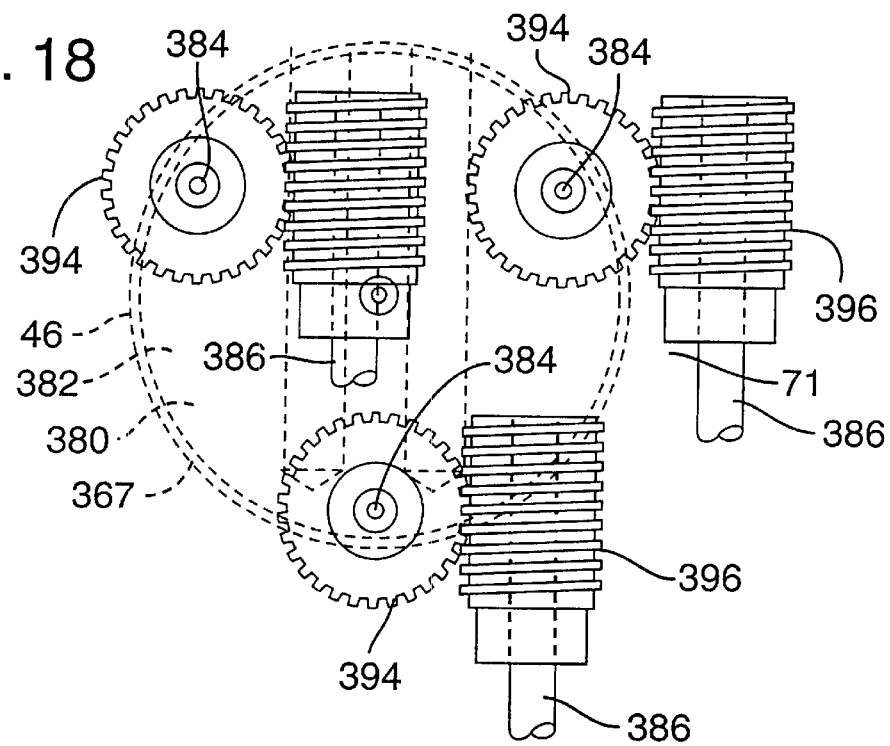
FIG. 18 is a top schematic view of the heater block adjustment mechanism.
Figure 19A:
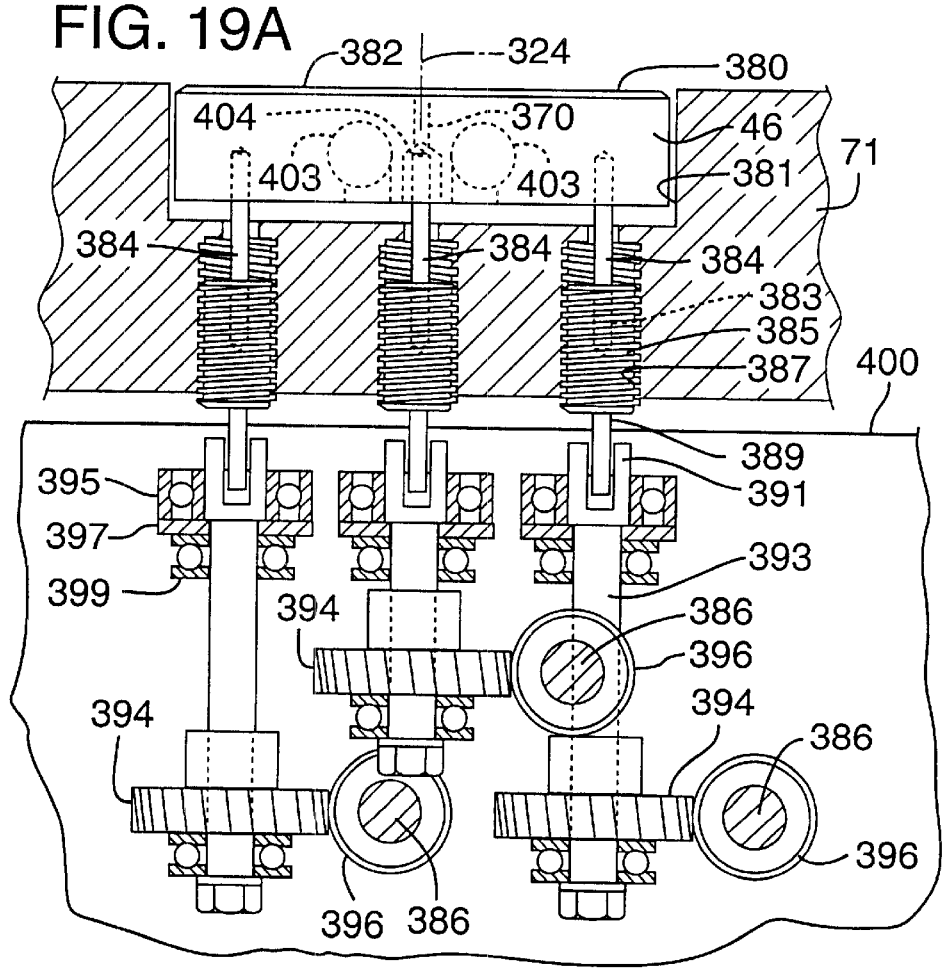
FIGS. 19A–C are schematic views of the heater block adjustment mechanism.

FIGS. 18 and 19A show a top and a side view, respectively, of heater block 46 and the support rods. Heater block 46 is shown positioned within a recess 381 of stage 71. As head region 392 (shown in FIG. 17) is rotated, the head region causes rotation of adjustment rod 386. Rotation of adjustment rod 386 causes rotation of a gear 396. Rotation of gear 396 causes rotation of a gear 394 which mates with gear 396. Accordingly, manipulation of adjustment rod 386 will cause rotation of corresponding gear 396 in either a clockwise or a counterclockwise direction that in turn will cause attendant rotation of gear 394 of the positioning rod. Rotation of gear 394 will cause rotation of a rod 393 which is restrained against vertical movement by a bearing 395, a washer 397, and a thrust bearing 399. Rotation of rod 393 causes a coupling 391 to rotate. Coupling 391 includes a slotted recess for receiving a shaft 389 which has a flat end region corresponding in shape to the slotted recess of coupling 391. The flat end region of shaft 389 is shown in end view in FIG. 19A and typically is approximately 80 mils thick and approximately 240 mils wide. Shaft 389 is secured to a threaded nut 385 which is received in a threaded aperture 387 of stationary stage 71. The threads of nut 385 mating engage the threads of aperture 387 so that as shaft 389 and attached nut 385 rotate, nut 385 will move upwardly or downwardly within aperture 387, depending on the direction of rotation of the nut. Accordingly, the flat end of shaft 389 will move upwardly and downwardly within the slotted recess of coupling 391. The length of the flat end of shaft 389 is quite long relative to the depth of the slotted aperture so that the flat end of shaft 389 is retained within the slotted aperture of coupling 391 during adjustment of the heater block.

An upper portion of support rod 384 is fixedly secured within heater block 46 and a lower portion of the support rod is received within an aperture 383 of nut 385. The diameter of rod 384 is less than the diameter of aperture 383 so that nut 385 rotates without causing rotation of rod 384. As nut 385 rotates and moves upwardly or downwardly within aperture 387, the side walls of aperture 383 rotate about the support rod and the bottom surface of the aperture forces the support rod upwardly or downwardly. Upward or downward movement of the support rod, as determined by the direction of rotation of the threaded screw, causes corresponding upward or downward movement of the portion of the heater block supported by support rod 384. In this manner each of the support rods are manipulated so as to planarize the top surface of the heater block with respect to the bonding surface of the bonding tool. The entire gear assembly is held with a gear housing 400 secured underneath stage 71 and accessed through aperture 388 (FIG. 2).

The three positioning/adjustment rod devices are not connected with one another so that rotation of one of adjustments rods 386 causes rotation of its gear 396 which causes corresponding upward or downward movement of the corresponding gear 394 and positioning rod 384, which in turn adjusts the angle of plane 382 of surface 380 of the heater block with respect to z-axis 324 (FIG. 19). In this manner, surface 380 can be precisely positioned during an initial calibration step to facilitate parallel positioning of a substrate between the heater block and the bonding surface of the bondhead for bonding of a die to the substrate.

In a preferred embodiment, positioning rods 384 are manufactured of invar, a material having very low thermal expansion properties and relatively low thermal conductivity. In another embodiment, the rods may be manufactured of fused quartz. Accordingly, during heating of heater block 46 to standard operating temperatures in the range of 200 to 250 degrees Celsius (which is less than the melting point of the gold pads on the substrate and/or the die), positioning rods 384 do not undergo significant thermal expansion so that upper surface 380 of the heater block remains at its preheated position, which typically will be parallel to the bonding surface of the bondhead. During initial calibration of the heater block, bonding surface 366 of the bondhead may be planarized with respect to the heater block by use of any known planarization or alignment technique. In other words, when the bonding surface is not initially perpendicular to the z-axis of the bond head, either the heater block can be adjusted to be parallel to the bonding surface, the bonding surface can be shaved so that it is oriented perpendicular to the z-axis of the bond head, or both the heater block can be adjusted and the bonding surface of the bondhead shaved or planarized.

Figure 19B:
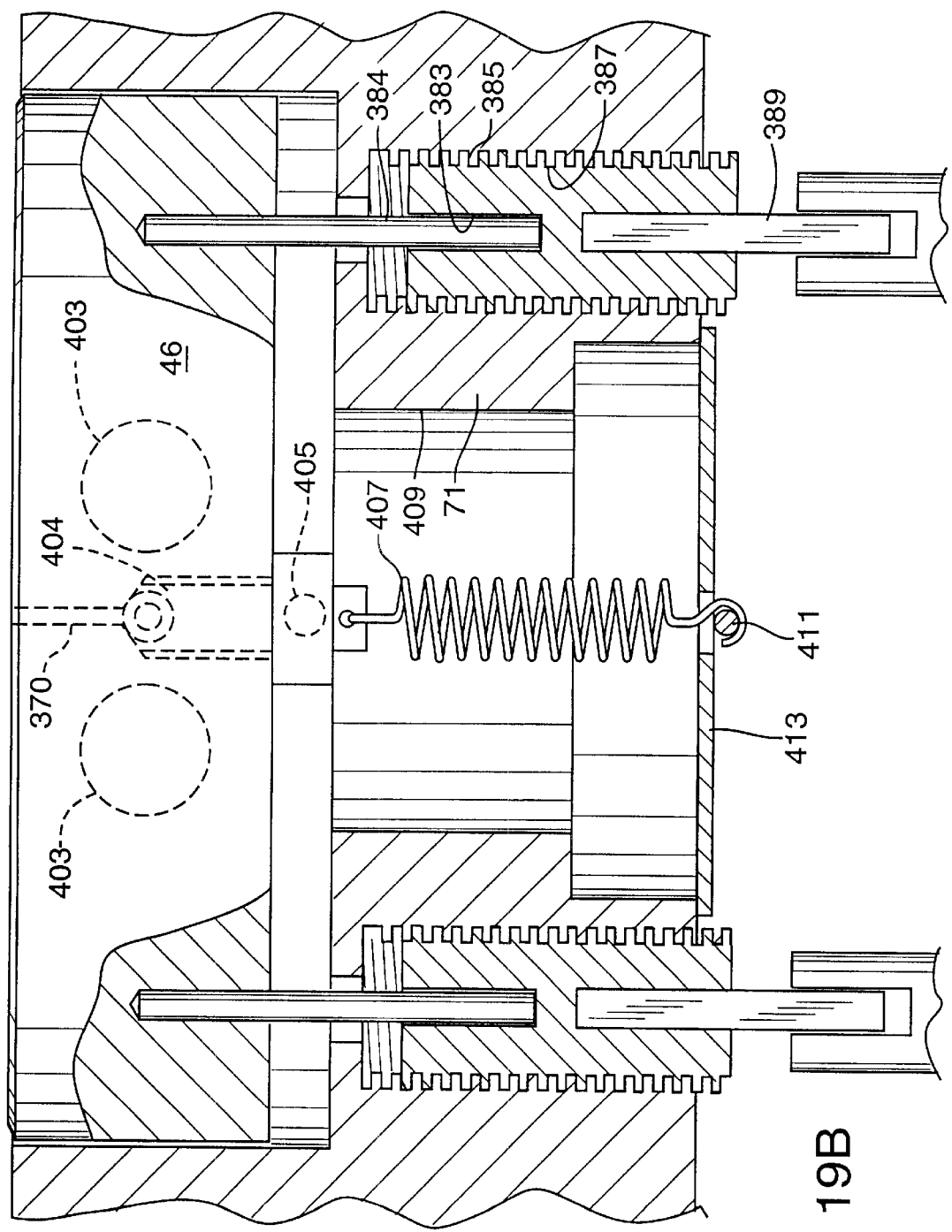

FIG. 19B shows a detailed side view of the heater block and the support rods. Heater block 46 includes apertures 403 for receiving heater cartridges (not shown) within the heater block, apertures 404 for receiving a vacuum plug (not shown) and an access aperture 405 for receiving a vacuum tube (not shown). The heater block further includes a spring 407 secured to an underside of the heater block and to stage 71. The spring extends through an aperture 409 in stage 71 and is secured to stage 71 by a pin 411 and a washer 413. Accordingly, as a support rod 384 is moved upwardly by threaded screw 385, the spring will extend and the heater block will be lifted by the support rod. As the threaded screw is moved downwardly, the spring will force the heater block downwardly thereby retaining support rod 384 fully seated within aperture 383 of threaded screw 385.

Figure 19C:
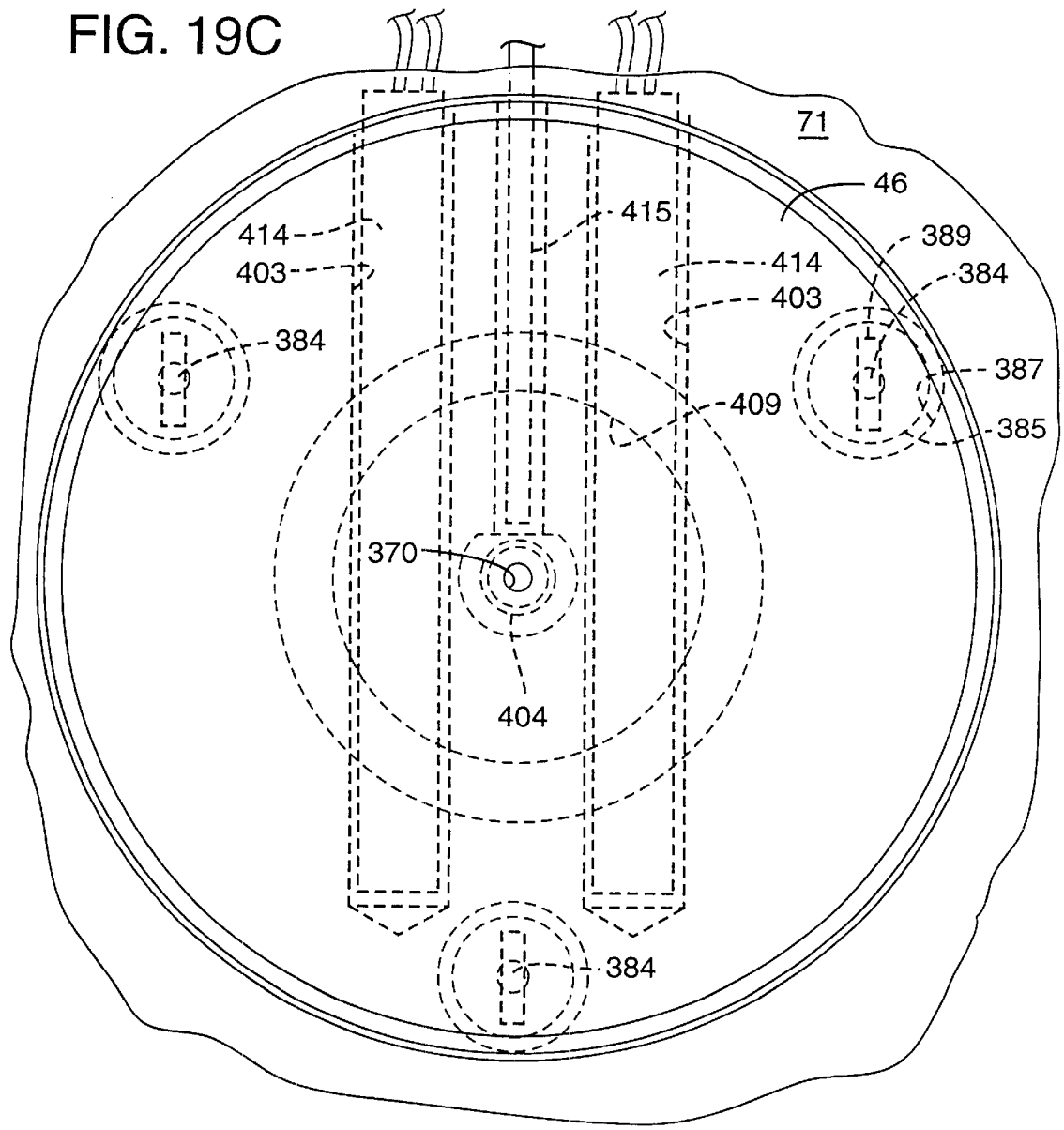

FIG. 19C is top view of the heater block showing heater cartridges 414 received within apertures 403 and a thermocouple 415 positioned between the heater cartridges and within the heater block. The flat end regions of shafts 389 are also shown in top view.

Figure 20:
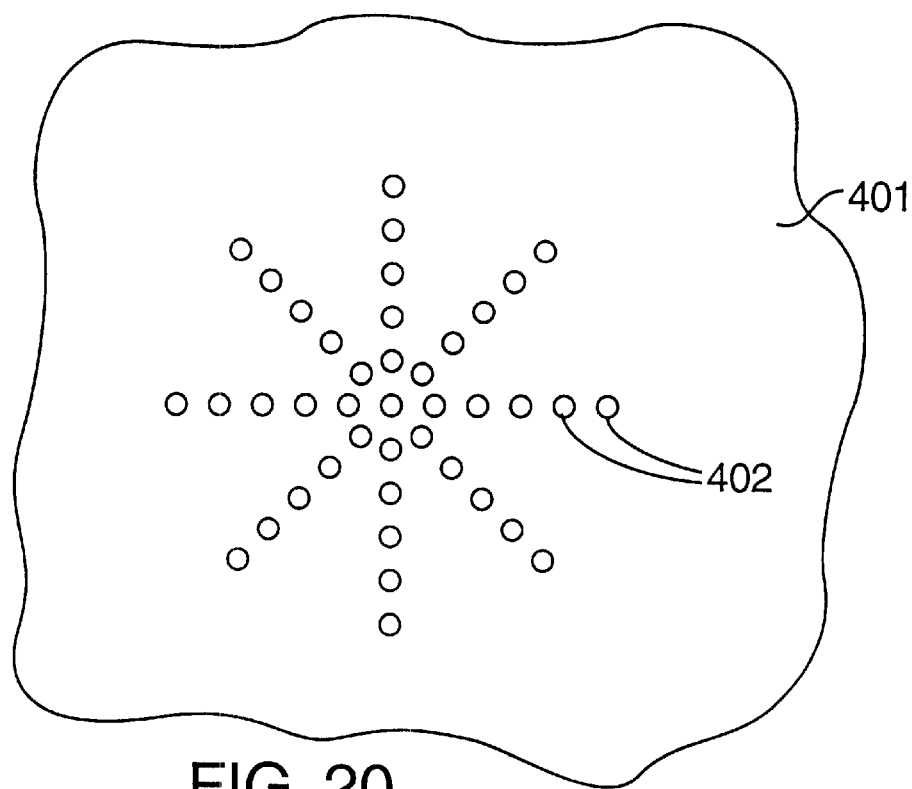
FIG. 20 is a plan view of one cell on a planarization substrate.

FIG. 20 shows a section of a planarization substrate used to guide planarization of the heater block using the gear assembly described above. Specifically, in the case where the bonding surface of the bonding tool is slightly non-parallel to the horizontal plane, the heater block typically is adjusted. To adjust the heater block, each section of planarization substrate 401 includes a star shaped alignment of individual raised regions 402. When the slightly non-parallel bonding surface of the bondhead is brought into contact with a section of the planarization substrate, the raised regions 402 in one subsection of the star shaped alignment of the substrate may be compressed more than the raised regions in another sub-section of the star shaped alignment of the substrate. By measuring the amount of compression in the different sub-sections of the star shaped alignment of the planarization substrate, the heater block can be adjusted so that it is parallel to the bonding surface of the bond head. Typically, the process is iterative with a new section of the planarization substrate being used between each slight adjustment of the heater block to bring the heater block into precise alignment with the bonding surface. Another technique for the initial planarization of the heater block includes an automated optical planarization device which optically measures and then adjusts for any slight angle of the bonding surface relative to the horizontal plane.

Figure 21:
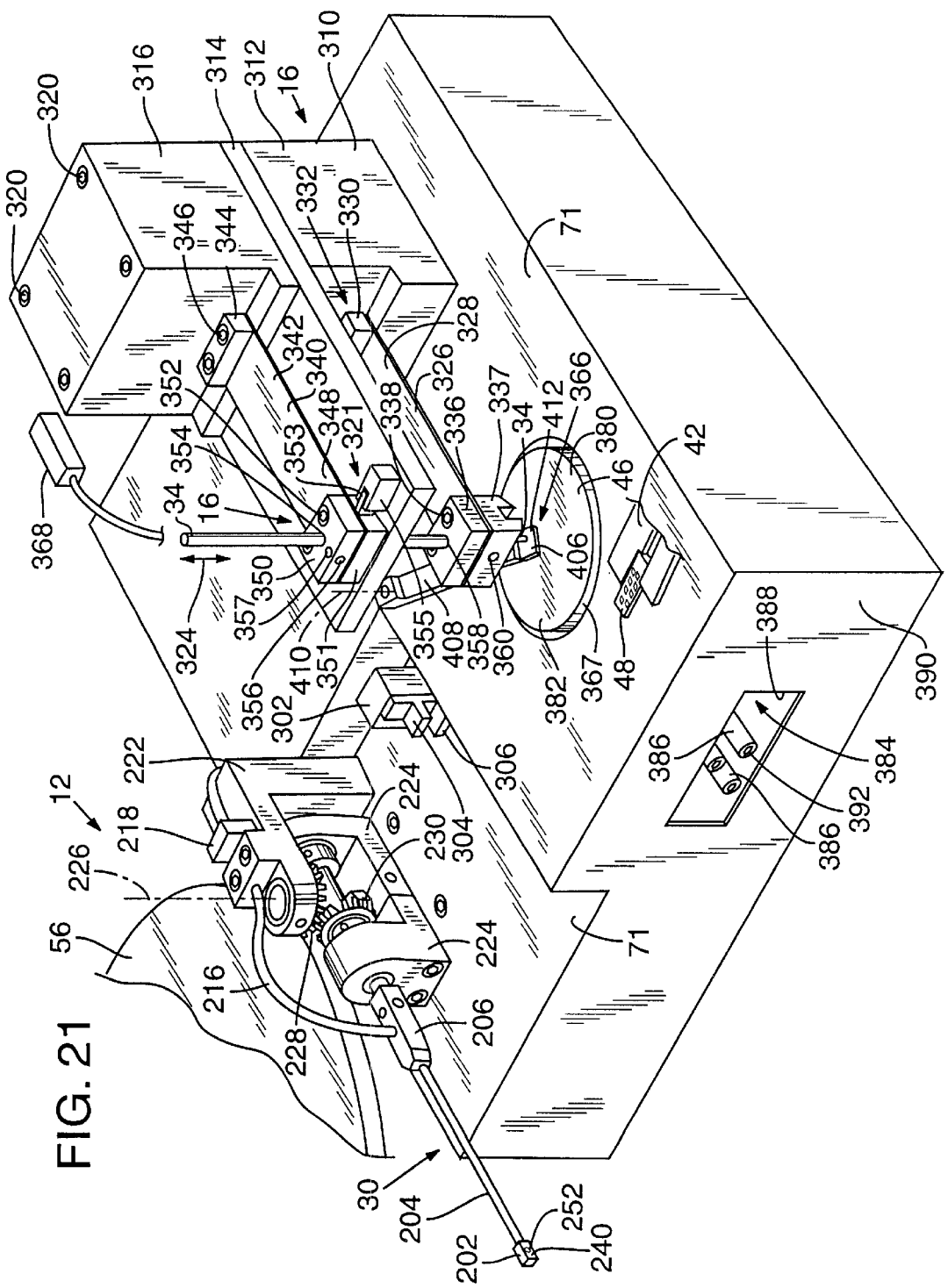
FIG. 21 is a perspective view of the reflection assembly in position under a portion of the bondhead assembly.

FIG. 21 shows transfer arm 30 in a one-half rotated position and a reflection assembly 406 positioned beneath bondhead assembly 16. Reflection assembly 406 comprises an elongate arm 408 pivotally connected to stage 71 at a pivot axis 410. Arm 408 further comprises a reflective surface 412 positioned opposite pivot axis 410 wherein arm 408 has a length such that when assembly 406 is moved into a viewing position, surface 412 is positioned below bondhead 34 and above surface 380 of heater block 46. In this position, reflective surface 412 facilitates viewing through camera 36 (FIG. 2) of lower, bonding surface 366 of bondhead 34. When reflection assembly 406 is moved to the stowed position, shown in FIG. 17, so that surface 412 is not positioned below bondhead 34, camera 36 will show surface 380 of the heater block or any object, such as a substrate, positioned thereon. In the preferred embodiment, reflective surface 412 comprises a thin gold film on the front surface of a fused silica plate. A gold plated fused silica plate is preferred because it will withstand rugged use and has a relatively low thermal expansion coefficient. However, other reflective mediums may also be used.

Still referring to FIG. 21, when the reflection assembly is in the viewing position, the bondhead is positioned approximately 100 mils above the heater block and the lower surface of elongate arm 408 is positioned approximately 75 mils below the bondhead. The substrate typically is approximately 25 mils thick such that the reflective surface of the reflection assembly may be moved into the viewing position without requiring removal of a substrate positioned on the heater block. The reflective surface typically is positioned half way between the upper surface of the substrate and the downwardly facing surface of the die so that the virtual image formed of the die is at the same plane as the bonding site on the substrate. In other embodiments, the reflective surface may be positioned level with an upper surface of a substrate for alignment reasons, therefore allowing only the substrate or the reflection assembly to be positioned under the bondhead assembly at one time.

Figure 22:
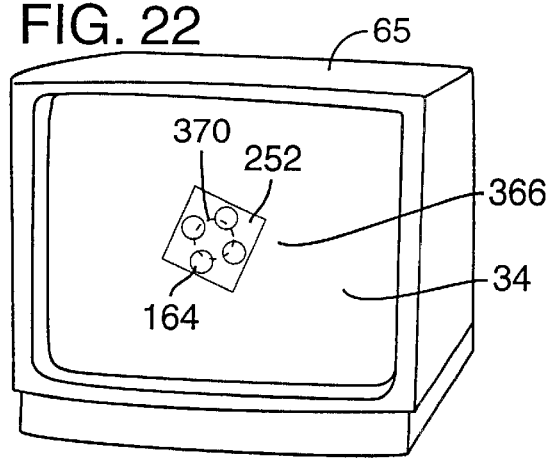
FIG. 22 is a perspective view of the substrate alignment monitor showing a die positioned on the bonding tool.

FIG. 22 shows the view from camera 36 (FIG. 2) on monitor 65 when reflection assembly 406 (FIG. 21) is in the viewing position. In particular, monitor 65 shows a view of die 252 held against bonding surface 366 of bondhead 34. Die 252 has a size greater than a vacuum aperture 370, shown in dash lines, of bonding surface 366 so that the die completely covers the aperture. Vacuum aperture 370 of the bonding tool typically has a diameter of approximately 6.5 mils whereas the die typically has a width of approximately eleven and a half mils. Monitor 65 shows only a central portion of bonding surface 366 so that the edges of the bonding surface of the bonding tool cannot be seen in this view. As discussed earlier, raised portions 164 of die 252 are shown extending downwardly toward heater block 46 such that the die is ready for bonding to a substrate positioned between the heater block and the bonding tool. The image of die 252 shown on monitor 65 is used to create a template image of the die as will be discussed below.

Prior to transferring a die to bonding surface 366 of the bonding tool, the bonding surface should be cleaned. To clean the lower surface of the bonding tool, alcohol is swabbed on a piece of filter paper on a carrier such as a glass flat which has the filter paper on it. The bonding tool is lowered into its fully lowered position. In this fully lowered position the bonding tool will contact the filter paper on the glass flat positioned on the top surface of the heater block. The heater block preferably is not heated during the cleaning operation. The paper and the glass flat are then pulled from between the heater block and the bond surface to clean any debris from the bonding surface and to remove any alcohol from the bonding surface. To inspect the lower surface of the bonding tool, the reflection assembly is moved into the viewing position when no die is held against the bonding tool so that the entire lower surface of the bonding tool, including aperture 370, can be viewed by camera 36.

To calibrate the position of camera 36 on the bonding position, the bonding tool is lowered onto a thin film or paper, such as indium or a gold film on a substrate, so that the vacuum aperture of the bonding tool will leave a mark on the film. The bonding tool is then raised while the film is retained in place. As the film and the substrate are held in position, the camera viewing area of camera 36 is centered on the mark left by the imprint of vacuum aperture 370, which defines the bonding position.

Figure 23:
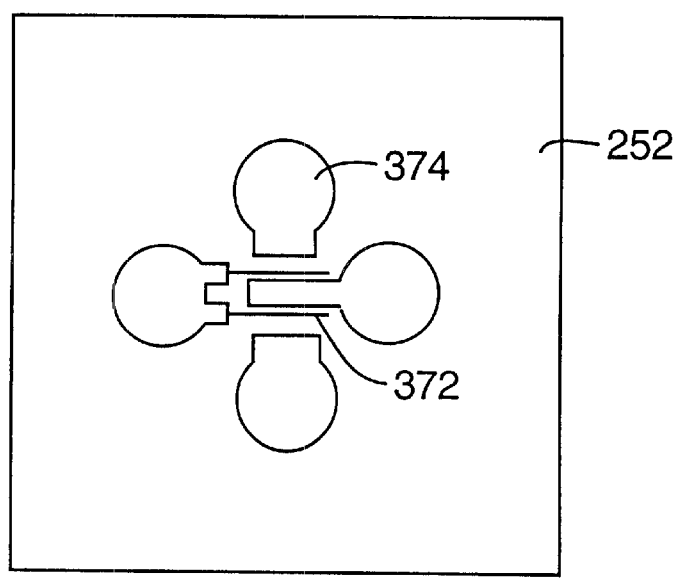
FIG. 23 is a top view of a typical die used with the present invention.

FIG. 23 shows a particular die 252 with which the present invention is currently used. Die 252 comprises a gate 372 and relatively flat bonding pads 374. Those skilled in the art will understand that other configurations may also be used with the pick-and-place assembly of the present invention. The particular shape of the bonding pads shown in this figure are not shown in the other figures for ease of illustration.

Figure 24:
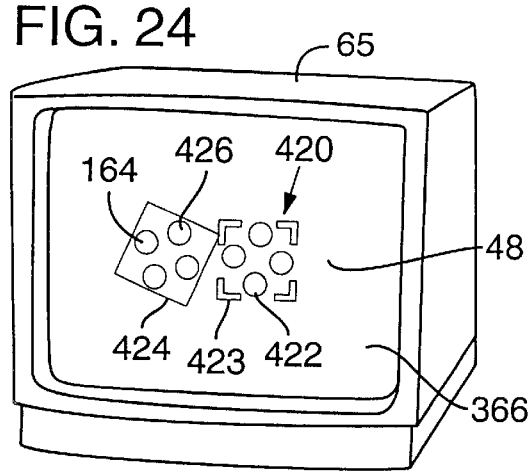
FIG. 24 is a perspective view of the substrate alignment monitor showing a bonding site on the substrate and a template image of the die of FIG. 19.

FIG. 24 shows the view from camera 36 (FIG. 2) on monitor 65 when reflection assembly 406 is in the stowed position and when a substrate is positioned below bondhead 34. In particular, monitor 65 shows a view of a portion of substrate 48 supported on heater block 46 including a bonding site 420 of the substrate. Bonding site 420 includes four raised projections 422 extending upwardly from the remainder of the substrate and which facilitate thermocompression bonding of die 252 to bonding site 420, as known in the art. Projections or bumps 422 (which may also comprise flat bond pads as known in the art) are shown spaced in a pattern similar to that of raised portions 164 of die 252 because the bonding site shown corresponds to die 252 as shown. Bonding site 420 also includes markings 423, sometimes called alignment chevrons, which have been placed on the substrate to aid in alignment of a die with the bonding site. In the preferred embodiment, raised projections 422 may comprise gold bumps, gold pads, or other materials adapted for bonding of the die thereto. As will be understood by those skilled in the art, raised projections may comprise any number or arrangement of projections or pads as is desired to bond a corresponding shaped die thereto. Raised projections 422 preferably are each approximately the same height so that the planarization of die 252 can be maintained as it is bonded to the substrate. Substrate 48 may be manufactured of Beryllium Oxide, Alumina, Aluminum Nitride, plastic or any other suitable material.

Still referring to FIG. 24, monitor 65 also shows a template image 424 of the die shown in FIG. 22. Template image 424 of die 252 is superimposed on the view of substrate 48. In particular, template image 424 is created from the view of die 252 held against the bonding tool so that template image 424 will have the same orientation on monitor 65 as does the die shown in FIG. 22. In the combined view of the substrate and the template image, shown in FIG. 24, bonding site 420 of substrate 48 is shown unaligned with template image 424. In other words, raised projections 422 of the bonding site are unaligned with regions 426 of template image 424 wherein regions 426 correspond to raised portions 164 of die 252. Accordingly, prior to the thermocompression bonding operation, substrate 48 is manipulated to align bonding site 420 with template image 424. Alignment of raised projections 422 of the bonding site with regions 426 of the template image should be to within several microns, and at least within 10 microns. By use of the substrate gripper mechanism, also called a substrate orienter or manipulator, described below, manual placement accuracy to within five microns is feasible and with automation, accuracy to within one micron is possible.

FIG. 25 shows a substrate gripping device 430 for gripping substrate 48 and moving the substrate over upper surface 380 of the heater block. Gripping device 430 comprises a base 432 pivotally mounted at a first end 434 to movable stages as will be described below. A first arm 438 extends outwardly from and is rigidly connected to a second end 439 of base 432. Arm 438 includes first and second substrate contact points 440, 441, and an indexing point 442. A second arm 443 is pivotally connected to base 432 at a pivot point 444 and is biased by a spring 445 so that arm 443 is moved toward first arm 438 at second end 439 of the base. Second arm 443 includes a third substrate contact point 446, typically aligned directly between contact points 440 and is 441, so that substrate 48 may be securely held by the gripper arms. Those skilled in the art will understand that arms 438 and 443 may comprise different shapes and sizes as desired for a particular application wherein the substrate may vary in size and shape from one application to another.

In a preferred embodiment, device 430 is connected to control device 44 (FIG. 2) so that after a die is bonded to the substrate, device 430 automatically moves the substrate in a coarse alignment step to align the next die bond site with respect to the bondhead. The substrate is then moved in a fine adjustment step by the computer controlled gripper device in response to operator input or an automated pattern recognition system stored within control device 44. The entire picking, alignment and bonding process of a die takes approximately one minute per die if human operator input is used. If fine adjustment of the substrate is computer controlled using a pattern recognition system, the picking, alignment and bonding process of the die may be completed in as little as ten seconds.

Still referring to FIG. 25, to secure substrate 48 within gripping device 430, second arm 443 is moved toward first arm 438 at spring 445. Compression of spring 445 results in the pivotal movement of second arm 443 about pivot axis 444 such that second arm 443 moves away from first arm 438 adjacent the substrate contact points. The substrate is then placed on stage 71 between the arms. Second arm 443 is then released so that spring 445 forces arm 443 toward first arm 438 thereby capturing the substrate therebetween. In a preferred orientation, the substrate contacts the arms at the first, second-and third contact points, and at the index point, which secures the substrate against movement within the gripping device. With the substrate secured therein, device 430 may be used to maneuver the substrate over surface 380 of the heater block. During movement of the substrate over the heater block, the vacuum system, which includes an aperture in the heater block that is aligned with the bondhead, is deactivated so as to allow free movement of the substrate. Once the substrate is moved into a desired position, the vacuum is reactivated to retain the substrate in place on the heater block.

FIG. 26 shows a side view of the components of gripping device 430 used to move base 432 with respect to stage 71 (FIG. 3) in the x, y and rotational directions. In particular, base 432 is connected to a motor 447 by a threaded screw 448 (shown in end view). The motor actuates threaded screw 448 to move base 432 along a stage 449 in x-directions 112. Stage 449 is moved along a stage 450 in y-directions 114 by a threaded screw 451 powered by a motor 452. Stage 450 is moved with respect to stage 71 in a rotation direction about a pivot axis 453 by a threaded screw 454 powered by a motor 455. The stages are positioned such that a substrate held within gripper 430 is centered over pivot axis 453. Motors 447 and 452 preferably are controlled so as to initially position a bonding site on a substrate along threaded screws 448 and 451, respectively, so that the bonding site is directly aligned with a pivot axis of the device. Accordingly, rotational movement of a die about the rotational axis will not result in misalignment or offset of the die in the x or the y directions. Threaded screws 448 and 451 typically comprise a slide with ball bearings but any appropriate mechanical device may be used. In an embodiment where the axis of rotation of the substrate is not aligned with the predetermined bonding site, a mathematical formula typically is used, in conjunction with a controller, to automatically move the substrate through the offset distance to align the bonding site on the substrate with the predetermined bonding site, after rotation of the substrate.

Figure 27:
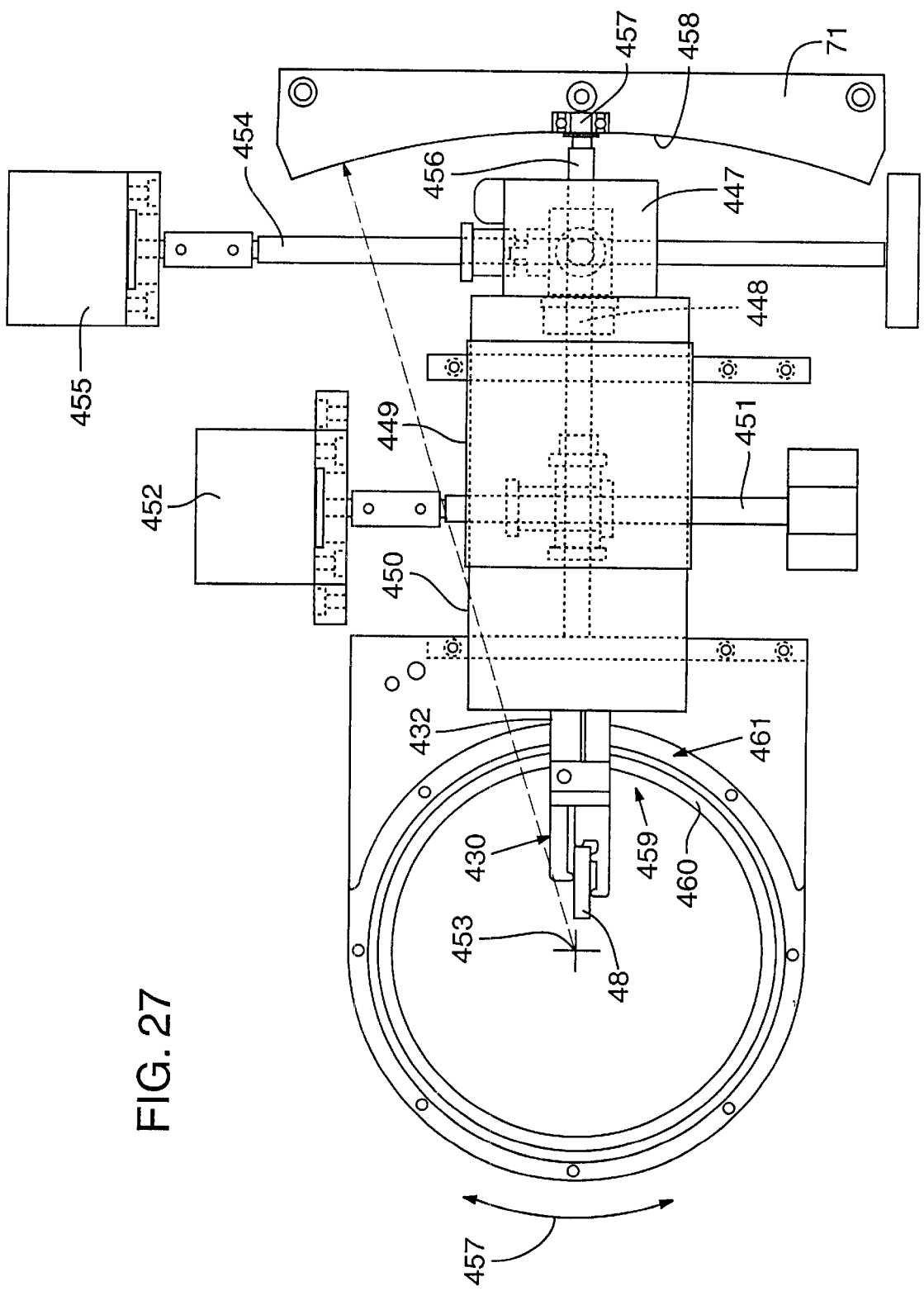
FIG. 27 is a top view of the internal components of the substrate alignment stage.

FIG. 27 shows a top view of the components of gripping device 430 used to move the base with respect to stage 71. In particular, threaded-screw 454 is connected to an elongate rod 456 which supports stage 450. Rod 456 extends from gripper mechanism base 432 to a roller mechanism 457 supported on an arcuate surface 458 of stage 71. Rod 456 is supported on ball bearings 459 held within a race 460 of a rotational axis bearing 461. Race 460 and arcuate surface 458 are radially centered on a pivot axis 453. Accordingly, when a substrate is held within the gripper mechanism and is centered on pivot axis 453, actuation of motor 455 will cause threaded screw 454 to force stage 450 to move along threaded screw 454. Movement of stage 450 will cause elongate rod 456 to rotate, as guided by ball bearings 459 in race 460 and roller mechanism 457 along arcuate surface 458. In a preferred embodiment, pivot axis 453 is aligned with the vacuum aperture in the middle of the heater block and with an elongate axis of the bondhead. Accordingly, no offset compensation of the substrate is needed in the x or the y directions after the substrate and the gripper mechanism have been rotated by motor 455. Race 460 typically has a radius of approximately two inches centered on pivot axis 453, and arcuate surface 458 typically has a radius of approximately ten inches, also centered on axis 453.

Figure 28:
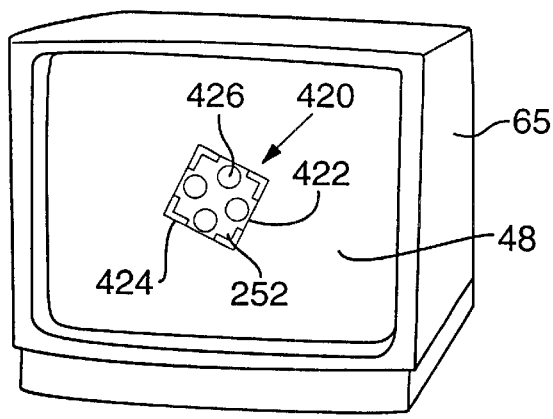
FIG. 28 is a perspective view of the substrate alignment monitor showing a bonding site on the substrate that is aligned with the template image of the die held against the bondhead.

FIG. 28 shows monitor 65 wherein template image 424 of die 252 is superimposed on the view of substrate 48. In particular, in this combined view of the substrate and the template image, bonding site 420 of substrate 48 is shown aligned with template image 424 because raised projections 422 of the bonding site are aligned with regions 426 of template image 424 which correspond to the raised portions of die 252. Accordingly, base 432 of substrate gripping device 430 has been manipulated such that the substrate held within the gripping device has been moved to align bonding site 420 of the substrate with template image 424.

Figure 29:
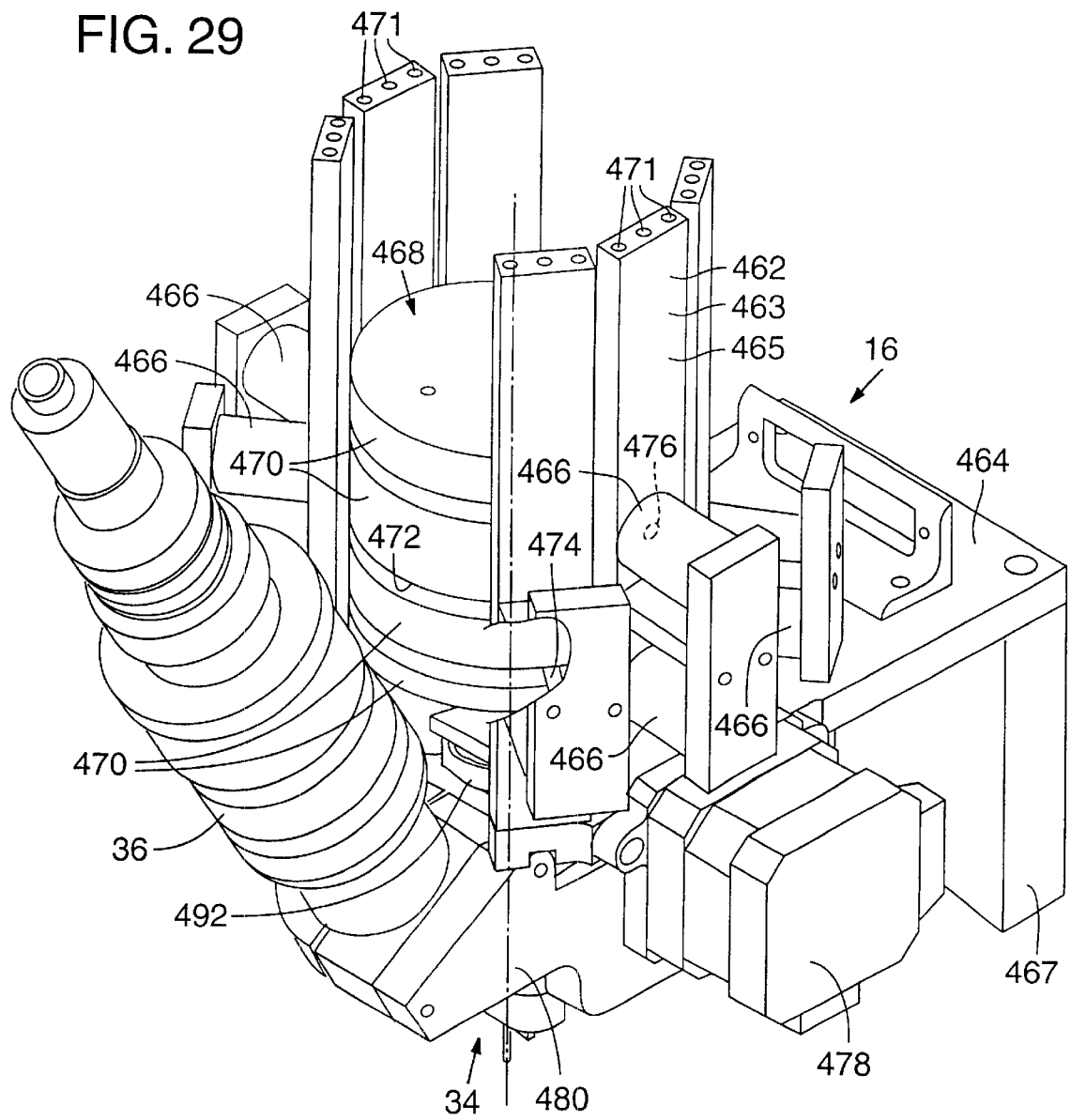
FIG. 29 is a detailed perspective view of the upper portion of the bondhead assembly.

FIG. 29 shows the upper components of bondhead assembly 16. Upper portion 462 of the bondhead assembly includes a weight support assembly 463 secured to a base 464 having a leg 467 that extends downwardly and is secured to stage 71, behind lower support structure 310, as shown in FIG. 17. Upper portion 462 of the bondhead assembly is not secured to or in contact with lower support structure 310 so that movement of several bondhead weights, to be further described, will not interfere with or move out of alignment bondhead 34 or flexible members 326 and 340 (FIG. 17). Weight support assembly 463 includes a plurality of upwardly extending members 465 adapted to support pistons 466 thereon and to secure therebetween a weight stack 468 including several individual weights 470. In the preferred embodiment, assembly 463 includes six members 465, each secured to base 464 by three bolts that extend through three aligned apertures 471. Accordingly, six upwardly extending members 465 surround weight stack 468. A cap (not shown) may be secured to the top of the six members 465 to stabilize the device. In the preferred embodiment, weights 470 are manufactured of steel. In other embodiments, different numbers of weights, different sizes and shapes of weights, and different materials of the weights may be utilized as desired for particular applications.

Each of weights 470 include a circular cross section and a recess 472 along its lower edge. Each of pistons 466 includes a rod 474 which may be activated to extend through an aperture 476 in members 465 so that when a recess of a weight is aligned with the aperture, the rod will function to maintain the particular weight between members 465 at a predetermined height in line with the corresponding piston. In this secured position, the individual weight is prevented from moving downwardly toward stage 71. In a preferred embodiment, a set of three pistons are equally spaced around weight stack 468 on three members 465, wherein a set of three pistons is aligned with each particular weight 470. Each of the sets of three pistons are staggered around the circumference of the weights so that the pistons of directly adjacent weights are not positioned directly above and do not interfere with each other. When a piston set is activated to hold the lowermost weight, the entire weight stack will be held within members 465. When a piston set is aligned with each weight and when only the lowermost piston set is retracted, only the lowermost weight will be allowed to move downwardly within members 465. In this manner, the desired amount of weight can be placed onto bondhead 34 as required for the particular thermocompression bonding operation being conducted. Of course other attachment operations not requiring the use of weights may also be conducted with use of the device of the present invention, including soldering and solid diffusion bonding, to attach a die to a substrate.

Still referring to FIG. 29, a motor 478 is secured to weight support assembly 463 for actuating movement of the bondhead 34. Motor 478 and pistons 466 are each connected to computer 55 (FIG. 2) for automated movement of the weights and the bondhead. Weight support assembly 463 further comprises a forward region 480 adapted for supporting camera 36 thereon.

Figure 30:
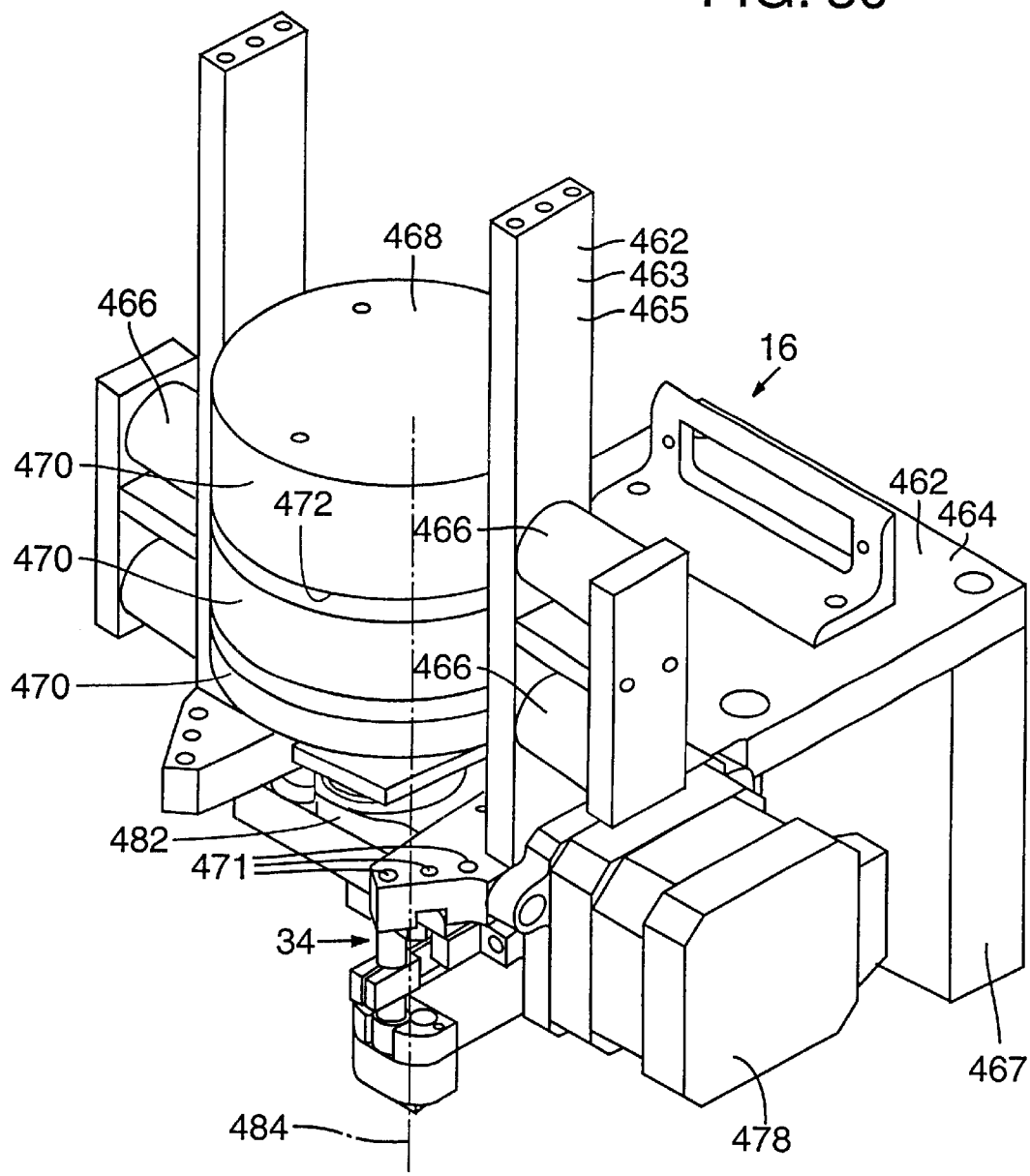
FIG. 30 is a detailed perspective view of the upper portion of the bondhead assembly of FIG. 25 with the camera and several weight supports removed and with the weights in a lowered orientation.

FIG. 30 shows weight support assembly 463 with several of upwardly extending members 465 removed and with forward region 480 (FIG. 29) removed to expose a bondhead lifter mechanism 482. In this figure the entire weight stack is shown lowered into a bonding orientation, so that each of pistons 466 have been temporarily retracted. Lifter mechanism 482 is attached to bondhead 34 such that the weight stack, the lift mechanism and the bondhead are each aligned along a bondhead elongate axis 484. The lifter mechanism preferably is manufactured of steel and will be described in more detail below.

FIG. 31 shows bondhead lifter mechanism 482 including a motor coupling 485 for attachment to motor 478, and a lifter nut 486 secured about a threaded lifter screw 488 and positioned within a recess 490 of a lifter plate 492. Device 488 may also comprise a bolt or any means that may be rotationally coupled to the lifter nut. Lifter nut 486 is shaped to conform to the inner shape of recess 490 so that the nut can move upwardly and downwardly within the recess along a z-axis 493 but cannot rotate within the recess about axis 493.

A gear 494 is operably connected to lifter screw 488 and is engaged by coupling 485 so that rotation of the coupling about its elongate axis 496 will rotate lifter device 488 along axis 493 so as to raise or lower the lifter nut, which in turn will raise or lower the bonding weight. The "bonding weight" is the portion of the entire weight stack that is released by the pistons and lowered for a particular bonding operation. For example, for bonding of a relatively small die to a substrate, only the lowermost weight of the weight stack (FIG. 30) may be needed for bonding. Accordingly, pistons 466 (FIG. 30) are operated to release only the lowermost weight of the weight stack. This lowermost weight is referred to as the bonding weight. In another example, wherein more weight may be needed to bond a relatively larger die to a substrate, the three lowermost weights may be needed for bonding. In this example, the three lowermost weights are lowered and are referred to as the bonding weight, whereas the remaining upper weights are retained within weight support assembly 463, without being lowered.

In another embodiment, a linear motor may be used in conjunction with a distance measuring device, and without the use of the bonding weight, to precisely compress the raised portions on the die to the corresponding bonding pads on the to substrate. In the linear motor embodiment, an actuator, such as motor 478 grasps the bondhead, an optical device such as camera 36 measures the height of the die above the substrate bonding site, and then a controller such as computer 66 lowers the bond tool a predetemined amount so that the die is thermocompression bonded to the substrate. In still another embodiment, a linear motor is connected to an encoder so that the linear motor produces a force of the desired magnitude to bond the die to the substrate. In a preferred bonding operation, the bonding weight or the movement of the linear motor will be chosen to facilitate a compression, or displacement, of the raised portions on the die a sufficient amount to bond the die to the substrate but less than an amount that may damage the die or the substrate, or which may result in the so die being compressed such that it is moved out of planar alignment with the substrate. This compression distance will be different for each particular die and substrate and the height of the bumps or pads on the die and the substrate.

Linear motor 478 may comprise a coil wrapped around a magnet, wherein the linear motor adds voltage such that the current produced is proportional to the linear movement of flexure of a flexible surface, much like a audio speaker cone, to control movement of the bondhead. In this embodiment the motor provides the downward force on the bondhead so that a bonding weight is not needed to effect a thermocompression bond between the die and the substrate. The bondhead may also be moved by solenoids, or a bellows or pneumatic piston, and may be computer controlled by software. The bondhead typically is moved relatively quickly toward the substrate whereupon its rate is reduced to a much slower value, just prior to bonding of a die to the substrate. Accordingly, efficient yet controlled movement of the bondhead is accomplished.

Still referring to FIG. 31, to lower the bonding weight portion of weight stack 468 (FIG. 30), motor 478 actuates coupling 485 which in turn actuates gear 494 torotate thereby rotating lifter screw 488 in a direction 498. Rotation of lifter screw 488 in direction 498 lowers lifter nut 486 which in turn allows the bonding weight, i.e., the selected portion of weight stack 468, to be lowered toward stage 71. The lifter nut is coupled to bondhead 34 such that as the bonding weight is lowered, the bonding weight rests upon and applies a force to the bondhead so that the bondhead is lowered by the weight of the bonding weight. When the bondhead is lowered into a predetermined position adjacent substrate 48, die 252, which has been aligned with bonding site 420 (FIG. 28) on the substrate, will be subject to thermocompression bonding against the substrate by the bondhead. The heat transmitted to the substrate from heater block 46 and the weight of the bonding weight together act to form a thermocompression bond such that raised portions 164 of the die are bonded to raised projections 422 of the substrate.

After a sufficient time has elapsed for bonding of the die to the substrate, motor 478 actuates coupling 485 which in turn actuates gear 494 so as to rotate lifter screw 488 in a direction 500 opposite that of direction 498. Rotation of lifter screw 488 in direction 500 raises the bond head which in turn raises the bonding weight away from stage 71. Once the bonding weight is raised into its nominal resting position, pistons 466 are activated to extend through apertures 476 (FIG. 29) to secure the weights in place. Motor 478 may then release control of gear 494. After bonding of the die to the substrate, and prior to lifting of the bondhead, vacuum pressure within the bondhead is released.

FIG. 32 shows a front view of the bond head/weight stack connection. Guide pins 499 secure lifter nut 486 within recess 490. A thrust bearing 501, having top and bottom races 502 and 503, is positioned within annular recess 495 of the lifter nut, and encircles the lifter screw 488. A weight rest 504 includes an annular recess 505 on its lower surface which seats on top race 502 of thrust bearing 501. Weight rest 504 is secured to the uppermost portion of bond head 34 by set screws 506, wherein the bond head extends upwardly through lifter screw 488. In another embodiment, weight rest 504 is press fit to the bond head.

Figure 34:
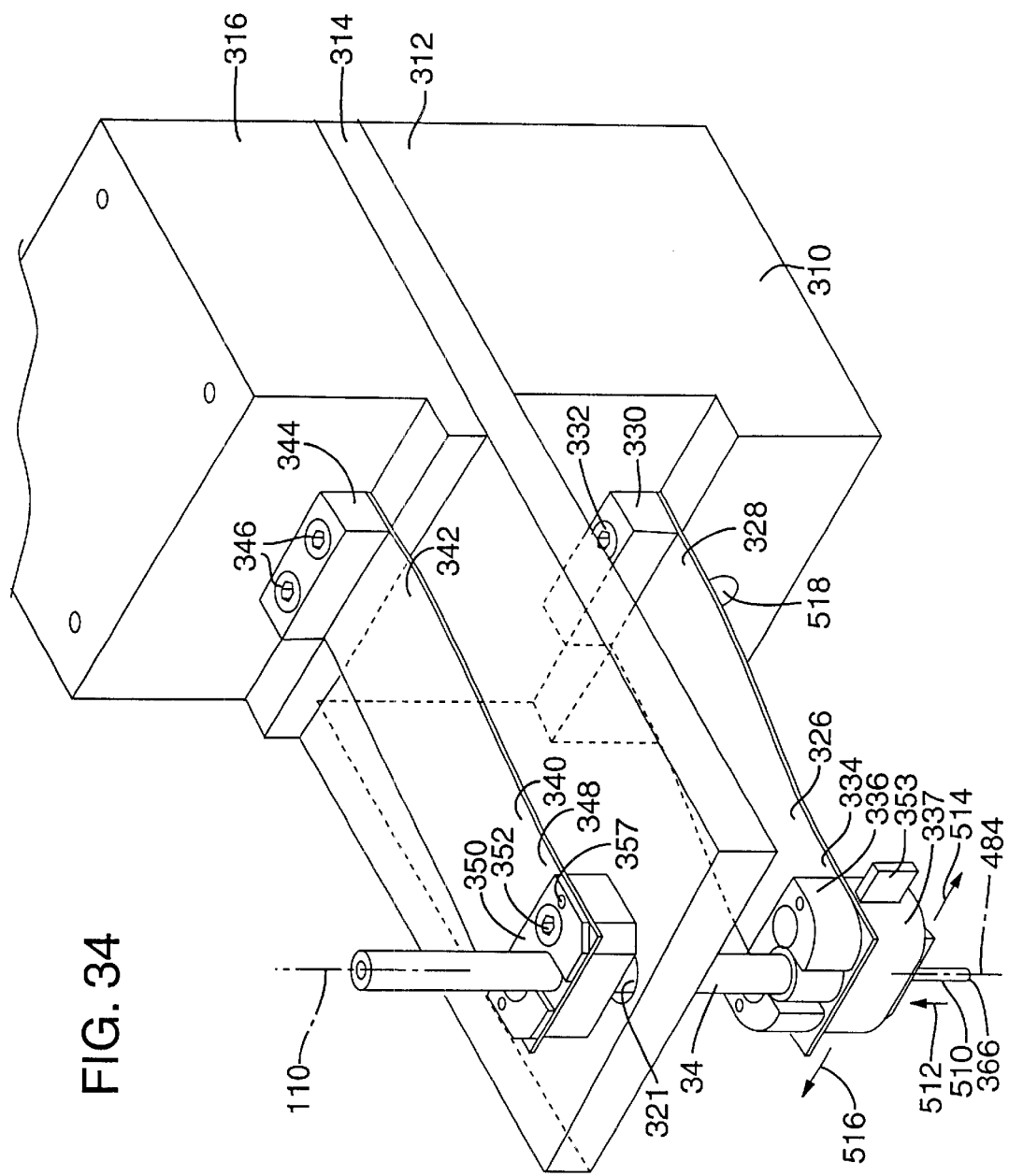
FIG. 34 is a detailed perspective view of the flexure members of the bondhead assembly.

FIG. 33 shows a top view of the bond head/weight stack connection. Weight rest 504 has three outwardly extending arms 507 that each include a ball bearing 508 at their outer edge. The ball bearings are each aligned with a corresponding indentation on the underside of the lowermost weight of the weight stack such that the lowermost weight is indexed to the weight rest. Similarly, each of the weights in the weight stack include three indentations on their upper and lower surfaces such that three ball bearings positioned between each of the weights act to index side by side weights along the height of the entire weight stack. A vacuum tube 509 is secured to, and extends through, weight rest 504 so that the vacuum aperture on the lower bonding surface of the bond tool is connected to a vacuum system through the central aperture of the bond head and through tube 509. FIG. 34 shows first and second flexible members 326 and 340 in a raised position wherein lifter mechanism 482 (FIG. 31) has raised bondhead 34, and a bond tool 510 attached thereto, upwardly in a direction 512 along bondhead elongate axis 484. In the preferred embodiment, bondhead 34 is manufactured of stainless steel tubing and bond tool 510 is manufactured of tungsten carbide, due to its durability. In the embodiment shown in this figure, the second ends of the flexible members are secured to bondhead 34 with plates that are slightly different in shape from those shown in FIG. 17. Those skilled in the art will understand that any suitable attachment device may be used.

In this raised position, first ends 328 and 342 of the flexible members remain stationarily secured to lower support structure 310 whereas second ends 334 and 348 of the flexible members have been moved upwardly in direction 512. In this raised position, bond tool 510 is raised above stage 71 a sufficient distance so that the transfer arm, the reflection assembly or the substrate gripper mechanism may be moved between the bondhead and stage 71. Flexible members 326 and 340 preferably are manufactured of a resilient material such as spring steel so that the members retain bondhead 34 in an orientation parallel to z-axis 110. Accordingly, flexible members 326 and 340 function to limit lateral movement of bondhead 34, with bond tool 510 secured. thereto, in either of directions 514 or 516 to ensure correct placement of the bond tool against the substrate bonding site when the bondhead is lowered. Moreover, the flexible members limit lateral movement without the use of bearings or other moving or frictional parts thereby eliminating hysteresis and other frictional effects. In other words, the dual leaf springs have no bearings to maintain or wear out, facilitate one-dimensional upward or downward movement (with the exception of the slight backward offset distance), and are essentially hysteresis and friction free.

In a preferred embodiment, the bondhead will move "forwardly" away from first ends 328 and 342 of the leaf springs a distance of approximately 7.0 mils due to straightening of the slight flexure, or bending, of the leaf spring as the bondhead is moved downwardly a distance sufficient to bond a die to a substrate.

This offset is initially calibrated into the system's parameters and is taken into account during the alignment of the substrate and the die. In other words, when the bondhead is in a raised position and the position of a die held against the bondhead is measured by use of camera 36, the offset distance is added to the measured distance to determine the location of the die in its bonding position when the bondhead is lowered. In a preferred embodiment, the substrate is first aligned with the template image of the die in its raised position on the bondhead. The substrate is then moved an amount equal to the offset distance as the bondhead and the die are lowered into the bonding position. In this manner, the substrate will be correctly positioned for bonding of the die when the die and the bond head are lowered, during which time the flexure members move the bond head forwardly, i.e., away from lower support structure 310, through a distance equal to the offset distance. In another embodiment, the template image of the die may be electronically shifted by an amount equal to the offset distance so that the substrate is aligned with the shifted image and need not be moved as the bondhead is lowered.

Still referring to FIG. 34, lower support structure 310 further includes an illumination port 518 which houses an illumination device. The illumination device may be activated during orientation of the substrate or bonding of the die to the substrate such that camera 36 can accurately view the bonding site.

Figure 35:
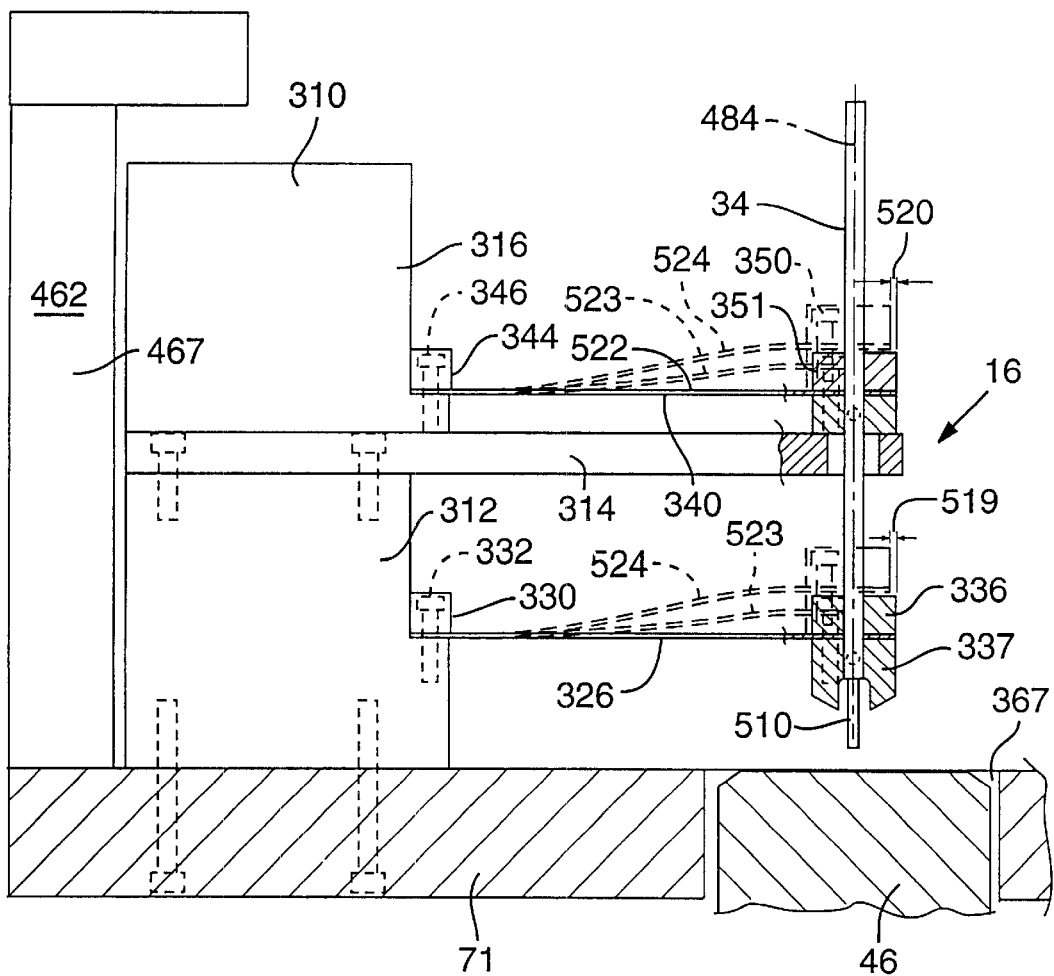
FIG. 35 is a side view of the flexure members of the bondhead assembly.

FIG. 35 shows a side view of the bondhead assembly showing the connection of lower support structure 310 and upper support structure 462 to stage 71. The figure also shows flexible members 326 and 340 in a straight, relaxed orientation 522 (indicated by solid lines) wherein the bondhead is in the bonding position. In this bonding orientation the bonding surface of the bondhead is horizontally aligned with the predetermined bonding positioned and is positioned so as to compress the die against the substrate to form a thermocompression bond. The figure also shows the flexible members in a slightly raised frame grab position 523 (dash lines) wherein the bondhead is slightly raised and the flexible members are bent slightly upwardly in an "S" shape. In this slightly raised orientation the bondhead is offset slightly rearwardly a distance 519 of approximately 7 mils from the position of the bondhead when the flexible members are straight. In this frame grab position reflection assembly may be positioned underneath the bondhead to generate a template image of a die held against the bonding surface. The offset distance is shown as exaggereated for illustrative purposes but would likely not be detectable by the human eye. The members are also shown, in dashed lines, in an upper "home" position 524 wherein the members are bent into an "S" shape which is more pronounced than the shape of the members in frame grab position 523. In this raised orientation, bondhead 34 is offset slightly rearwardly a distance 520 of approximately 10 mils. In this raised position the bondhead may be inspected or the substrate may be moved over the heater block. In each of the positions shown, bondhead axis 484 of the bondhead is aligned with the z-axis, or another axis as is desired, so that the bonding surface of the bondhead is parallel to the heater block in each orientation.

Figure 36:
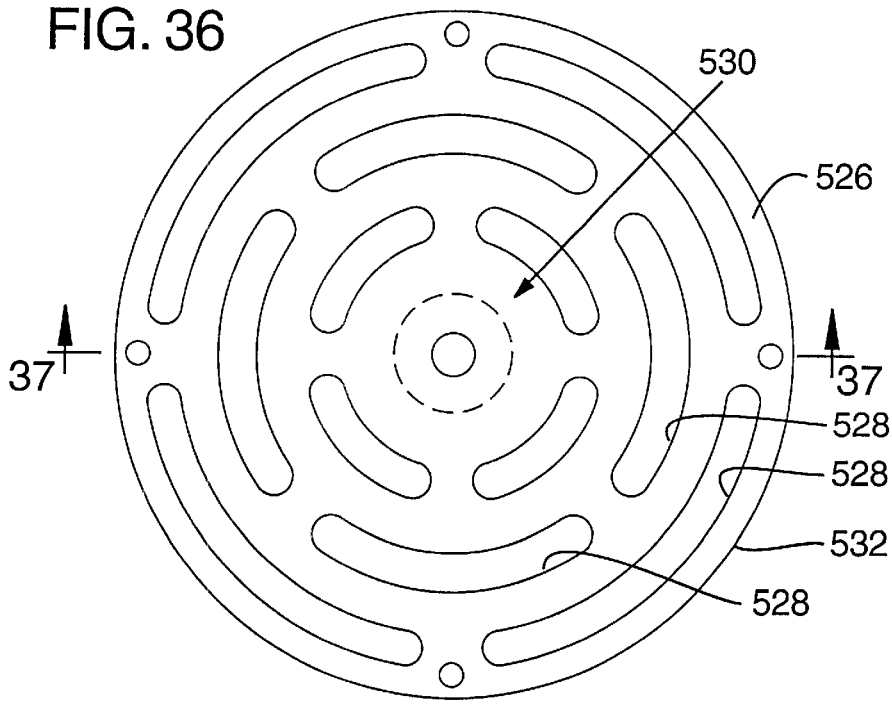
FIG. 36 is a top view of another embodiment of the flexure members.

FIG. 36 shows another embodiment of the flexible members wherein the members comprise an annular member 526 having multiple apertures 528 spaced throughout the member. The apertures allow a central region 530 of the member to be raised or lowered with respect to an edge region 532 of the member.

Figure 37:
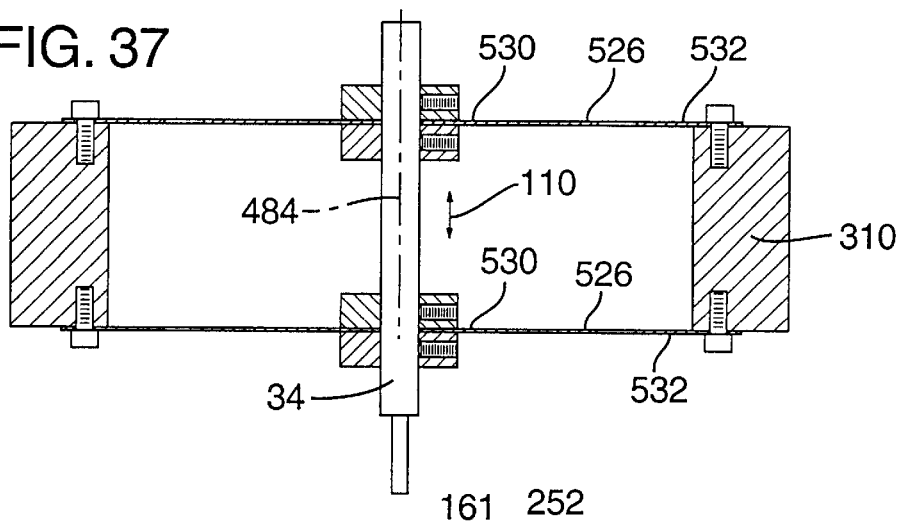
FIG. 37 is a side view of the flexure members of FIG. 36 installed in a bondhead assembly.

FIG. 37 shows a side view of the flexible members of FIG. 36 secured within the bondhead assembly. The members are secured to lower support structure 310 at edge regions 532 and are secured to bondhead 34 at central regions 530.

Accordingly, as the bondhead is raised or lowered, the flexible members will permit such raising or lowering, within predetermined limits, and will maintain bondhead axis 484 parallel to z-axis 110. In this embodiment, the raised and lowered positions of the bondhead are both along the same axis 484 such that these annular flexible members do not create an offset distance as do the flexible members of FIG. 34.

Figure 38:
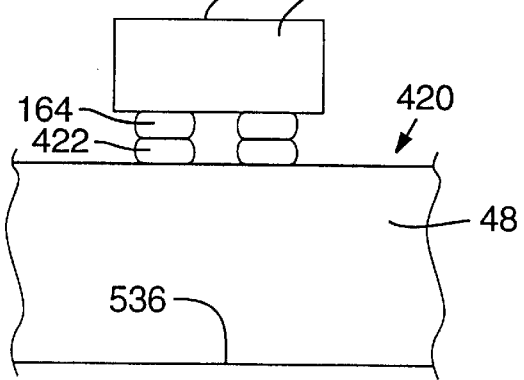
FIG. 38 is a side view of a die bonded to a substrate.

FIG. 38 shows die 252 bonded to bonding site 420 of substrate 48 wherein raised portions 164 of the die have been bonded to raised projections 422 of the substrate. Due to the precise alignment permitted by the apparatus of the current invention, including alignment along a vertical axis and co-planarity of the die and the substrate, raised portions 164 are aligned with bonding pads 422 and bottom surface 161 of the die (which is positioned opposite from the substrate) is aligned parallel to a bottom surface 536 of the substrate. Accordingly, die 252 is correctly bonded to the substrate and will function as desired. In a preferred embodiment, raised projections 422 of the substrate are gold bumps having a diameter of approximately 25 to 50 microns and a height of approximately 25 microns in an unbonded state. The bumps typically are compressed to a height of approximately 18 microns when a die is bonded thereto. In so a preferred embodiment, portions 164 of the die comprise flat gold pads that do not extend upwardly from the remainder of the die. The flat pads facilitate use of vacuum pressure to hold either side of the die against a support surface because both sides of the die are essentially flat. In other words, "raised portions" 164 are shown projecting from the remainder of the die for ease of illustration but in the preferred embodiment, these portions are essentially level with the remainder of the die. As shown in the figure, the raised portions and projections are compressed into a barrel shape during the thermocompression bonding step. As stated earlier, in a preferred embodiment, only the substrate or the die has bumps extending therefrom whereas the other device has essentially flat pads. Use of bumps on one device and pads on the other facilitates bonding of the die to the substrate without the die moving out of planar alignment with the substrate during the bonding process.

Figure 39:
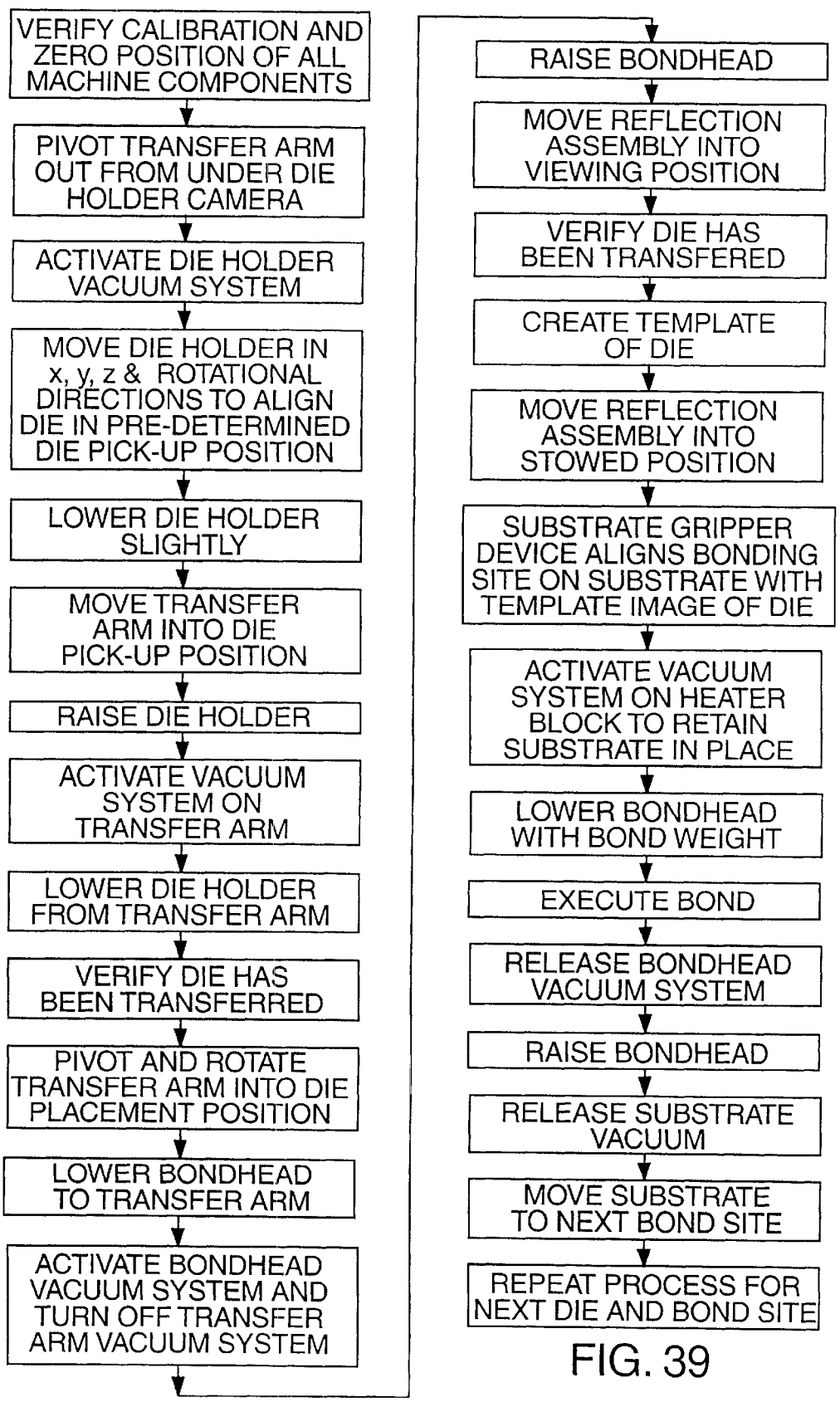
FIG. 39 is a flow diagram of a method of the present invention.

FIG. 39 shows a checklist type diagram of the method of the present invention. The system is first calibrated so that all elements of the system are clean and positioned in their home or zero position. Dice 26 are placed on eight different die holders 76 (FIG. 3) which are then positioned in recesses 74 of carrier device 56. The dice are inventoried by the use of reader device 57 and indicia 90 on underside 88 of each of the die holders. Transfer arm 30 is moved to a start position, also called the half-rotated position, so that the transfer arm extends forwardly toward an operator. A particular die holder 100 is rotated by carrier 56 into a pickup position adjacent die pickup stage 104. The vacuum system on the die pickup stage is activated to hold the holder on support 118. Pickup stage 104 then lifts the holder upwardly out of recess 74 and to the focal plane of camera 50. A pattern recognition system, or an operator using the view shown on monitor 52, together with control device 22, moves die 252 held on holder 100 into predetermined die pickup position 28. The holder typically is moved in the x, y and rotational directions to align die 252 into position 28. Holder 100 is then lowered an amount sufficient to allow transfer arm 30 to be rotated into the pickup position under camera 50. In the pickup position, vacuum aperture 276 (FIG. 12) of the transfer arm will be aligned with, and in fact defines, pickup position 28. Holder 100 is then raised and the vacuum system on the transfer arm activated to transfer the die from holder 100 to die support surface 240 of the transfer arm. The die holder is then lowered out of the way. The transfer arm is then moved to the half-rotated position and camera 50 verifies that the die has been removed from the holder.

Due to the die pickup stage alignment process, the die is precisely transferred to support surface 240 in a position to cover vacuum aperture 276 so that the die is held against the transfer arm by the vacuum system.

Once the system or an operator verifies that a die has been picked by the transfer arm, the transfer arm is moved so that the die is aligned in placement position 32 (FIG. 3). In particular, the transfer arm is pivoted one hundred and eighty degrees, and is rotated about its elongate axis one hundred and eighty degrees, as the arm is moved from the pickup to the placement position. The bondhead is then lowered toward the transfer arm. When the bondhead is positioned directly adjacent the transfer arm, the vacuum on the bondhead is activated and the vacuum on the transfer arm is released thereby facilitating transfer of the die from the transfer arm to lower surface 366 (FIG. 28) of the bondhead. Bondhead 34 is then raised, the transfer arm is moved out from under the bondhead, and reflection assembly 406 is moved into position below the bondhead. The bondhead is raised to a position aligned with the focal plane of camera 36 when the reflection assembly is in place. In this manner, camera 36 views bonding surface 366 of the bondhead, with die 252 held thereagainst. A template image is created of die 252 on surface 366. The reflection assembly is then moved out from under the bondhead and substrate holding device 42, also called a gripper assembly, moves a bond site on substrate 48 into a coarse alignment with predetermined placement position 32. Camera 36 views the bond site and overlays on it the template image of the die held against the bondhead. A pattern recognition system, or an operator using the view shown on monitor 36, together with holding device 42, moves bond site 420 on substrate 48 into alignment with predetermined die placement position 32 (FIG. 3). The gripper mechanism typically moves the substrate across heater block 46 in the x, y and rotational directions to align the bonding site with position 32. Once the substrate is in place, the vacuum system of the heater block is activated to hold the substrate in place.

Once the bond site on the substrate is aligned in position, bondhead 34 is lowered, along with the bond weight portion of weight stack 468, to a position so that flexible members 326 and 340 are in a straight, unbent orientation. Prior to lowering of the bondhead, the substrate is moved to compensate for the slight offset distance resulting from lowering of the bondhead from a position where the flexible members are slightly bent to a position where the flexible members are straight. As stated above, the slight offset distance may be accounted for in a variety of ways other than by moving of the substrate. In this position, when the bondhead is lowered, the die is in contact with the substrate. The weight of the bonding weight on the die and the heat produced by the heater block results in a thermocompression bond between the die and the substrate. The vacuum system on the bondhead is then released and the bondhead raised. The vacuum on the heater block is released and the substrate is moved to align the next bond site with the pre-determined bonding position. The process is then repeated to pick a second die from a holder 100 and bond it to a second bond site on the substrate. This process is carried out until the substrate has all required die bonded thereto.

Figure 40:
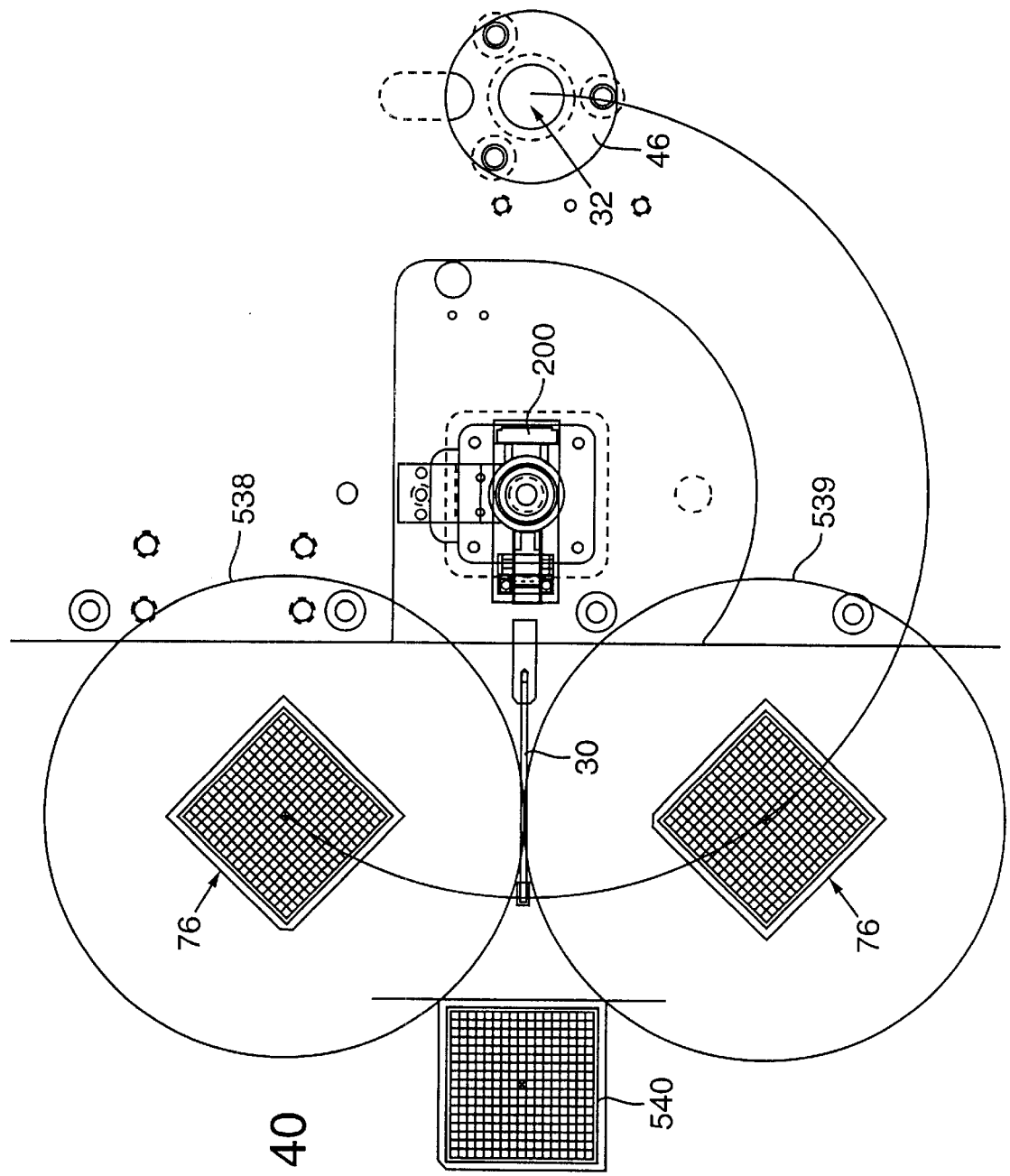
FIG. 40 is a plan view of another embodiment of the carrier device including two die holder orientation stations.

FIG. 40 shows another embodiment wherein transfer arm 30 may access dice supported on either of two die holders 76 supported on die supports 538 and 539. A stack loader 540 supplies the die holders to and from supports 538 and 539 as desired. In this embodiment, the transfer arm will move a die picked from support 538 through an arc of approximately 150 degrees in a clockwise direction to predetermined placement position 32, and will move a die picked from support 539 through an arc of approximately 150 degrees in a counterclockwise direction to predetermined placement position 32. Die holder 540 may comprise a stack loader with one or more orientations, one or more wafer frames, multiple rotating carriers, or any other similar device for supplying a die or a die holder as needed. The die holder held within holder 540 may comprise a GEL PAK (a trademark owned by GEL-PAK Corporation), a waffle pack, a tape frame, a wafer array or any other die holder. These die holders can be indexed, manipulated and delivered to or retrieved from stages 76 by a stack loader or vertical or horizontal conveyors of any of several designs. The die holder may also comprise multiple die holder devices that cooperate with one another.

Figure 41:
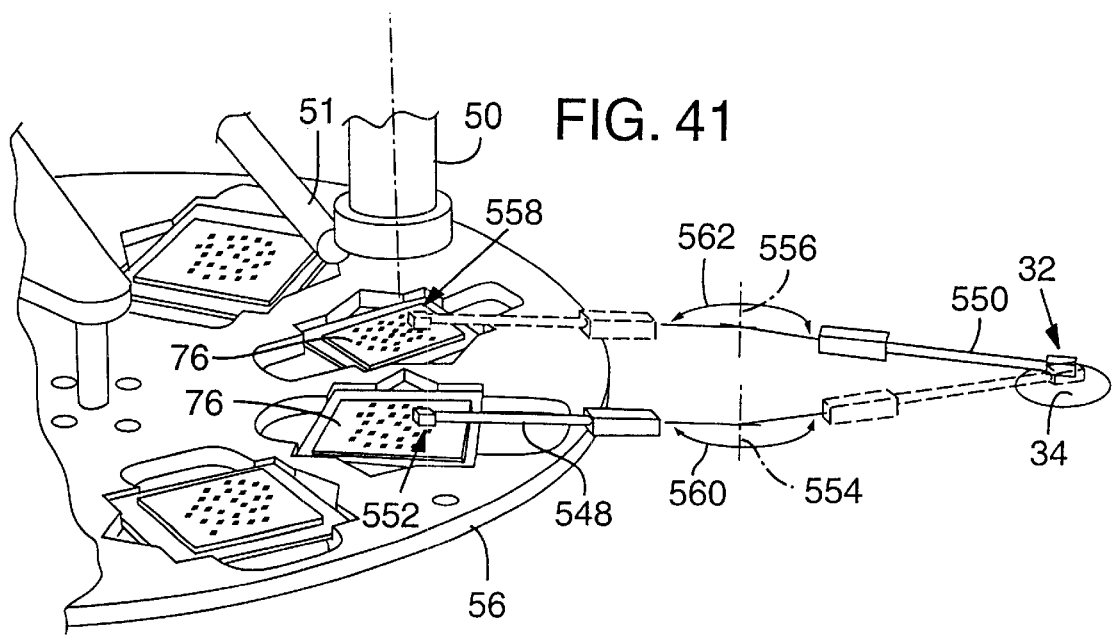
FIG. 41 is a perspective view of another embodiment of the transfer assembly including two transfer arms.

FIG. 41 shows a plan view of another embodiment of the transfer assembly including two transfer arms 548 and 550. Carrier device 56 includes two die holders 76 positioned thereon. First transfer arm 548 is shown positioned to pick a die from a predetermined pickup position 552 on carrier 56 and second transfer arm 550 is shown positioned to place a die in predetermined placement position 32 of bond head 34. A pivot axis 554 of first transfer arm 548 is positioned such that the first arm may also place a die in predetermined placement position 32 of the bond head, as shown in dash lines. A pivot axis 556 of second transfer arm 550 is positioned such that the second arm may also pick a die from a predetermined pickup position 558 of carrier 56, as shown in dash lines. Preferably, a camera 50 is aligned with each pickup position. During movement from the pickup position to the placement position, each of arms 548 and 550 pivot through an arc 560 and 562, respectively, of approximately two hundred degrees. Accordingly, the embodiment shown in FIG. 41 allows two transfer arms to sequentially deliver dice to a single bondhead 34 thereby reducing the non-active time, by approximately fifty percent, of the bondhead during sequential bonds. This embodiment may be utilized when the pickup operation is slow compared to the bonding operation.

Figure 42:
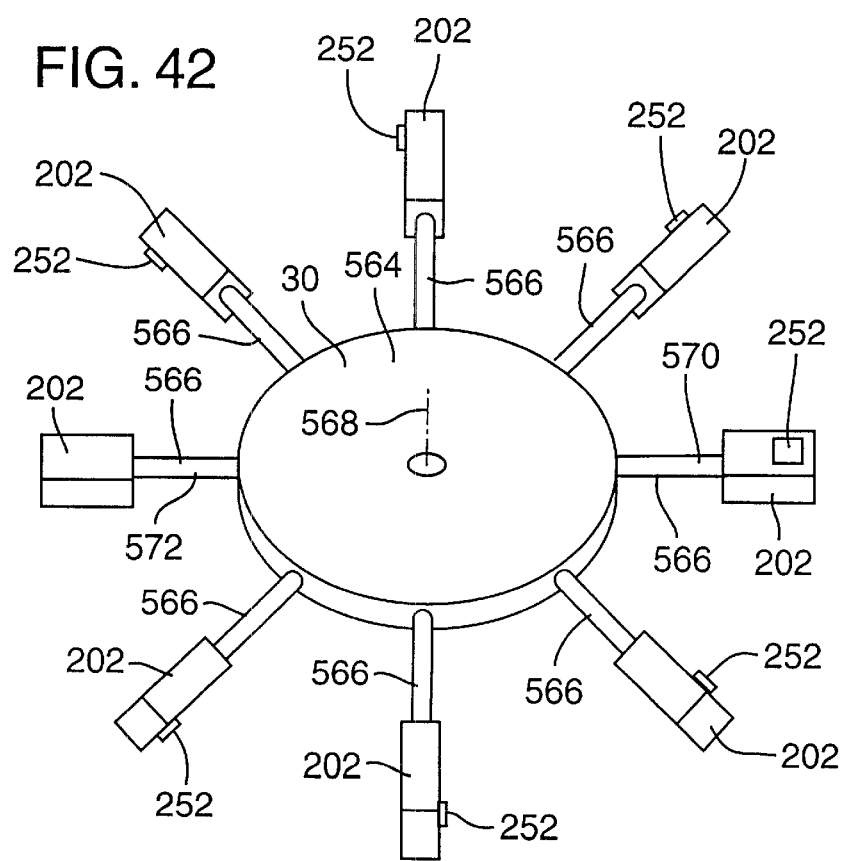
FIG. 42 is a perspective view of another embodiment of the transfer assembly including a transfer wheel having multiple transfer arms.

FIG. 42 shows a perspective view of another embodiment of the transfer assembly including a transfer wheel having multiple transfer arms. Transfer assembly 30 includes a central hub 564 including multiple transfer arms 566 extending outwardly therefrom wherein each transfer arm includes a head portion 202 for holding a die thereagainst. Central hub 564 typically includes a stationary central bevel gear and each of arms 566 includes a movable bevel gear that mates with the central bevel gear. As the central hub is rotated, each of arms 566 pivot about a pivot axis 568 and each of the arms also rotate about their elongate axis, due to the mating engagement of the mating bevel gears. According, the eight arms 566 are shown in various stages of rotation and pivot about the central hub. In particular, a rightmost arm 570 is shown in a die pickup position wherein a die 252 is held against the transfer arm and extends upwardly for pickup by a bondhead. A leftmost arm 572 is shown in a die placement position wherein a die 252 is held against the transfer arm and extends downwardly where the die has recently been picked from a die holder. Other numbers and arrangements of the arms may also be utilized. This embodiment may be utilized when the pickup operation is slow compared to the bonding operation.

Figure 43:
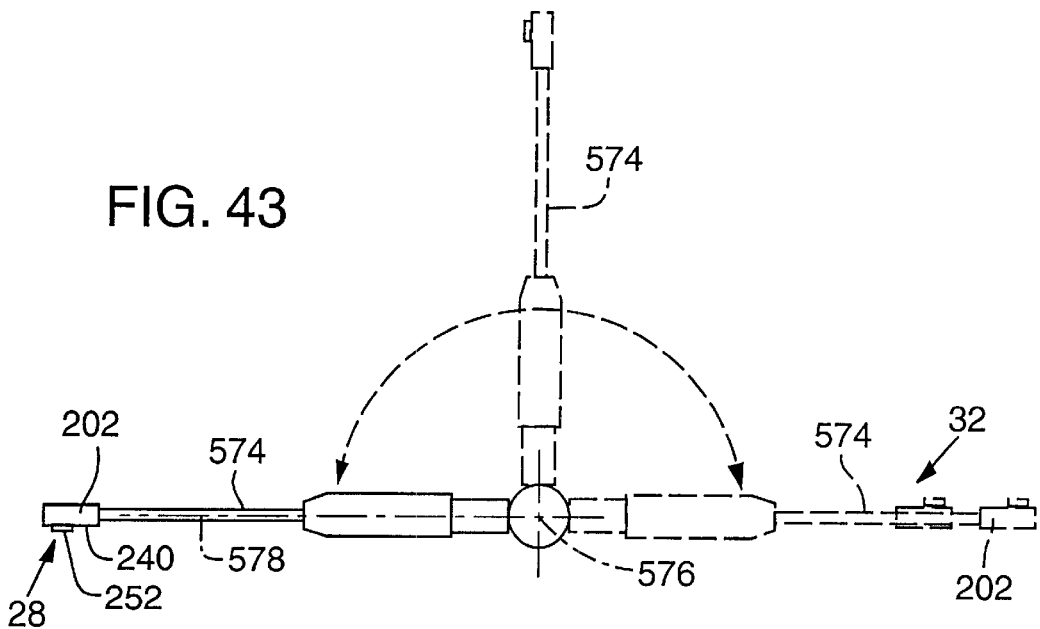
FIG. 43 is a side view of another embodiment of the transfer assembly wherein the transfer arm pivots through the x-z plane.
Figure 44:
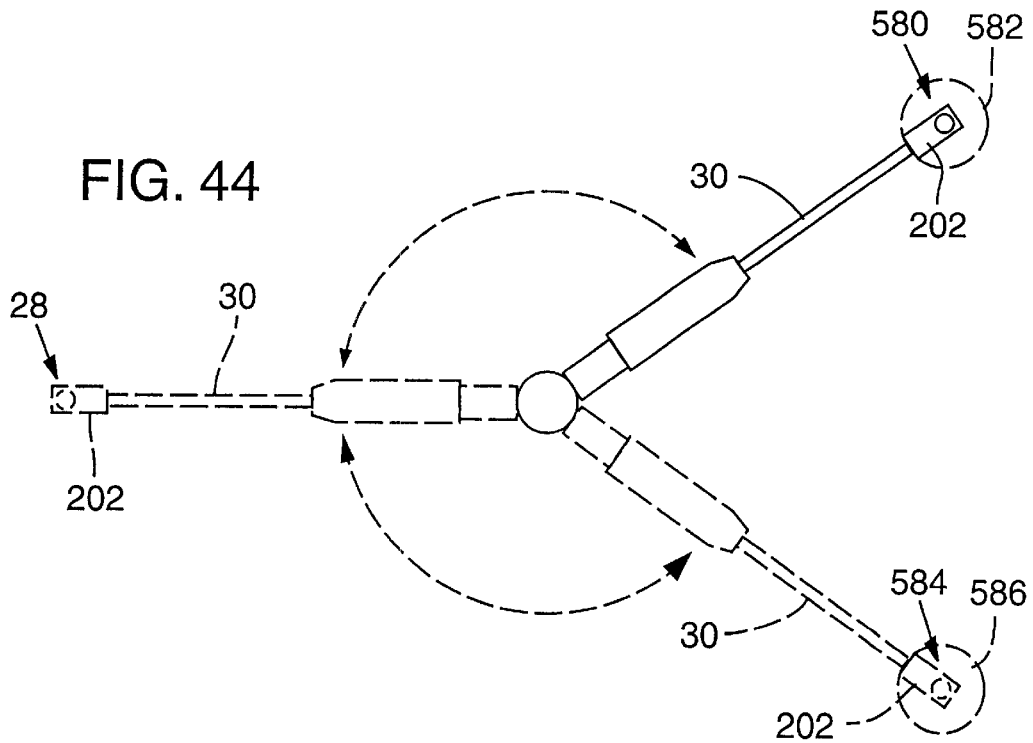
FIG. 44 is a top view of another embodiment of the bond head assembly including two bond heads that are each accessible to a single transfer arm.

FIG. 43 shows a side view of another embodiment of the transfer assembly wherein the transfer arm pivots through the x-z plane. Transfer arm 574 pivots about a pivot axis 576 through an x-z plane so that die support surface 240 moves from a downwardly facing position to an upwardly facing position without rotation of the transfer arm about its elongate axis 578. In this embodiment the transfer arm preferably comprises a telescoping portion so that head region 202 of the transfer arm is retracted toward pivot axis 576 as the transfer arm is positioned underneath the bondhead. This allows for clearance of the transfer arm underneath the bondhead without movement of the bondhead. Once the head region of the transfer arm has cleared the bondhead, the head region is extended away from pivot axis 576 and toward the bondhead into its fully extended position. The telescoping retraction and extension of the head portion of the transfer arm can be accomplished by use of a vacuum system attached to the transfer arm. In another embodiment, the bondhead is moved upwardly or horizontally out of the path of movement of the transfer arm as the arm moves a die from predetermined pickup position 28 into predetermined placement position 32 for pickup of the die by the bondhead FIG. 44 shows top view of another embodiment of the bond head assembly including two bond heads that are each accessible to a single transfer arm. Transfer arm 30 is shown positioned in a first predetermined placement position 580 below a first bondhead 582. A pivot axis of the transfer arm is positioned such that the transfer arm may also be positioned in a second predetermined placement position (shown in dash lines) 584 below a second bond head 586. The transfer arm may also be positioned in predetermined pickup position 28 (shown in dash lines) for picking a die from a die holder. This embodiment typically will be utilized when the bond operation is particularly time consuming in comparison to the pickup operation.

Figure 45A:
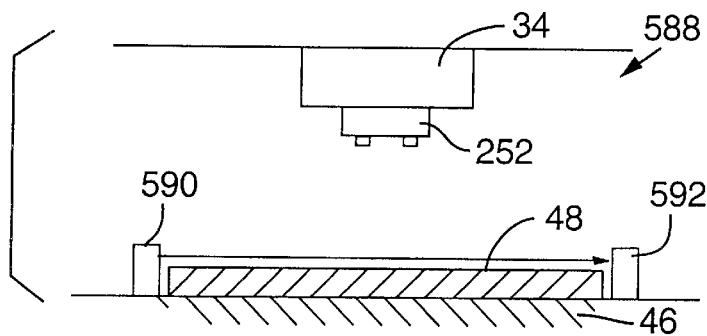
FIGS. 45A–D are side views showing a light detection assembly for determining when a die held on the bond tool has reached a predetermined position during bonding.

FIGS. 45A–D show side views of an optical/pattern recognition assembly for determining when the die has reached a predetermined height, also called a home position, above the substrate, whereupon a linear actuator in conjunction with an encoder control movement of the bondhead from the home position to control an amount of bump height compression during bonding. In particular, FIG. 45A shows a light detection assembly 588 including a light source 590, such as a laser, which is directed to emit a light beam parallel to an upper surface of substrate 48. In a preferred embodiment light source 590 comprises one or more optical fibers and corresponding software. The light source may be positioned directly on substrate 48 so that the optical fiber or fibers emit light directly along the top surface of the substrate. The light source may also be positioned on heater block 46 but horizontally aligned with a top surface of the substrate. In a preferred embodiment the optical fibers are positioned on, or embedded in, stage 71 such that the optical fibers do not contact the substrate and do not come into contact with the heated heater block. Positioning of the optical fibers on the stage is feasible due to the very long focal length of the fiber optics.

Figure 45B:
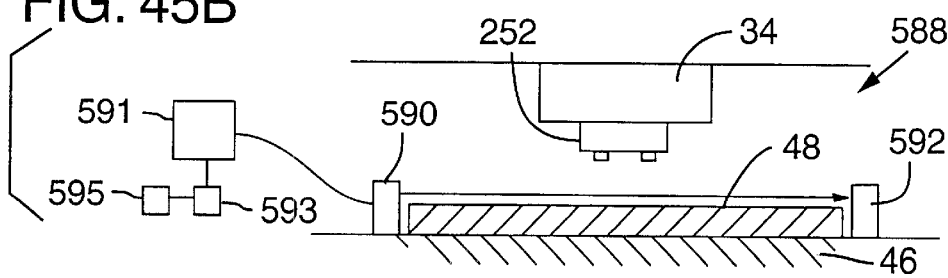
Figure 45C:
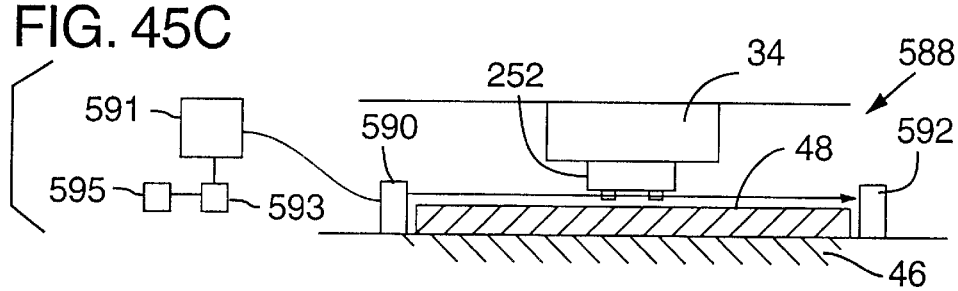
Figure 45D:
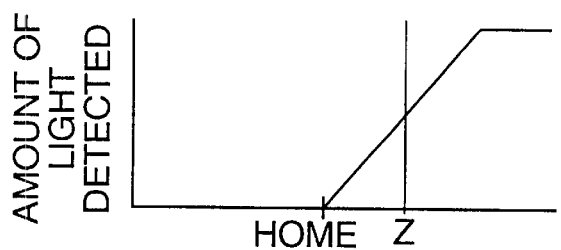

A light detector 592 is positioned to detect light when bondhead 34, with die 252 held thereagainst, has not been lowered past the home position relative to the stage. In FIG. 45A the bondhead has not been lowered an appreciable amount and the light emitted by source 590 is detected by detector 592. In FIG. 45B the bondhead has been lowered toward the substrate, relative to FIG. 45A, so that detector 592 detects a portion of the light emitted by source 590. In FIG. 45C the bondhead has been lowered to a position where the die just occludes the light emitted by source 590 so that light emitted from source 590 is not detected by detector 592. This occluded light measurement is detected by detector 592 (as a zero light reading) which relays this information to a pattern recognition system 591. The pattern recognition system then uses this information to determine that the die has reached a predetermined home location of the die above the substrate. A linear motor 593 together with an encoder 595 (together with the knowledge of the height of the home position above the bonding site) is used to control the bump height compression during thermocompression bonding of the die to the substrate by controlling further lowering of the bondhead. FIG. 45D shows a graphical representation of the amount of light detected by the detector during lowering of the bondhead wherein the location "Z" on the graph indicates the position of the bondhead shown in FIG. 45B and wherein the zero light detection "home" on the graph indicates the position of the bondhead shown in FIG. 45C. After a zero light detection is detected, the bondhead is then lowered, by use of the linear motor and the encoder, an additional predetermined amount from the position shown in FIG. 45C to achieve the desired amount of bump height compression during bonding of the die to the substrate. In other words, the illumination detection assembly thus described is used to determine when the bondhead is correctly initially positioned at a known height above the substrate for further controlled lowering of the bondhead.

Figure 46A:
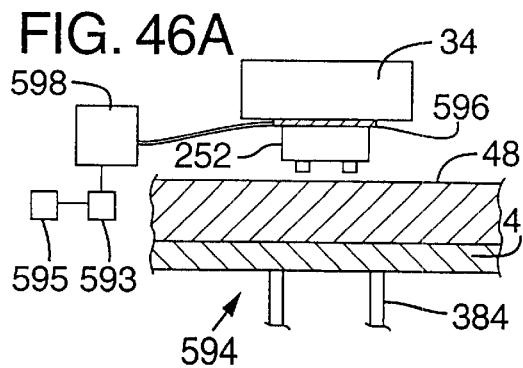
FIGS. 46A–B are side views of a force detection assembly for determining when a die held on the bond tool has initially contacted a substrate.
Figure 46B:
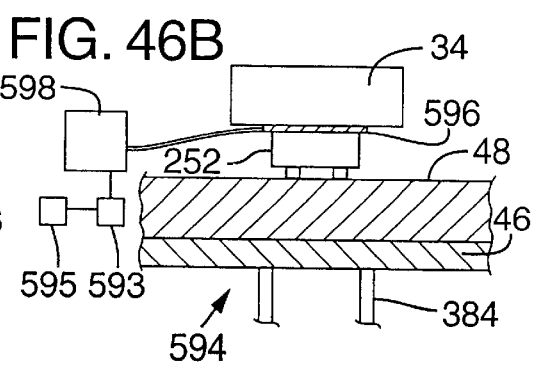

FIGS. 46A–B show side views of a force detection assembly for determining when the bondhead reaches a predetermined position so as to control an amount of bump height compression during bonding. In particular, FIG. 46A shows a side view of a force detection assembly 594 including a force detection device 596 positioned between die 252 and bondhead 34, and preferably between the bonding tool and the die. The force detection device, however, may be positioned anywhere as desired to measure movement of the bondhead into a predetermined threshold, or home, position wherein the die just comes into contact with the substrate. For example, device 596 may be positioned between heater block 46 and positioning rods 384. In FIG. 46A the die has not yet contacted the substrate. FIG. 46B shows the die as it just contacts the substrate such that the detection assembly will detect a compression force. Detection device 596 relays this information to an encoder 595 and a linear motor 593. Thereafter, feedback through the encoder and the linear motor allows the linear motor to control further movement of the bondhead downwardly toward the substrate which thereby allows control of the bump height during compression. In other embodiments the "home" position may be at a location other than where the die initially contacts the substrate.

Figure 47A:
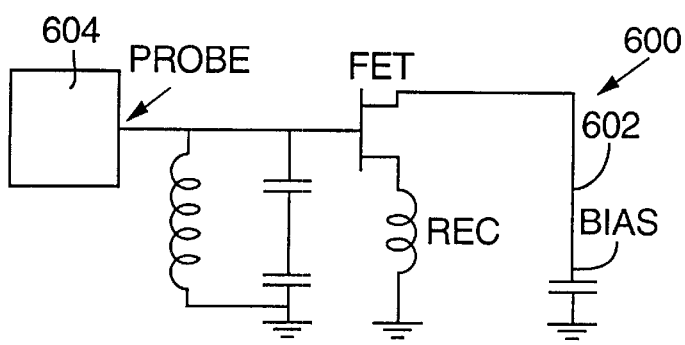
FIGS. 47A–C are schematic views of an oscillation frequency detection assembly for determining when a die held on a bond tool has reached a predetermined position during bonding.
Figure 47B:
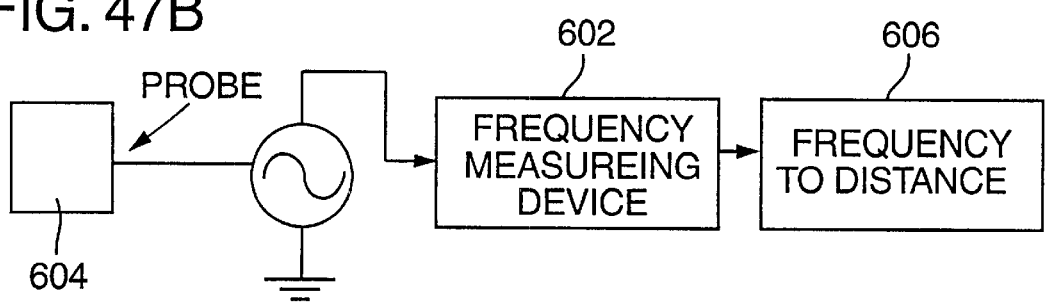
Figure 47C:
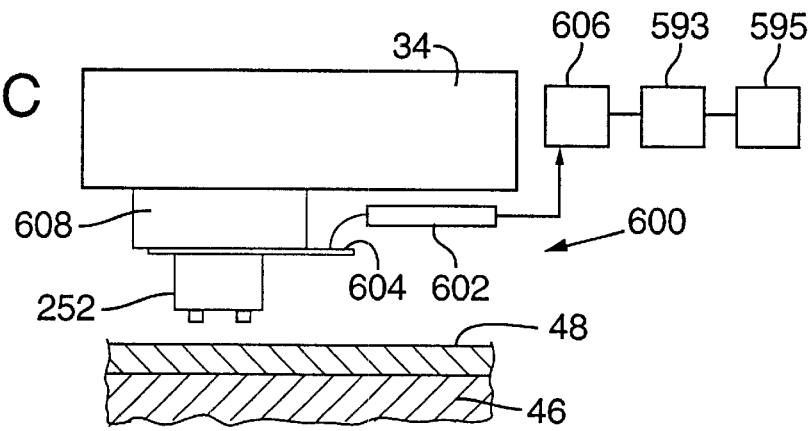

FIGS. 47A–C show schematic views of an oscillation frequency detection assembly for determining a home position of the bonding tool wherein feedback through an encoder and a linear actuator allows continued movement of the bonding tool from the threshold, or home, position so as to control an amount of bump height compression of the die, the substrate, or both, during bonding. In particular, FIG. 47A shows an oscillation frequency detection assembly 600 including a circuit 602 connected to a probe 604. FIG. 47B shows a schematic representation of probe 604 connected to circuit 602 which in turned is connected to a controller 606 which allows a determination of the presence of the bondhead as it reaches the threshold position. FIG. 47C shows bondhead 34 including an insulating pedestal 608 with die 252 held thereagainst. Probe 604 is mounted on pedestal 608 and provides a signal to circuit 602, which in turn provides a signal to controller 606 as the die is lowered.

Figure 48A:
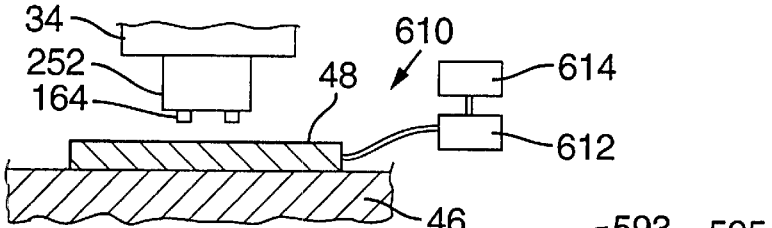
FIGS. 48A–B are side views showing a current detection assembly for determining when a die held on a bond tool has reached a predetermined position during bonding.
Figure 48B:
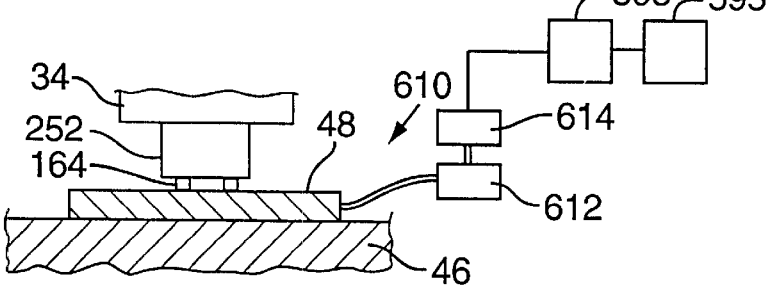

FIGS. 48A–B are side views showing a current detection assembly for determining an amount of bump height compression during bonding. In particular, a current detection assembly 610 includes a current detection device 612 attached to substrate 48. As shown in FIG. 48A, when die 252 is not in contact with substrate 48, current applied to the substrate by detection device 612 will not result in activity of the die. Those skilled in the art will understand that the particular activity achieved by the die will vary depending on the die used in each particular case. As shown in FIG. 48B, when die 252 initially contacts the substrate, current detection device 612 will activate die 252. This activity of the die is measured by a controller 614. When controller 614 detects that the die has just contacted to the substrate, a linear actuator 593 and an encoder 595 thereafter control further compression of the die against the substrate by bondhead 34 through a predetermined additional time period, or with a predetermined additional amount of force, or through a predetermined additional distance. In this manner, a particular percentage of compression of bonding bumps 164 of the die may be achieved. In a preferred embodiment, a compression percentage of greater than 20% and less than 50% generally is desired, with a compression percentage of approximately 30% being preferred.

While preferred embodiments of the present invention have been shown and described, it will be apparent to those skilled in the art that many changes and modifications may be made without departing from the invention in its broader aspects. The appended claims are intended to cover, therefore, all such changes and modifications as fall within the true spirit and scope of the invention.

We claim:

1. An assembly for the placement and bonding of a die on a substrate, comprising:
    a carrier device that positions a die holder in a die support position;
    an alignment device aligned with said die support position and operable for manipulating, in the x, y, z and rotational directions, a die support presented to said die support position so as to align a die held on said die support into a predetermined pickup position;
    a transfer arm having an elongate axis, a pivot axis positioned normal to said elongate axis, and a pickup surface, said transfer arm pivoting about said pivot axis to move said pickup surface from the pickup position to a placement position and said transfer arm rotating about said elongate axis so as to rotate said pickup surface approximately 180 degrees about said elongate axis during movement of said pickup surface from said pickup position to said placement position;
    a stationary heater block;
    a substrate gripping device positioned adjacent said heater block and moving in the x, y and rotational directions a substrate gripped within said substrate gripping device so as to align a bonding site on the substrate with a bonding position; and
    a bondhead assembly including a bondhead movable between a first position and a second position wherein said bondhead in the first position defines said placement position and said bondhead in the second position defines said bonding position.

2. The assembly of claim 1 further comprising an optical device aligned with said die support position and operable for receiving a real time image of a die support held within said die support position.

3. The assembly of claim 2 further comprising a control device that receives directional input from an operator to control said alignment device to move said die support so as to move a die held on said die support into said predetermined pickup position wherein said operator receives data corresponding to said real time image of the die support so as to formulate said directional input, and wherein said operator is chosen from the group consisting of: a human operator, a pattern recognition system and computer controller.

4. The assembly of claim 1 wherein said bondhead in said second position compresses said die against said substrate and wherein said assembly further comprises a location determination device for determining a location of the bondhead relative to the heater block wherein the location determination device is chosen from the group consisting of: a light detection assembly, a force detection assembly, an oscillation frequency measurement circuit, and a current measurement assembly.

5. The assembly of claim 1 further comprising g an optical device that receives an image of a substrate held within said substrate gripping device and overlays said image of the substrate on a template image of said predetermined bonding position.

6. The assembly of claim 5 further comprising a control device that receives directional input from an operator to control said substrate gripping device to move a bond site on said substrate into said predetermined bonding position wherein said operator receives data corresponding to said image of the substrate so as to formulate said directional input, and wherein said operator is chosen from the group consisting of: a human operator, a pattern recognition system and computer controller.

7. The assembly of claim 1 further comprising a reflection device movable into an image capture position such that an optical device receives an image of a die held by said bonding surface of the bondhead.

8. The assembly of claim 7 further comprising an image capture device that captures said image of said die held by said bonding surface, creates a template image from said image of the die, and stores said template image in said optical device after said reflection device is removed from said image capture position and wherein said template image defines said predetermined bonding position.

9. An assembly for picking and transferring a die from a pickup position to a placement position for bonding on a substrate, comprising:
  a pickup station that defines a predetermined pickup position and which moves a die holder to align a die on the die holder with said pickup position;
  a bonding station that defines a predetermined placement position and includes a movable bondhead; and
  a transfer arm having an elongate axis, a pivot axis positioned normal to said elongate axis, and a pickup surface, said transfer arm pivoting about said pivot axis to move said pickup surface from the pickup position to the placement position, said pickup surface facing a same direction in the pickup position and in the placement position, and said die being transferred directly to the substrate from the transfer arm.

10. An assembly for picking and transferring a die from a pickup position to a placement position for bonding on a substrate, comprising:
  a pickup station that defines a predetermined pickup position and which moves a die holder to align a die on the die holder with said pickup position;
  a bonding station that defines a predetermined placement position and includes a movable bondhead; and
  a transfer arm having an elongate axis, a pivot axis positioned normal to said elongate axis, and a pickup surface, said transfer arm pivoting about said pivot axis to move said pickup surface from the pickup position to the placement position, said transfer arm pivoting said pickup surface approximately 180 degrees during movement of said pickup surface from the pickup position to the placement positions, and said transfer arm rotating about said elongate axis so as to rotate said pickup surface approximately 180 degrees about said elongate axis during movement of said pickup surface from said pickup position to said placement position.

11. An assembly for picking and transferring a die from a pickup position to a placement position for bonding on a substrate, comprising:
  a pickup station that defines a predetermined pickup position and which moves a die holder to align a die on the die holder with said pickup position;
  a bonding station that defines a predetermined placement position and includes a movable bondhead; and
  a transfer arm having an elongate axis, a pivot axis positioned normal to said elongate axis, and a pickup surface, said transfer arm pivoting about said pivot axis to move said pickup surface from the pickup position to the placement position, said transfer arm including an elbow joint having first and second gears positioned normal to one another wherein said elbow joint causes rotation of said transfer arm about said elongate axis as said transfer arm is pivoted about said pivot axis.

12. An assembly for bonding a die to a substrate, comprising:
  a stationary heater block;
  a bondhead assembly including a bondhead having an elongate axis, a flexure device, and a motor for moving said bondhead toward said heater block along said elongate axis and into a bonding position, said flexure device guiding movement of said bondhead along said elongate axis; and
  a substrate gripping device that moves in the x, y and rotational directions a substrate gripped within said substrate gripping device so as to align a bonding site on the substrate with said bonding position.

13. The assembly of claim 12 further comprising an optical device that receives a real time image of a substrate held within said substrate gripping device.

14. The assembly of claim 13 further comprising a reflection device movable into an image capture position between a substrate held within said substrate gripping device and said optical device so as to reflect an image of a die held by said bondhead.

15. The assembly of claim 14 further comprising an image capture device that forms a template image of a die held by said bondhead and stores said template image in said optical device after said reflection device is removed from said image capture position and wherein said template image defines said predetermined bonding position.

16. The assembly of claim 12 wherein said flexure device comprises a plurality of leaf springs positioned normal to said elongate axis when said bondhead is in the bonding position.

17. The assembly of claim 12 wherein said flexure device comprises a plurality of annular flexure springs positioned normal to said elongate axis when said bondhead is in the bonding position.

18. The assembly of claim 12 further comprising an operator control device that receives directional input from an operator to control said substrate gripping device so as to align a bonding site on the substrate with said bonding position.

19. An assembly for aligning a die bond site with a die, comprising:
a substrate gripping device that moves in the x, y and rotational directions a substrate gripped within said substrate gripping device;
a bondhead that defines a bonding surface for holding a die;
an optical device that sequentially displays a real time image of a die held by said bondhead and a real time image of a substrate held within said substrate gripping device; and
an image capture device that forms a template image of said die held by said bondhead and overlays said template image on the real time image of a substrate held within said substrate gripping device.

20. The assembly of claim 19 further comprising an operator control device that receives directional input from an operator to control said substrate gripping device to align a bond site on the substrate with said template image.

21. The assembly of claim 19 further comprising a reflection device movable into an image capture position between a substrate held within said substrate gripping device and said bondhead.

22. The assembly of claim 19 further comprising a stationary heater block positioned adjacent said substrate gripping device wherein said heater block includes a top surface having a curvature.

23. The assembly of claim 19 wherein said bondhead comprises an elongate axis, a flexure device, and a motor for moving said bonding surface along said elongate axis toward a substrate held within said substrate gripping device, said flexure device guiding movement of said bonding surface along said elongate axis.

24. A method of aligning and bonding a die on a substrate, comprising the steps of:
aligning a die with a predetermined die pickup position;
picking the die from the predetermined die pickup position with a transfer assembly;
transferring the die to a predetermined placement position with said transfer assembly;
picking said die from the transfer assembly with a bondhead assembly; and
bonding the die to a substrate with said bondhead assembly, said transfer assembly simultaneously pivoting about a pivot axis and rotating about a rotational axis as said transfer assembly transfers said die from the predetermined pickup position to said predetermined placement position.

25. A method of aligning and bonding a die on a substrate, comprising the steps of:
aligning a die with a predetermined die pickup position;
picking the die from the predetermined die pickup position with a transfer assembly;
transferring the die to a predetermined placement position with said transfer assembly;
picking said die from the transfer assembly with a bondhead assembly, including
moving a bondhead of the bondhead assembly along a single axis of movement; and
bonding the die to a substrate with said bondhead assembly.

26. The method of claim 25 wherein said bondhead comprises two planar flexure members mounted parallel to one another.

27. A method of aligning and bonding a die on a substrate, comprising the steps of:
aligning a die in the x, y, z and rotational directions with a predetermined die pickup position;
picking the die from the predetermined die pickup position with a transfer assembly;
transferring the die to a predetermined placement position with said transfer assembly;
picking said die from the transfer assembly with a bondhead assembly; and
bonding the die to a substrate with said bondhead assembly.

28. A method of aligning and bonding a die on a substrate held against a heater block, comprising the steps of:
aligning a die with a predetermined die pickup position;
picking the die from the predetermined die pickup position with a transfer assembly;
transferring the die to a predetermined placement position with said transfer assembly;
picking said die from the transfer assembly with a bondhead assembly including
a bonding surface;
planarizing said bonding surface with respect to said heater block; and
bonding the die to a substrate with said bondhead assembly.

29. An assembly for the placement and bonding of a die on a substrate, comprising:
a die support;
an alignment device that manipulates a die holder supported by said die support so as to align a die held on said die holder into a pickup position;
a transfer arm having a pivot axis and a pickup surface, said transfer arm pivoting about said pivot axis to move said pickup surface from the pickup position to a placement position wherein said pickup surface faces a first direction in said pickup position and faces a second direction in said placement position and wherein said first direction is different from said second direction;
a stationary heater block;
a gripping device positioned adjacent said heater block and moving a substrate gripped within said gripping device so as to align a bonding site on the substrate with a bonding position; and
a bondhead movable between a first position and a second position wherein said bondhead in the first position is aligned with said placement position and said bondhead in the second position is aligned with said bonding position.

30. The assembly of claim 29 further comprising an optical device aligned with said die support and operable for receiving a real time image of a die on said die holder supported on said die support.

31. The assembly of claim 29 wherein said transfer arm pivots approximately 180 degrees about said pivot axis from the pickup position to the placement position and wherein said die holder is chosen from the group consisting of: a GEL-PAK, a waffle pack, a tape frame, and a wafer array.

32. The assembly of claim 29 further comprising a control device that receives directional input from an operator to control said alignment device to move said die support so as to move a die supported on said die support into said pickup position.

33. The assembly of claim 29 further comprising an optical device that receives an image of a substrate held within said gripping device and simultaneously overlays a template image of said bonding position on said image of the substrate.

34. The assembly of claim 33 further comprising a reflection device movable into an image capture position adjacent said bondhead such that the optical device receives an image of a die held by the bondhead.

35. The assembly of claim 34 further comprising an image capture device that creates said template image from said image of said die held by said bondhead, transfers said template image to said optical device after said reflection device is removed from said image capture position and wherein said template image defines said bonding position.

36. The assembly of claim 29 further comprising a second transfer arm having a second pivot axis and a second pickup surface, said second transfer arm pivoting about said second pivot axis to move said second pickup surface from a second pickup position to the placement position wherein said second pickup surface faces the first direction in said second pickup position and faces the second direction in said placement position.

37. The assembly of claim 34 wherein said transfer arm moves said pickup surface to a second placement position and wherein said assembly further comprises a second bondhead movable between a third position and a fourth position wherein said second bondhead in the third position is aligned with said second placement position and said second bondhead in the fourth position is aligned with a second bonding position.

38. The assembly of claim 29 further comprising a force device to move said bondhead between said first position and said second position wherein said force device is chosen from the group consisting of: a weight stack, a pneumatic assembly, and a motor assembly.

39. The assembly of claim 29 wherein said bondhead compresses said die against said substrate and wherein said assembly further comprises a location determination device chosen from the group consisting of: a light detection assembly, a force detection assembly, an oscillation frequency measurement circuit, and a current measurement assembly.

40. The assembly of claim 39 wherein said locator determination device is connected to a compression measurement device which is operatively connected to said bondhead to control an amount of compression of bonding bumps of said die to within a range of three to ninety-five percent compression and wherein said compression measurement device comprises a linear actuator and an encoder.

41. The assembly of claim 40 wherein said compression measurement device is operatively connected to said bondhead to control an amount of compression of bonding bumps of said substrate to within a range of twenty to fifty percent compression.

42. The assembly of claim 29 wherein said substrate gripping device contacts said substrate at three contact points and one index point.

43. The assembly of claim 29 wherein said transfer arm is adapted to pick a die from said die support when said pickup surface of said transfer arm is in the pickup position, and wherein said assembly further comprises a vacuum sensor that senses when a die has been picked from said die support by said transfer army.

44. The assembly of claim 29 wherein said stationary heater block includes an upper surface, wherein said bondhead includes a bonding surface and wherein said upper surface of the heater block and said bonding surface of the bondhead are planarized with respect to each other and wherein said upper surface of the heater block has a slight curvature.

45. The assembly of claim 29 wherein said bondhead includes an elongate axis and wherein said bondhead assembly further includes a flexure device for controlling a position of said elongate axis during movement of said bondhead between said placement and bonding positions such that a position of said elongate axis in said placement position is parallel to a position of said elongate axis in said bonding position.

46. The assembly of claim 45 wherein said position of said elongate axis in said placement position is different from said position of said elongate axis in said bonding position.

47. The assembly of claim 29 wherein said pickup surface of said transfer arm defines said pickup position and said placement position.

48. An assembly for picking and transferring a die from a pickup position to a placement position for bonding on a substrate, comprising:
   a pickup station that moves a die into alignment with a stationary pickup position;
   a bonding station that moves a substrate into alignment with a stationary placement position; and
   a transfer arm having a pivot axis, an elongate axis, and a pickup surface, said transfer arm pivoting approximately 180 degrees about said pivot axis, and rotating approximately 180 degrees about said elongate axis, to move said pickup surface from the pickup position to the placement position wherein said pickup position is different from said placement position.

49. The assembly of claim 48 wherein said transfer arm includes an elbow joint having first and second gears positioned normal to one another wherein said elbow joint causes rotation and differential tracking of said transfer arm about said elongate axis as said transfer arm is pivoted about said pivot axis.

50. An assembly for picking and transferring a die from a pickup position to a placement position for bonding on a substrate, comprising:
   a pickup station that moves a die into alignment with a stationary first pickup position;
   a bonding station that moves a substrate into alignment with a stationary placement position;
   a first transfer arm having a first pivot axis and a first pickup surface, said first transfer arm pivoting about said first pivot axis to move said first pickup surface from the first pickup position to the placement position wherein said first pickup position is different from said placement position; and
   a second transfer arm having a second pivot axis and a second pickup surface, said second transfer arm pivoting about said second pivot axis to move said second pickup surface from a second pickup position to the placement position.

51. An assembly for bonding a die to a substrate, comprising:
   a bondhead assembly including a bondhead having an elongate axis, a flexure device, and an actuator for moving said bondhead in a line parallel to said elongate axis from a placement position to a bonding position, said flexure device guiding movement of said bondhead parallel to said elongate axis and limiting movement of said bondhead perpendicular to said elongate axis such that said elongate axis of said bondhead in said placement position is parallel to said elongate axis of said bondhead in said bonding position; and
   a substrate gripping device that moves a substrate gripped within said substrate gripping device so as to align a bonding site on the substrate with said bonding position.

52. The assembly of claim 51 further comprising an optical device that receives an image of a substrate held within said substrate gripping device.

53. The assembly of claim 52 further comprising a reflection device that moves into an image capture position adjacent said bondhead and displays an image of a die held by said bondhead.

54. The system of claim 53 further comprising an image capture device that captures an image of said die held by said bondhead, creates a template image from said captured image, and relays said template image to said optical device after said reflection device is removed from said image capture position and wherein said template image defines said bonding position.

55. The assembly of claim 51 wherein said flexure device comprises a plurality of devices chosen from the group consisting of: elongate springs, leaf springs, annular springs, and bellows, wherein said plurality of devices are positioned normal to said elongate axis when said bondhead is in the bonding position, and wherein said flexure device limits movement of said bondhead in a direction perpendicular to said elongate axis to less than 10 mils during movement of the bondhead between the placement and the bonding positions.

56. The assembly of claim 51 further comprising a control device that receives directional input to control said substrate gripping device so as to align a bonding site on the substrate with said bonding position.

57. The assembly of claim 56 wherein said control device is adapted to receive directional input from an operator chosen from the group consisting of: a human operator, a pattern recognition system and a computer controller.

58. A method of aligning and bonding a die on a substrate, comprising the steps of:
  aligning a die on a die holder with a stationary die pickup position by moving said die holder in x, y and rotational directions;
  picking the die from the stationary die pickup position with a support surface of a transfer assembly;
  transferring the die to a stationary placement position with said transfer assembly wherein said transfer assembly includes an elongate arm that pivots from said pickup position to said placement position during transfer of said die such that said support surface of said transfer assembly is moved from said pickup position to a placement position;
  picking said die from the transfer assembly with a bondhead assembly wherein a location of said die on said bondhead assembly defines said bonding position;
  aligning a bonding site on a substrate with said bonding position by moving said substrate relative to said bondhead assembly; and
  bonding the die to the substrate with said bondhead assembly.

59. The method of claim 58 wherein said support surface of said transfer assembly defines a location of said predetermined pickup position and a location of said predetermined placement position.

60. The method of claim 58 wherein said transfer assembly pivots about a pivot axis and rotates about a rotational axis as said transfer assembly transfers said die from said predetermined pickup position to said predetermined placement position.

61. The method of claim 58 wherein the step of picking said die from the transfer assembly comprises moving a bondhead of the bondhead assembly along a single axis of movement.

62. The method of claim 61 wherein said bondhead comprises at least two planar flexure members positioned generally parallel to one another.

63. The method of claim 58 further comprising creating a template image of said die picked by the bondhead assembly and aligning said bonding site on the substrate with said template image.

64. The method of claim 58 further comprising the step of determining when the bondhead has moved the die into a home position by use of a location determination assembly chosen from the group consisting of: an illumination detection assembly, a force detection assembly, a frequency detection assembly, and a current detection device.

65. The method of claim 64 wherein said location determination assembly comprises a frequency detection assembly that determines a proximity effect of said bondhead assembly and said substrate by measuring a changing frequency of a radio frequency oscillator as said bondhead assembly is moved toward said substrate.

66. The method of claim 64 wherein said bonding position is positioned above said bondhead assembly and wherein said bondhead assembly includes a bondhead that is moved upwardly towards said bonding position to bond a die to a substrate.

67. The method of claim 58 further comprising the step of planarizing a bonding surface of said bondhead with a bondhead facing surface of a heater block.

68. The method of claim 58 further comprising the steps of:
  aligning a second die on a second die holder with a second stationary die pickup position by moving said second die holder in x, y and rotational directions;
  picking the second die from the second stationary die pickup position with a second transfer assembly;
  transferring the second die to said stationary placement position with said second transfer assembly wherein said second transfer assembly includes a second elongate arm that pivots from said second pickup position to said placement position during transfer of said second die such that a support surface of said second transfer assembly is moved from said second pickup position to said placement position;
  picking said second die from the second transfer assembly with said bondhead assembly;
  aligning a second bonding site on the substrate with said bonding position by moving said substrate relative to said bondhead assembly; and
  bonding the second die to the substrate with said bondhead assembly.

69. The method of claim 58 further comprising the steps of:
  aligning a second die on said die holder with said stationary die pickup position by moving said die holder in x, y and rotational directions;
  picking the second die from said stationary die pickup position with said transfer assembly;
  transferring the second die to a second stationary placement position with said transfer assembly wherein said elongate arm pivots from said stationary pickup position to said second placement position during transfer of said second die such that said support surface of said transfer assembly is moved from said pickup position to a second placement position;
  picking said second die from the transfer assembly with a second bondhead assembly;
  aligning a bonding site on a second substrate with a second bonding position by moving said second substrate relative to said second bondhead assembly; and
  bonding the second die to the second substrate with said second bondhead assembly.

* * * * *